United States Patent [19]
Kimura

[11] Patent Number: 5,936,465
[45] Date of Patent: Aug. 10, 1999

[54] BIPOLAR OTA USING MULTITAIL CELL

[75] Inventor: Katsuji Kimura, Tokyo, Japan

[73] Assignee: NEC Corporation, Tokyo, Japan

[21] Appl. No.: 08/819,881

[22] Filed: Mar. 18, 1997

[30] Foreign Application Priority Data

Sep. 13, 1996 [JP] Japan .................................. 8-265505

[51] Int. Cl.$^6$ ...................................................... H03F 3/45
[52] U.S. Cl. ........................................... 330/252; 330/261
[58] Field of Search ................................. 330/9, 252, 261, 330/295

[56] References Cited

U.S. PATENT DOCUMENTS

| | | | |
|---|---|---|---|
| 4,723,110 | 2/1988 | Voorman .................................. | 330/252 |
| 4,951,003 | 8/1990 | De Jager et al. ....................... | 330/252 |
| 5,382,917 | 1/1995 | Miyake et al. ......................... | 330/261 X |
| 5,389,895 | 2/1995 | Moore et al. .......................... | 330/261 X |

FOREIGN PATENT DOCUMENTS 0 603 942 A1   6/1994   European Pat. Off. .

OTHER PUBLICATIONS

Schmoock (1975) "An Input Stage Transconductance Reduction Technique for High–Slew Rate Operational Amplifiers", *IEEE Journal of Solid–State Circuits* SC–10(6): 407–411.

Tanimoto et al. (1991) "Realization of a 1–V Active Filter Using a Linearization Technique Employing Plurality of Emitter–Coupled Pairs", *IEEE Journal of Solid–State Circuits* 26(7): 937–945.

*Primary Examiner*—Steven Mottola
*Attorney, Agent, or Firm*—Scully, Scott, Murphy & Presser

[57] ABSTRACT

A bipolar OTA having a wide input voltage range is provided without increasing the circuit scale and current consumption. This OTA includes first to n-th differential pairs of first to 2n-th bipolar transistors whose emitters are coupled together, where $n \geq 2$; and a common current source/sink connected to the emitters of the first to 2n-th transistors. The first to 2n-th transistors are driven by a common tail current produced by the common current source/sink. The transistors of each of the second to n-th differential pairs have a same emitter area $K_1$ to $K_{n-1}$ times as large as that of the first and second transistors, where $K_1$ to $K_{n-1} > 1$. A first input voltage as an input signal to be amplified is differentially applied across bases of the first and second transistors of the first differential pair. A second to n-th input voltages are differentially applied across corresponding bases of the third to 2n-th transistors, respectively. Each of the second to n-th input voltages is produced by attenuating the first input voltage. First to (n–1)-th pairs of dc offset or tuning voltages are applied to the bases of the third to 2n-th transistors, respectively. An amplified output signal is differentially derived from collectors of the first and second transistors.

34 Claims, 33 Drawing Sheets

BIPOLAR OTA USING MULTITAIL CELL

BACKGROUND OF THE INVENTION

1. Field of the Invention

The present invention relates to a differential amplifier circuit comprised of bipolar transistors and more particularly, to a differential amplifier circuit having an improved transconductance linearity within a wide input voltage range, which is formed on a bipolar semiconductor integrated circuit device and is operable at a low supply voltage.

2. Description of the Prior Art

A differential amplifier circuit having a superior transconductance linearity within a comparatively wide input voltage range has been known as an "Operational Transconductance Amplifier (OTA)".

An example of the conventional bipolar OTAs was disclosed by Schmook in the IEEE Journal of Solid-State Circuits, Vol. SC-10, No.6, PP. 407–411, December 1975, in which two unbalanced differential pairs of bipolar transistors are employed. Two transistors of each pair has different emitter areas or sizes. Output ends or collectors of the two transistors of each pair are cross-coupled.

The transconductance linearization technique proposed by Schmook is known as the "Multi-tanh" technique, and has been practically used.

An application of this Multi-tanh technique was disclosed by Tanimoto et al., in IEEE Journal of Solid-State Circuits, Vol. 26, No.7, PP. 937–945, July 1991.

FIG. 1 shows a conventional bipolar OTA of this sort, which contains first to (2N+1)-th differential pairs of npn bipolar transistors and first to (2N+1)-th constant current sinks.

As shown in FIG. 1, a first differential pair is made of npn bipolar transistors Q01 and Q02 whose emitter areas are equal to that of a unit bipolar transistor. Emitters of the transistors Q01 and Q02 are commonly connected to one end of a first constant current sink CS0 (current: $I_{00}$). The other end of the current sink CS0 is grounded. Bases of the transistors Q01 and Q02 are connected to first and second input terminals T1 and T2, respectively.

A second differential pair is made of npn bipolar transistors Q11 and Q12 whose emitter areas are different. The emitter area of the transistors Q11 is equal to that of a unit bipolar transistor. The emitter area of the transistors Q12 is $K_1$ times as much as that of a unit bipolar transistor, where $K_1$ is greater than unity. Emitters of the transistors Q11 and Q12 are commonly connected to one end of a second constant current sink CS1 (current: $I_{01}$). The other end of the current sink CS1 is grounded. Bases of the transistors Q11 and Q12 are connected to the first and second input terminals T1 and T2, respectively.

A third differential pair is made of npn bipolar transistors Q11' and Q12' whose emitter areas are different. The emitter area of the transistor Q11' is equal to that of a unit bipolar transistor. The emitter area of the transistors Q12' is $K_1$ times as much as that of a unit bipolar transistor. Emitters of the transistors Q11' and Q12' are commonly connected to one end of a third constant current sink CS1' (current: $I_{01}$). The other end of the current sink CS1' is grounded. Bases of the transistors Q11' and Q12' are connected to the first and second input terminals T2 and T1, respectively.

Collectors of the transistors Q11 and Q12' are coupled together. A collector of the transistor Q01 is connected to the coupled collectors of the transistors Q11 and Q12'. Collectors of the transistors Q11' and Q12 are coupled together. A collector of the transistor Q02 is connected to the coupled collectors of the transistors Q11'and Q12.

Similarly, a 2N-th differential pair is made of npn bipolar transistors QN1 and QN2 whose emitter areas are different. The emitter area of the transistor QN1 is equal to that of a unit bipolar transistor. The emitter area of the transistors QN2 is $K_N$ times as much as that of a unit bipolar transistor, where $K_1$ is greater than unity. Emitters of the transistors QN1 and QN2 are commonly connected to one end of an 2N-th constant current sink CSN (current: $I_{ON}$). The other end of the current sink CSN is grounded. Bases of the transistors QN1 and QN2 are connected to the first and second input terminals T1 and T2, respectively.

A (2N+1)-th differential pair is made of npn bipolar transistors QN1' and QN2' whose emitter areas are different. The emitter area of the transistor QN1' is equal to that of a unit bipolar transistor. The emitter area of the transistors QN2' is $K_N$ times as much as that of a unit bipolar transistor. Emitters of the transistors QN1' and QN2' are commonly connected to one end of an (2N+1)-th constant current sink CSN' (current: $I_{ON}$). The other end of the current sink CSN' is grounded. Bases of the transistors QN1' and QN2' are connected to the first and second input terminals T2 and T1, respectively.

Collectors of the transistors QN1 and QN2' are coupled together. Collectors of the transistors QN1' and QN2 are coupled together.

The collector of the transistor Q1 and the coupled collectors of the transistors Q11, Q12', ..., QN1' and QN2' are further coupled together, thereby forming one of differential output ends of this conventional OTA. The collector of the transistor Q2 and the coupled collectors of the transistors Q12, Q11', ..., QN2 and QN1' are coupled together, thereby forming the other of the differential output ends of this conventional OTA.

A differential input voltage $V_i$ as an input signal to be amplified is applied across the first and second input terminals T1 and T2. A differential output current $\Delta I$ as an amplified output signal is derived from the differential output ends.

Here, it is supposed that all the transistors Q01 through QN2' are matched in characteristic and that the base-width modulation (i.e., the Early voltage) is ignored.

For a j-th differential pair of two bipolar emitter-coupled transistors which are driven by a common constant current $I_{0j}$ and which have emitter areas in the ratio of $K_j$: 1 ($K_j$ is equal to or greater than unity) with respect to a unit bipolar transistor, collector currents $I_{C1j}$ and $I_{C2j}$ of the two transistors are expressed as the following equations (1a) and (1b), respectively.

$$I_{C1j} = K_j I_S \exp\left(\frac{V_{BE1j}}{V_T}\right) \quad (1a)$$

$$I_{C2j} = I_S \exp\left(\frac{V_{BE2j}}{V_T}\right) \quad (1b)$$

In the equations (1a) and (1b), $V_{BE1j}$ and $V_{BE2j}$ are base-to-emitter voltages of the two transistors, respectively, and $I_S$ is the saturation current thereof. $V_T$ is the thermal voltage defined as $V_T=kT/q$, where k is the Boltzmann's constant, T is absolute temperature in degrees Kelvin, and q is the charge of an electron.

When the differential input voltage $V_i$ is applied across the bases of the two transistors of the j-th differential pair, the following equation (1c) is established around the loop consisting of the input voltage and the two base-emitter junctions because of the Kirchhoff's voltage law.

$$V_i - V_{BE1j} + V_{BE2j} = 0 \tag{1c}$$

The equation (1c) is rewritten by substituting the above equations (1a) and (1b) into the equation (1c) as the following equation (1d):

$$V_i - V_T \ln\left(\frac{I_{C1j}}{K_j I_S}\right) + V_T \ln\left(\frac{I_{C2j}}{I_S}\right) = 0 \tag{1d}$$

On the other hand, the following relationship (1e) is satisfied among the collector currents $I_{C1j}$ and $I_{C2j}$ and the constant driving current $I_{0j}$.

$$I_{C1j} + I_{C2j} = \alpha_F I_{0j} \tag{1e}$$

where $\alpha_F$ is a dc common-base current gain factor.

Therefore, the collector currents $I_{C1j}$ and $I_{C2j}$ are expressed as the following equations (1f) and (1g), respectively:

$$I_{C1j} = \frac{\alpha_F I_{0j}}{1 + \frac{1}{K_j}\exp\left(-\frac{V_i}{V_T}\right)} \tag{1f}$$

$$= \frac{\alpha_F I_{0j}\exp\left(-\frac{V_i + V_T \ln K_j}{2V_T}\right)}{2\cosh\left(\frac{V_i + V_T \ln K_j}{2V_T}\right)}$$

$$I_{C2j} = \frac{\alpha_F I_{0j}}{1 + K_j \exp\left(\frac{V_i}{V_T}\right)} \tag{1g}$$

$$= \frac{\alpha_F I_{0j}\exp\left(\frac{V_i + V_T \ln K_j}{2V_T}\right)}{2\cosh\left(\frac{V_i + V_T \ln K_j}{2V_T}\right)}$$

Accordingly, a differential output current $\Delta I_{cj}$ of the j-th differential pair, which is defined as $\Delta I_{cj} = I_{c1j} - I_{c2j}$, is given by the following equation (2) or (3).

$$\Delta I_{Cj} = I_{C1j} - I_{C2j} = \alpha_F I_{0j}\tanh\left(\frac{V_i + V_{Kj}}{2V_T}\right) \tag{2}$$

$$\Delta I_{Cj} = \frac{\alpha_F I_{0j}\sinh\left(\frac{V_i + V_{Kj}}{2V_T}\right)}{\cosh\left(\frac{V_i + V_{Kj}}{2V_T}\right)} \tag{3}$$

In the equations (2) and (3), $V_{Kj}$ is a dc offset voltage between the two transistors of the j-th differential pair, which is defined as $V_{Kj} = V_T \cdot \ln(K_j)$.

It is seen from the equations (2) and (3) that the differential output current $\Delta I_{cj}$ of the j-th differential pair is expressed by a hyperbolic tangent (tanh) function, in other words, by a fraction whose numerator is a hyperbolic sine (sinh) function and whose denominator is a hyperbolic cosine (cosh) function.

Accordingly, a differential output current $\Delta I$ of the conventional OTA shown in FIG. 1 is expressed as the following equation(4a) or (4b):

$$\Delta I = \alpha_F \sum_{j=0}^{2N}\left\{I_{0j}\tanh\left(\frac{V_i + V_{Kj}}{2V_T}\right)\right\} \tag{4a}$$

$$\Delta I = \alpha_F \sum_{j=0}^{2N}\left\{\frac{I_{0j}\sinh\left(\frac{V_i + V_{Kj}}{2V_T}\right)}{\cosh\left(\frac{V_i + V_{Kj}}{2V_T}\right)}\right\} \tag{4b}$$

In the first differential pair of the transistors Q01 and Q02, the emitter areas of the transistors Q01 and Q02 are equal to that of a unit transistor and therefore, the offset voltage $V_{K0}$ is zero, because $V_{K0} = V_T \cdot \ln(1) = 0$.

The name of the "multi-tanh" technique was termed after the form of the equation (4a).

Here, since the offset voltages of the (j−1)-th and j-th differential pairs, which are arranged symmetrically, have the same emitter area ratio, they have a relationship of $V_{Kj} = -V_{Kj-1}$. Therefore, the differential output currents $\Delta I_{cj}$ and $\Delta I_{cj-1}$ of these two pairs are expressed as the following equations (5a) and (5b), respectively.

$$\Delta I_{Cj} = \alpha_F I_{0j}\tanh\left(\frac{V_i + V_{Kj}}{2V_T}\right) \tag{5a}$$

$$\Delta I_{Cj-1} = \alpha_F I_{0j}\tanh\left(\frac{V_i + V_{Kj-1}}{2V_T}\right) \tag{5b}$$

$$= \alpha_F I_{0j}\tanh\left(\frac{V_i - V_{Kj}}{2V_T}\right)$$

The collectors of the transistors of the symmetrically-arranged (j−1)-th and j-th differential pairs are coupled together and accordingly, the following equation (6) is established as $$\Delta I_{C2j} = \Delta I_{Cj-1} + \Delta I_{Cj} = \frac{2\alpha_F I_{0j}\sinh\left(\frac{V_i}{V_T}\right)}{\cosh\left(\frac{V_i}{V_T}\right) + \cosh\left(\frac{V_{Kj}}{V_T}\right)} \tag{6}$$

Then, the differential output current $\Delta I$ of the conventional OTA of FIG. 1 is expressed as the following equation (7).

$$\Delta I = \Delta I_{C0} + \sum_{j=1}^{N}\Delta I_{C2j} \tag{7}$$

where $\Delta I_{C0}$ is the differential output current of the first differential pair of the transistors Q01 and Q02.

As a result, the differential output current $\Delta I$ of the conventional OTA of FIG. 1 is expressed as the following general equation(8).

$$\Delta I = \frac{\alpha_F\left[\sum_{j=1}^{N+1}\left\{C_j\sinh\left(\frac{jV_i}{V_T}\right)\right\}\right]}{\sum_{j=1}^{N+1}\left\{B_j\cosh\left(\frac{jV_i}{V_T}\right)\right\}} \tag{8}$$

where $B_j$ and $C_j$ are coefficients.

If the equation (8) is differentiated by the differential input voltage $V_i$, the transconductance characteristic of the conventional OTA of FIG. 1 is given by the following equation (9).

$$\frac{d(\Delta I)}{dV_i} = \frac{\alpha_F}{V_T} \left[ \frac{\sum_{j=1}^{N+1}\left\{jC_j\sinh\left(\frac{jV_i}{V_T}\right)\right\}}{\sum_{j=1}^{N+1}\left\{B_j\cosh\left(\frac{jV_i}{V_T}\right)\right\}} - \frac{\left[\sum_{j=1}^{N+1}\left\{\sinh\left(\frac{jV_j}{V_T}\right)\right\}\right]\left[\sum_{j=1}^{N+1}\left\{jB_j\sinh\left(\frac{jV_i}{V_T}\right)\right\}\right]}{\left[\sum_{j=1}^{N+1}\left\{B_j\cosh\left(\frac{jV_i}{V_T}\right)\right\}\right]^2} \right] \quad (9)$$

To cause the transconductance to be maximally flat, considering the symmetric arrangement of the differential transistor pairs, the odd-order differential coefficients of the differential output current $\Delta I$ in the equation (8) needs to be zero at $V_i=0$. Specifically, the following condition (10) needs to be satisfied.

$$\left.\frac{d^3(\Delta I)}{dV_i^3}\right|_{V_i=0} = \ldots = \left.\frac{d^{2n+1}(\Delta I)}{dV_i^{2n+1}}\right|_{V_i=0} = 0 \quad (10)$$

The maximum value of the transconductance shown in the equation (9) is obtained at $V_i=0$. Therefore, the following equation (11) needs to be established.

$$\frac{d(\Delta I)}{dV_i} \leq \left.\frac{d(\Delta I)}{dV_i}\right|_{V_i=0} \quad (11)$$

FIG. 2 shows another conventional bipolar OTA of this sort, which contains first to N-th differential pairs of bipolar transistors and first to N-th constant current sinks.

As shown in FIG. 2, this OTA has the same configuration as that of the OTA of FIG. 1 except that the first differential pair of the transistors Q01 and Q02 and the corresponding first constant current sink CS0 are canceled.

Accordingly, a differential output current $\Delta I$ of the conventional OTA shown in FIG. 2 is expressed as the following equation (7') because $\Delta I_{C0}=0$ in the equation (7):

$$\Delta I = \sum_{j=1}^{N} \Delta I_{C2j} \quad (7')$$

As a result, by substituting the above equation (6) into the equation (7'), the differential output current $\Delta I$ of the conventional OTA of FIG. 2 is expressed as the following general equation (8').

$$\Delta I = \frac{\alpha_F\left[\sum_{j=1}^{N}\left\{C_j\sinh\left(\frac{jV_i}{V_T}\right)\right\}\right]}{\sum_{j=1}^{N}\left\{B_j\cosh\left(\frac{jV_i}{V_T}\right)\right\}} \quad (8')$$

If the equation (8') is differentiated by the differential input voltage $V_i$, the transconductance characteristic of the conventional OTA of FIG. 2 is given by the following equation (9').

$$\frac{d(\Delta I)}{dV_i} = \frac{\alpha_F}{V_T} \left[ \frac{\sum_{j=1}^{N}\left\{jC_j\sinh\left(\frac{jV_i}{V_T}\right)\right\}}{\sum_{j=1}^{N}\left\{B_j\cosh\left(\frac{jV_i}{V_T}\right)\right\}} - \frac{\left[\sum_{j=1}^{N}\left\{\sinh\left(\frac{jV_j}{V_T}\right)\right\}\right]\left[\sum_{j=1}^{N}\left\{jB_j\sinh\left(\frac{jV_i}{V_T}\right)\right\}\right]}{\left[\sum_{j=1}^{N}\left\{B_j\cosh\left(\frac{jV_i}{V_T}\right)\right\}\right]^2} \right] \quad (9')$$

To cause the transconductance to be maximally flat, considering the symmetric arrangement of the differential transistor pairs, the odd-order differential coefficients of the differential output current $\Delta I$ in the equation (8') needs to be zero at $V_i=0$. The maximum value of the transconductance shown in the equation (9') is obtained at $V_i=0$. Therefore, also in the conventional OTA of FIG. 2, the above condition (10) needs to be satisfied and the above equation (11) needs to be established.

When N=1 (i.e., 2N=2) in the conventional OTA of FIG. 2, this OTA has a circuit configuration shown in FIG. 3. This configuration is termed a "multi-tanh doublet".

The condition of the transconductance to be maximally flat is given by $$\left.\frac{d^3(\Delta I)}{dV_i^3}\right|_{V_i=0} = 0$$

Therefore, the emitter area ratio $K_1$ is given as $K_1 = 2 \pm \sqrt{3} (\approx 3.73205 \text{ and } 0.267949)$, and the coefficients $B_0$, $B_1$ and $C_1$ are given as $B_0 = \cosh(\ln K_1) = 2$ $B_1 = 1$ and $C_1 = 2$.

A differential output current $\Delta I$ of the conventional OTA of FIG. 3 is expressed as the following equation (12):

$$\Delta I = \frac{2\alpha_F I_0 \sinh\left(\frac{V_i}{V_T}\right)}{\cosh\left(\frac{V_i}{V_T}\right) + 2} \quad (12)$$

When N=1 (i.e., 2N+1=3) in the conventional OTA of FIG. 1, this OTA has a circuit configuration shown in FIG. 5. This configuration is termed a "multi-tanh triplet".

A differential output current $\Delta I$ of the conventional OTA shown in FIG. 5 is expressed as the following equation (13):

$$\Delta I = \alpha_F \left\{ \frac{I_{00}\sinh\left(\frac{V_i}{2V_T}\right)}{\cosh\left(\frac{V_i}{2V_T}\right)} + \frac{2I_{01}\sinh\left(\frac{V_i}{V_T}\right)}{\cosh\left(\frac{V_i}{V_T}\right) + \cosh\left(\frac{V_{K1}}{V_T}\right)} \right\} \quad (13)$$

The condition of the transconductance to be maximally flat is given by $$\left.\frac{d^3(\Delta I)}{dV_i^3}\right|_{V_i=0} = 0$$

Therefore, the following equation (14) is established.

$$2I_{01}\frac{\cosh\left(\frac{V_{K1}}{V_T}\right)-2}{\left\{\cosh\left(\frac{V_{K1}}{V_T}\right)+1\right\}^2} - \frac{I_{00}}{4} = 0 \quad (14)$$

Further, from the relationship of $$\left.\frac{d^5(\Delta I)}{dV_i^5}\right|_{V_i=0} = 0,$$

the following equation (15) is obtained.

$$2I_{01}\frac{\left\{\cosh\left(\frac{V_{K1}}{V_T}\right)\right\}^2 - 13\cosh\left(\frac{V_{K1}}{V_T}\right)+16}{\left\{\cosh\left(\frac{V_{K1}}{V_T}\right)+1\right\}^3} + \frac{I_{00}}{2} = 0 \quad (15)$$

Therefore, $\cosh(V_{K1}/V_T)=2$ (i.e., $K_1 \approx 7.873$) and $I_{00}=(16/25)I_{01}$ are established. This means that $B2=1$, $B1=n2\cosh[\ln(K_1)+1=9]$, $B0=0$, $C2=2.64$ and $C1=6.48$.

As a result, the differential output current $\Delta I$ is given by the following equation (16), where $I_0=I_{01}$.

$$\Delta I = \frac{\alpha_F I_0\left\{2.64\sinh\left(\frac{3V_i}{2V_T}\right)+6.48\sinh\left(\frac{V_i}{2V_T}\right)\right\}}{\cosh\left(\frac{3V_i}{2V_T}\right)+9\cosh\left(\frac{V_i}{2V_T}\right)} \quad (16)$$

When $N=2$ (i.e., $2N=4$) in the conventional OTA of FIG. 2, this configuration is termed a "multi-tanh quin".

A differential output current $\Delta I$ of this conventional OTA is expressed as the following equation (17):

$$\Delta I = \alpha_F\left\{\frac{I_{01}\sinh\left(\frac{V_i}{V_T}\right)}{\cosh\left(\frac{V_i}{V_T}\right)+\cosh\left(\frac{V_{K1}}{V_T}\right)}\right\} + \frac{2I_{02}\sinh\left(\frac{V_i}{V_T}\right)}{\cosh\left(\frac{V_i}{V_T}\right)+\cosh\left(\frac{V_{K1}}{V_T}\right)}\right\} \quad (17)$$

Since the condition of the transconductance to be maximally flat is given by $$\left.\frac{d^3(\Delta I)}{dV_i^3}\right|_{V_i=0} = 0,$$

the following equation (18) is obtained.

$$2I_{01}\frac{\cosh\left(\frac{V_{K1}}{V_T}\right)-2}{\left\{\cosh\left(\frac{V_{K1}}{V_T}\right)+1\right\}^2} + 2I_{02}\frac{\cosh\left(\frac{V_{K2}}{V_T}\right)-2}{\left\{\cosh\left(\frac{V_{K2}}{V_T}\right)+1\right\}^2} = 0 \quad (18)$$

From the condition that the fifth-order differential coefficient of the differential output current $\Delta I$ is equal to zero at $V_i=0$, i.e., $$\left.\frac{d^5(\Delta I)}{dV_i^3}\right|_{V_i=0} = 0,$$

the following equation (19) is obtained.

$$2I_{01}\frac{\left\{\cosh\left(\frac{V_{K1}}{V_T}\right)\right\}^2 - 13\cosh\left(\frac{V_{K1}}{V_T}\right)+16}{\left\{\cosh\left(\frac{V_{K1}}{V_T}\right)+1\right\}^3} + \quad (19)$$

$$2I_{02}\frac{\left\{\cosh\left(\frac{V_{K2}}{V_T}\right)\right\}^2 - 13\cosh\left(\frac{V_{K2}}{V_T}\right)+16}{\left\{\cosh\left(\frac{V_{K2}}{V_T}\right)+1\right\}^3} = 0$$

Therefore, $\cosh(V_{K1}/V_T)=4-\sqrt{15/2}(\approx 1.2624)$ (i.e., $K_1 \approx 2.030$), $\cosh(V_{K2}/V_T)=4+\sqrt{15/2}(\approx 6.739)$ (i.e., $K_2 \approx \exp[\cosh^{-1}(V_{K2}/V_T)] \approx 13.403$)

are established.

Thus, the constant current $I_{01}$ is given as $I_{01} \approx [(\sqrt{15/2}+2)/(\sqrt{15/2}-2)] \cdot [(\sqrt{15/2}-5)/(\sqrt{15/2}+5)]^2 I_{02} (\approx 0.5478\, I_{02})$.

Accordingly, $B_2=1$, $B_1=16$, $B_0=18$, $C_2 \approx 3.0957\, I_{01}$, and $C_1 \approx 19.81252\, I_{01}$ are obtained.

The differential output current $\Delta I$ is given by the following equation (20), where $I_0=I_{01}$.

$$\Delta I = \frac{\alpha_F I_0\left\{3.0957\sinh\left(\frac{2V_i}{V_T}\right)+19.81242\sinh\left(\frac{V_i}{V_T}\right)\right\}}{\cosh\left(\frac{2V_i}{V_T}\right)+16\cosh\left(\frac{V_i}{V_T}\right)+18} \quad (20)$$

For the above multi-tanh quintuplet, various transfer functions can be obtained from the condition of $$\left.\frac{d^3(\Delta I)}{dV_i^3}\right|_{V_i=0} = 0.$$

For example, when $I_{01}=I_{02}=I_0$, $\cosh(V_{k1}/V_T)=1.5$ (i.e., $K_1=\exp[\cosh^{-1}V_{K1}] \approx 2.6180$)

$\cosh(V_{k2}/V_T)=4$ (i.e., $K_2=\exp[\cosh^{-1}V_{K2}] \approx 7.873$), the coefficients are given as $B_2=1$, $B_1=16$, $B_0=18$, $C_2=4$, and $C_1=22$.

The differential output current $\Delta I$ in this case is expressed by the following equation (21).

$$\Delta I = \frac{2\alpha_F I_0\left\{2\sinh\left(\frac{2V_i}{V_T}\right)+11\sinh\left(\frac{V_i}{V_T}\right)\right\}}{\cosh\left(\frac{2V_i}{V_T}\right)+11\cosh\left(\frac{V_i}{V_T}\right)+13} \quad (21)$$

The input voltage range of the multi-tanh quintuplet providing a linear transconductance characteristic, which is given by the equation (21), is approximately as narrow as that of the multi-tanh triplet given by the above equation (16).

Generally, to make the input voltage range as wide as possible in the multi-tanh cells having maximally flat characteristics, high, odd-order differential coefficients (a fifth-order differential coefficient or higher) needs to be zero at $V_1=0$.

It should be noted that the denominator of each differential output current $\Delta I$ expressed by the above equation (12), (16), (17) or (20) is expressed by a sum of hyperbolic cosine (cosh) functions and that each of the coefficients of the hyperbolic cosine functions are expressed by an integer.

With the above described conventional OTAs employing the multi-tanh technique, an obtainable input voltage range providing the linear transconductance characteristic is at most 200 $mV_{P-P}$.

FIG. 4 represents the transconductance characteristics of the multi-tanh doublet of FIG. 3 (curve c), the multi-tanh triplet of FIG. 5 (curve b) and the multi-tanh quad (curve a), in which $V_T$ is the thermal voltage whose value is approximately 25 to 26 mV at room temperature.

As described above, with the conventional OTAs using the multi-tanh technique, the denominator of the differential output current $\Delta I$ is expressed by a hyperbolic cosine (cosh) function or functions and the numerator thereof by a hyperbolic sine (sinh) function or functions.

When the numerator of the differential output current $\Delta I$ includes a sinh function or functions only, the transconductance linearity is dependent upon the functional form of the denominator thereof.

An OTA is an essential, basic function block in analog signal applications. Recently, fabrication processes for large-scale integrated circuit devices (LSIs) have been becoming finer and finer and as a result, the supply voltage for the LSIs has been decreasing from 5 V to 3 V, 2V, or 1V. This tendency has been increasing the necessity for the low-voltage circuit technique more and more.

Also, although the above-described conventional OTAs using the multi-tanh technique is capable of low-voltage operation, they have a problem that the input voltage range providing the linear transconductance characteristic is very narrow. To make the input voltage range wider, another problem that the circuit scale and current consumption increase will occur.

Further, with the above-described conventional OTAs using the multi-tanh technique, the dc offset voltage for each differential transistor pair is generated by the difference of the emitter areas or sizes of the corresponding two bipolar transistors, an realizable emitter-area ratio of the transistors is at most several tens. As a result, a problem that an obtainable input voltage range is at most approximately 100 $mV_{P-P}$ occurs.

SUMMARY OF THE INVENTION

Accordingly, an object of the present invention is to provide a bipolar OTA having a wider input voltage range than that of the conventional OTAs without increasing the circuit scale and current consumption.

Another object of the present invention is to provide a bipolar OTA capable of low voltage operation at a power supply voltage of approximately 1 V.

The above objects together with others not specifically mentioned will become clear to those skilled in the art from the following description.

A bipolar OTA according to a first aspect of the present invention includes first to n-th differential pairs of first to 2n-th bipolar transistors whose emitters are coupled together, where n is an integer equal to or greater than two; and a common current source or sink connected to the emitters of the first to 2n-th transistors of the first to n-th differential pairs.

The first to 2n-th transistors of the first to n-th differential pairs are driven by a common tail current produced by the common current source or sink.

The transistors of each of the second to n-th differential pairs have a same emitter area $K_1$ to $K_{n-1}$ times as large as that of the first and second transistors of the first differential pair, where $K_1$ to $K_{n-1}$ are greater than unity.

A first input voltage as an input signal to be amplified is differentially applied across bases of the first and second transistors of the first differential pari. A second to n-th input voltages are differentially applied across corresponding bases of the third to 2n-th transistors of the second to n-th differential pairs, respectively.

Each of the second to n-th input voltages is produced by attenuating the first input voltage. First to (n−1)-th pairs of dc offset or tuning voltages are applied to the bases of the third to 2n-th transistors of the second to n-th differential paris, respectively.

An amplified output signal is differentially derived from collectors of the first and second transistors of the first differential pair.

With the bipolar OTAs according to the first aspect of the present invention, the first input voltage is differentially applied across the bases of the first and second transistors of the first differential pair, and the second to n-th input voltages are differentially applied across corresponding bases of the third to 2n-th transistors of the second to n-th differential pairs, respectively. Each of the second to n-th input voltages is generated by attenuating the first input voltage. First to (n−1)-th pairs of dc offset or tuning voltages are applied to the bases of the third to 2n-th transistors of the second to n-th differential pairs, respectively.

Accordingly, a wider input voltage range than that of the conventional OTAs can be obtained.

Also, since the bipolar OTA according to the first aspect of the present invention has the above configurations, respectively, it is capable of low voltage operation at a power supply voltage of approximately 1 V.

Further, only one constant current source or sink is required for driving the first to 2n-th transistors of the first to n-th differential pairs. The second to n-th input voltages are produced by attenuating the first input voltage although the emitter areas or sizes of the third to 2n-th transistors of the second to n-th differential pairs are larger than that of the first and second transistors of the first differential pair. As a result, the circuit scale and consequently the current consumption are not increased.

In a preferred embodiment of the OTA according to the first aspect of the invention, each of the transistors of the second to n-th differential pairs is replaced with the combination of two emitter-coupled, base-coupled bipolar transistors whose collectors are connected to the collectors of the first and second transistors of the first differential pair, respectively. In this case, an additional advantage that the dc operating point is fixed will occur.

The two emitter-coupled, base-coupled bipolar transistors may have a same emitter area equal to a half of that of the corresponding transistors of each of the second to n-th differential pairs. In this case, no change is required for the first to (n−1)-th pairs of the dc offset voltages.

The two emitter-coupled, base-coupled bipolar transistors may have a same emitter area equal to that of the corresponding transistors of each of the second to n-th differential pairs. In this case, the first to (n−1)-th pairs of the dc off set voltages needs to be decreased by specific values, respectively.

In another preferred embodiment of the OTA according to the first aspect of the invention, each of the second to n-th input voltages is generated by using a resistive voltage divider. In this case, an additional advantage of a simple circuit configuration can be obtained.

A bipolar OTA according to a second aspect of the present invention includes first to n-th differential pairs of first to 2n-th bipolar transistors whose emitters are coupled together, where n is an integer equal to or greater than unity; an (2n+1)-th bipolar transistor whose emitter is connected to the emitters of the first to 2n-th transistors of the first to n-th differential pairs; and a common current source or sink connected to the emitters of the first to 2n-th transistors of the first to n-th differential pairs and the emitter of the (2n+1)-th transistor.

The first to 2n-th bipolar transistors of the first to n-th differential pairs and the (2n+1)-th bipolar transistor are driven by a common tail current produced by the common current source or sink.

The transistors of each of the second to n-th differential pairs have a same emitter area $K_1$ to $K_{n-1}$ times as large as that of the first and second transistors of the first differential pair, where $K_1$ to $K_{n-1}$ are greater than unity.

The (2n+1)-th transistor has an emitter area $K_n$ times as large as that of the first and second transistors of the first differential pair, where $K_n$ is greater than unity.

A first input voltage as an input signal to be amplified is differentially applied across bases of the first and second transistors of the first differential pair. Second to n-th input voltages are differentially applied across corresponding bases of the third to 2n-th transistors of the second to n-th differential pairs, respectively. An (n+1)-th input voltage is applied to a base of the (2n+1)-th transistor.

Each of the second to n-th input voltages is produced by attenuating the first input voltage. First to (n−1)-th pairs of dc offset or tuning voltages are applied to the bases of the third to 2n-th transistors of the second to n-th differential pairs, respectively.

A amplified output signal is differentially derived from collectors of the first and second transistors of the first differential pair.

With the bipolar OTAs according to the second aspect of the present invention, the first input voltage is differentially applied across the bases of the first and second transistors of the first differential pair, and the second to n-th input voltages are differentially applied across corresponding bases of the third to 2n-th transistors of the second to n-th differential pairs, respectively. The (n+1)-th input voltage is applied to the base of the (2n+1)-th transistor. Each of the second to n-th input voltages is produced by attenuating the first input voltage. First to (n−1)-th pairs of dc offset or tuning voltages are applied to the bases of the third to 2n-th transistors of the second to n-th differential pairs, respectively.

Accordingly, a wider input voltage range than that of the conventional OTAs can be obtained.

Also, the bipolar OTA according to the second aspect of the present invention has the above configuration, it is capable of low voltage operation at a power supply voltage of approximately 1 V.

Further, only one constant current source or sink is required for driving the first to 2n-th transistors of the first to n-th differential pairs and the (2n+1)-th transistor. The second to n-th input voltages are produced by attenuating the first input voltage although the emitter areas or sizes of the third to 2n-th transistors of the second to n-th differential pairs are larger than that of the first and second transistors of the first differential pair. As a result, the circuit scale and consequently the current consumption are not increased.

In a preferred embodiment of the OTA according to the second aspect of the invention, each of the first to 2n-th transistors of the second to n-th differential pairs and the (2n+1)-th transistor is replaced with the combination of two emitter-coupled, base-coupled bipolar transistors whose collectors are connected to the collectors of the first and second transistors of the first differential pair, respectively. In this case, an additional advantage that the dc operating point is fixed will occur.

The two emitter-coupled, base-coupled bipolar transistors may have a same emitter area equal to a half of that of the corresponding transistors of each of the second to n-th differential pairs. In this case, no change is required for the first to (n−1)-th pairs of the dc offset voltages.

The two emitter-coupled, base-coupled bipolar transistors may have a same emitter area equal to that of the corresponding transistors of each of the second to n-th differential pairs. In this case, the first to (n−1)-th pairs of the dc off set voltages needs to be decreased by specific values, respectively.

In another preferred embodiment of the OTA according to the second aspect of the invention, each of the second to n-th input voltages is generated by using a resistive voltage divider. In this case, an additional advantage of a simple circuit configuration can be obtained.

BRIEF DESCRIPTION OF THE DRAWINGS

In order that the present invention may be readily carried into effect, it will now he described with reference to the accompanying drawings.

DETAILED DESCRIPTION OF THE PREFERRED EMBODIMENTS

Preferred embodiments of the present invention will be described in detail below while referring to FIGS. 6 to 33 attached.

In the following description, since an emitter of a bipolar transistor is often called as a tail, a circuit cell consisting of three or more emitter-coupled bipolar transistors driven by a common tail current is termed a "multitail cell". For example, a cell consisting of three transistors is termed a "triple-tail cell".

First Embodiment

Figure 6:
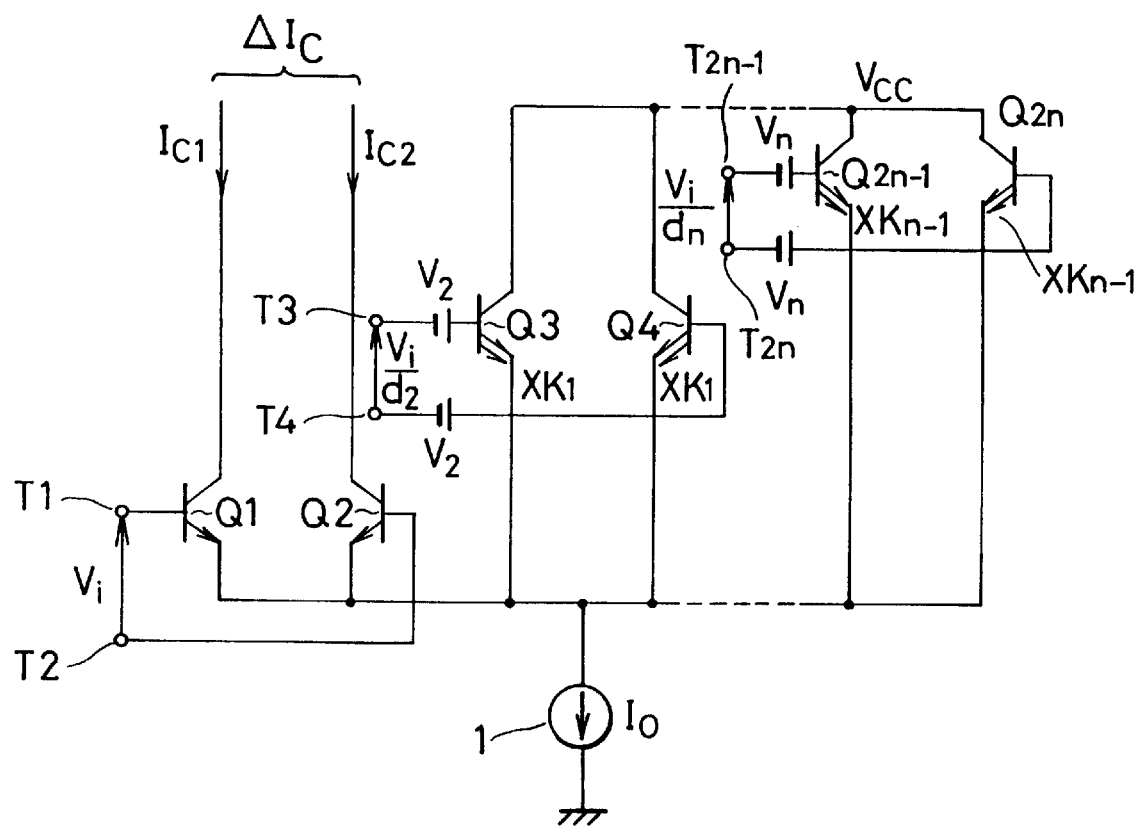
FIG. 6 is a circuit diagram of a bipolar OTA according to a first embodiment of the present invention, in which 2N differential transistor pairs are used.

A bipolar OTA according to a first embodiment of the present invention is shown in FIG. 6.

As shown in FIG. 6, this OTA includes first to n-th balanced differential pairs of npn bipolar transistors Q1 to Q2n whose emitters are coupled together, and a common constant current sink 1 (current value: $I_0$) for driving the first to n-th differential pairs, where n is an integer equal to or greater than two (i.e., $n \geq 2$).

The coupled emitters of the transistors Q1 to Q2n of the first to n-th differential pairs are connected in common to one end of the current sink 1. The other end of the current sink 1 is grounded.

The emitter areas of the transistors Q1 to Q2 are equal to that of a unit bipolar transistor. The emitter areas of the transistors Q3 and Q4 of the second differential pair are a same, which is $K_1$ times as large as that of the transistors Q1 and Q2 of the first differential pair, where $K_1$ is a constant greater than unity (i. e, $K_1>1$).

Similarly, the emitter areas of the two transistors of each of the third to n-th differential pairs are a same, which is $K_2$ to $K_{n-1}$ times as large as that of the transistors Q1 and Q2 of the first differential pair, respectively, where $K_2$ to $K_{n-1}$ are constants greater than unity (i.e., $K_2$, $K_3$, . . . , and $K_{n-1}>1$).

The bipolar transistors Q1 and Q2 of the first differential pair have bases connected to a first pair of input terminals T1 and T2, respectively.

A differential input voltage $V_1$ as an input signal to be amplified is applied across the bases of the transistors Q1 and Q2 through the input terminals T1 and T2.

A differential output current $\Delta I_C$ of the OTA as an amplified output signal is derived from collectors of the transistors Q1 and Q2 of the first differential pair. The differential output current $\Delta I_C$ is defined as $\Delta I_C = I_{C1} - I_{C2}$, where $I_{C1}$ and $I_{C2}$ are collector currents of the transistors Q1 and Q2, respectively.

The bipolar transistors Q3 and Q4 of the second differential pair have bases connected to a second pair of input terminals T3 and T4, respectively.

An attenuated differential voltage $(V_i/d_2)$ of $V_i$ serving as a second input voltage is applied across the bases of the transistors Q3 and Q4 through the input terminals T3 and T4, where $d_2$ is an attenuation parameter greater than unity ($d_2>1$). Two dc offset voltages $V_2$ are additionally applied to the bases of the transistors Q3 and Q4, respectively. Collectors of the transistors Q3 and Q4 are coupled together to be applied with a power supply voltage $V_{cc}$.

Similarly, the bipolar transistors Q2n–1 and Q2n of the n-th differential pair have bases connected to an n-th pair of input terminals T2n–1 and T2n, respectively. An attenuated differential input voltage $(V_i/d_n)$ of $V_i$ serving as an n-th input voltage is applied across the bases of the transistors Q2n–1 and Q2n through the input terminals T2n–1 and T2n, where dn is an attenuation parameter greater than unity. Two dc offset voltages $V_n$ are additionally applied to the bases of the transistors Q2n–1 and Q2n, respectively. Collectors of the transistors Q2n–1 and Q2n are coupled together to be applied with the power supply voltage $V_{cc}$.

The second to n-th differential pairs constitute a current bypass circuit for the first differential pair of the transistors Q1 and Q2.

The differential output current $\Delta I_c$ of the bipolar OTA according to the first embodiment of FIG. 6 is expressed as the following equation (22a).

$$\Delta I_C = I_{C1} - I_{C2} \quad (22a)$$

$$= \frac{\alpha_F I_0 \sinh\left(\frac{V_i}{2V_T}\right)}{\cosh\left(\frac{V_i}{2V_T}\right) + \sum_{j=2}^{n}\left\{A_j\cosh\left(\frac{V_i}{2d_jV_T}\right)\right\}}$$

In the equation (22a), $A_j$ is a constant of the j-th (j=1, 2, . . . , n) differential pair defined as $$A_j = K_j\exp\left(\frac{V_{Cj}}{V_T}\right) \quad (23)$$

where $K_j$ is a constant of the j-th differential pair, $V_{cj}$ is the j-th dc offset or tuning voltage thereof.

The transconductance of the OTA according to the first embodiment is given as the following equation (24a) by differentiating the equation (22a) with the differential input voltage $V_i$.

$$\frac{d(\Delta I_C)}{dV_i} = \frac{\alpha_F I_0}{2V_T}\left[\frac{\cosh\left(\frac{V_i}{2V_T}\right)}{\cosh\left(\frac{V_i}{2V_T}\right) + \sum_{j=2}^{n}\left\{A_j\cosh\left(\frac{V_i}{2d_jV_T}\right)\right\}} - \right.$$

$$\left. \frac{\sinh\left(\frac{V_i}{2V_T}\right)\left[\sinh\left(\frac{V_i}{2V_T}\right) + \sum_{j=1}^{n}\left\{\frac{A_j}{d_j}\sinh\left(\frac{V_i}{2d_jV_T}\right)\right\}\right]}{\left[\cosh\left(\frac{V_i}{2V_T}\right) + \sum_{j=2}^{n}\left\{A_j\cosh\left(\frac{V_i}{2d_jV_T}\right)\right\}\right]^2}\right]$$
(24a)

The condition of the transconductance to be maximally flat is given by $$\left.\frac{d^3(\Delta I)}{dV_i^3}\right|_{V_i=0} = 0.$$

Therefore, the following relationship (25a) is obtained by differentiating the equation (22a) with $V_i$ three times.

$$\left\{1 + \sum_{j=2}^{n} A_j\right\} - 3\left\{1 + \sum_{j=2}^{n}\left(\frac{A_j}{d_j^2}\right)\right\} = 0 \quad (25a)$$

With the bipolar OTA according to the first embodiment of FIG. 6, the transistors Q3 to Q2n forming the second to n-th differential pairs, which are not connected to the differential output ends (i.e., the collectors of the transistors Q1 and Q2) of the OTA, constitute a current bypass subcircuit, because they allow a part of the common tail current $I_0$ to bypass the first differential pair of the transistors Q1 and Q2.

It can be said that the sum of the collector currents $I_{C1}$ and $I_{C2}$ of the transistors Q1 and Q2 of the first differential pair has an approximately square-law characteristic.

As already stated above, the numerator of the differential output current $\Delta I_C$ in the equation (22a) includes a sinh function only and therefore, the transconductance linearity is dependent upon the functional form of the denominator thereof. Thus, if the constants $A_j$ defined by the equation (23) are set to be natural numbers, the OTA according to the first embodiment of FIG. 6 can have a wider input voltage range providing the linear transconductance characteristic than that of the conventional bipolar OTAs.

The OTA according to the first embodiment of FIG. 6 is formed by the single constant current sink 1 and the bipolar transistors Q1 to Q2n forming the multitail cell. Although the emitter areas or sizes of the third to 2n-th transistors of the second to n-th differential pairs are larger than that of the transistors Q1 and Q2 of the first differential pair, the second to n-th differential input voltages ($V_i/d_j$) (j=2, 3, ... ,n) are produced by attenuating the differential input voltage $V_1$. As a result, the circuit scale and consequently the current consumption can be restrained from increasing.

Also, because the bipolar OTA according to the first embodiment of FIG. 6 has the above configuration, it is capable of low voltage operation at a power supply voltage as low as approximately 1 V.

Second Embodiment

Figure 7:
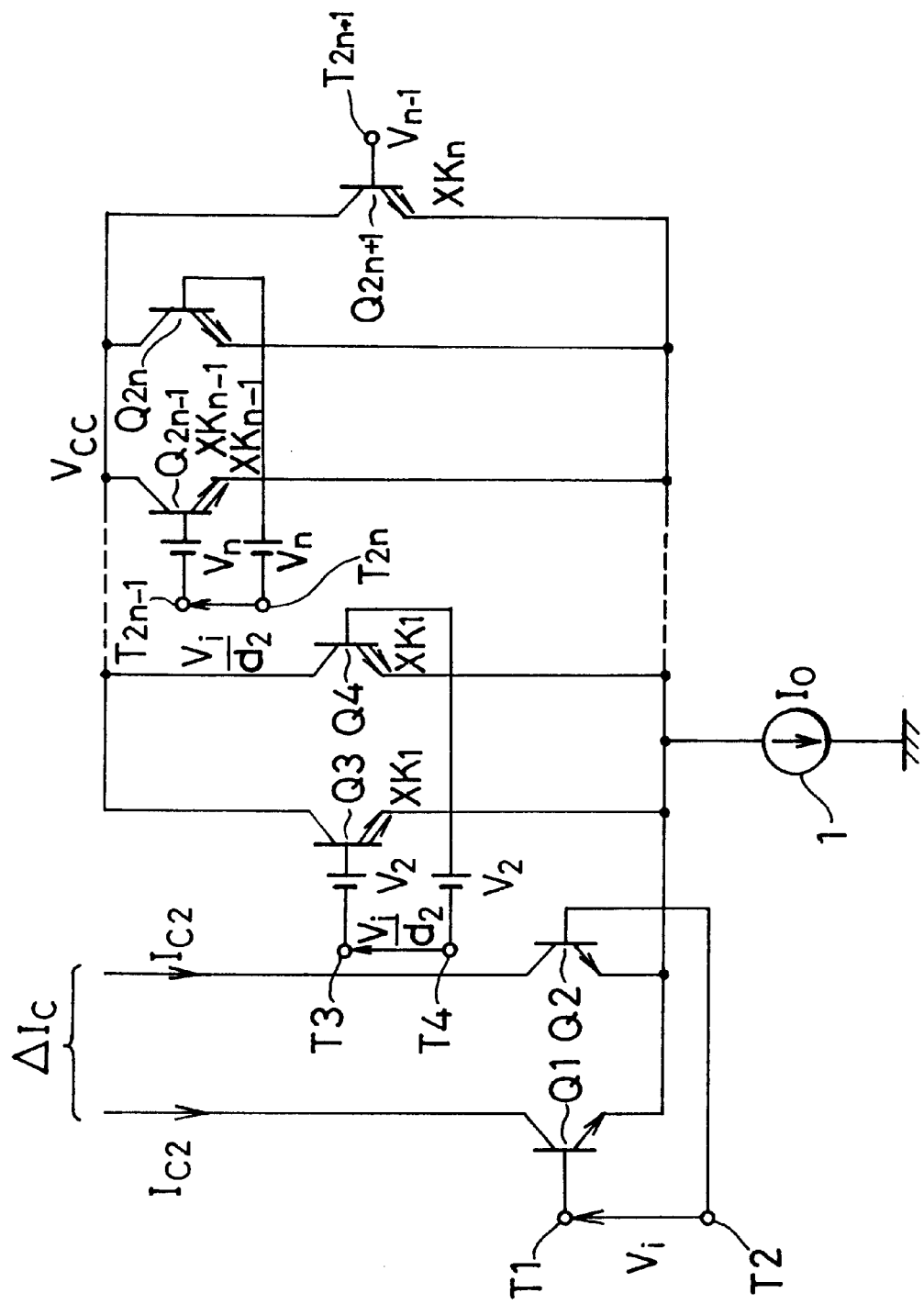
FIG. 7 is a circuit diagram of a bipolar OTA according to a second embodiment of the present invention, in which (2N +1) differential transistor pairs are used.

A bipolar OTA according to a second embodiment of the present invention is shown in FIG. 7.

As shown in FIG. 7, this OTA has the same configuration as that of the OTA according to the first embodiment of FIG. 6, except that an npn bipolar transistor Q2n+1 is additionally used to be applied with an (n+1)-th dc tuning or offset voltage $V_{n+1}$ with respect to the ground, and that n is equal to or greater than unity (i.e., n>1).

The emitter area of the transistor Q2n+1 is $K_n$ times as large as that of the first and second transistors Q1 and Q2, where $K_n$ is a constant greater than unity (i.e., $K_n>1$). Therefore, the description about the same configuration is omitted here by adding the same reference characters or numerals to the corresponding elements in FIG. 7 for the sake of simplification.

An emitter of the transistor Q2n+1 is connected to the coupled emitters of the transistors Q1 to Q2n of the first to n-th differential pairs and is connected to the common current sink 1. The transistor Q2n+1 also is driven by the common current sink 1.

A collector of the transistor Q2n+1 is connected to the coupled collectors of the transistors Q3 to Q2n of the second to n-th differential pairs, and is applied with the power supply voltage $V_{cc}$. A base of the transistor Q2n+1 is connected to an input terminal T2n+1. The dc tuning or offset voltage $V_{n+1}$ is applied to the base of the transistor Q2n+1 through the input terminal T2n+1 with respect to the ground.

The differential output current $\Delta I_C$ of the bipolar OTA according to the second embodiment of FIG. 7 is expressed as the following equation (22b).

$$\Delta I_C = I_{C1} - I_{C2} \quad (22b)$$

$$= \frac{\alpha_F I_0 \sinh\left(\frac{V_i}{2V_T}\right)}{\cosh\left(\frac{V_i}{2V_T}\right) + \sum_{j=2}^{n}\left\{A_j \cosh\left(\frac{V_i}{2d_j V_T}\right)\right\} + A_{n+1}}$$

The transconductance of the OTA according to the second embodiment is obtained as the following equation (24b) by differentiating the equation (22b) with the differential input voltage $V_i$.

$$\frac{d(\Delta I_C)}{dV_i} = \frac{\alpha_F I_0}{2V_T}\left[\frac{\cosh\left(\frac{V_i}{2V_T}\right)}{\cosh\left(\frac{V_i}{2V_T}\right) + \sum_{j=2}^{n}\left\{A_j \cosh\left(\frac{V_i}{2d_j V_T}\right)\right\} + A_{n+1}} - \right. \quad (24b)$$

$$\left. \frac{\sinh\left(\frac{V_i}{2V_T}\right)\left[\sinh\left(\frac{V_i}{2V_T}\right) + \sum_{j=2}^{n-1}\left\{\frac{A_j}{d_j}\sinh\left(\frac{V_i}{2d_j V_T}\right)\right\}\right]}{\left[\cosh\left(\frac{V_i}{2V_T}\right) + \sum_{j=2}^{n}\left\{A_j \cosh\left(\frac{V_i}{2d_j V_T}\right)\right\} + A_{n+1}\right]^2}\right]$$

As the condition of the transconductance to be maximally flat, the following relationship (25b) is obtained by differentiating the both sides of the equation (22b) with $V_i$ three times.

$$\left\{1 + \sum_{j=2}^{n+1} A_j\right\} - 3\left\{1 + \sum_{j=2}^{n}\left(\frac{A_j}{d_j^2}\right)\right\} = 0 \quad (25b)$$

With the bipolar OTA according to the second embodiment of FIG. 7, similar to the OTA according to the first embodiment of FIG. 6, the transistors Q3 to Q2n forming the second to n-th differential pairs and the transistor Q2n+1, which are not connected to the differential output ends (i.e., the collectors of the transistors Q1 and Q2) of the OTA, constitute a current bypass subcircuit. The sum of the collector currents $I_{C1}$ and $T_{C2}$ of the transistors Q1 and Q2 of the first differential pair has an approximately square-law characteristic.

The numerator of the differential output current $\Delta I_C$ in the equation (22b) includes a sinh function only and therefore, the transconductance linearity is dependent upon the functional form of the denominator thereof. Thus, if the constants $A_j$ defined by the above equation (23) are set to be natural numbers, the OTA according to the second embodiment of FIG. 7 can have a wider input voltage range providing the linear transconductance characteristic than that of the conventional bipolar OTAs.

The OTA according to the second embodiment of FIG. 7 is formed by the single constant current sink 1 and the bipolar transistors Q1 to Q2n+1 of the multitail cell. Although the emitter areas or sizes of the third to 2n-th transistors of the second to n-th differential pairs and the (2n+1)-th transistor are larger than that of the transistors Q1 and Q2 of the first differential pair, the second to n-th differential input voltages ($V_i/d_j$) (I =2, . . . , n) are produced by attenuating the differential input voltage $V_i$. As a result, the circuit scale and consequently the current consumption can be restrained from increasing.

Also, because the bipolar OTA according to the second embodiment has the above configuration, it is capable of low voltage operation at a power supply voltage as low as approximately 1 V.

Third Embodiment

Figure 8:
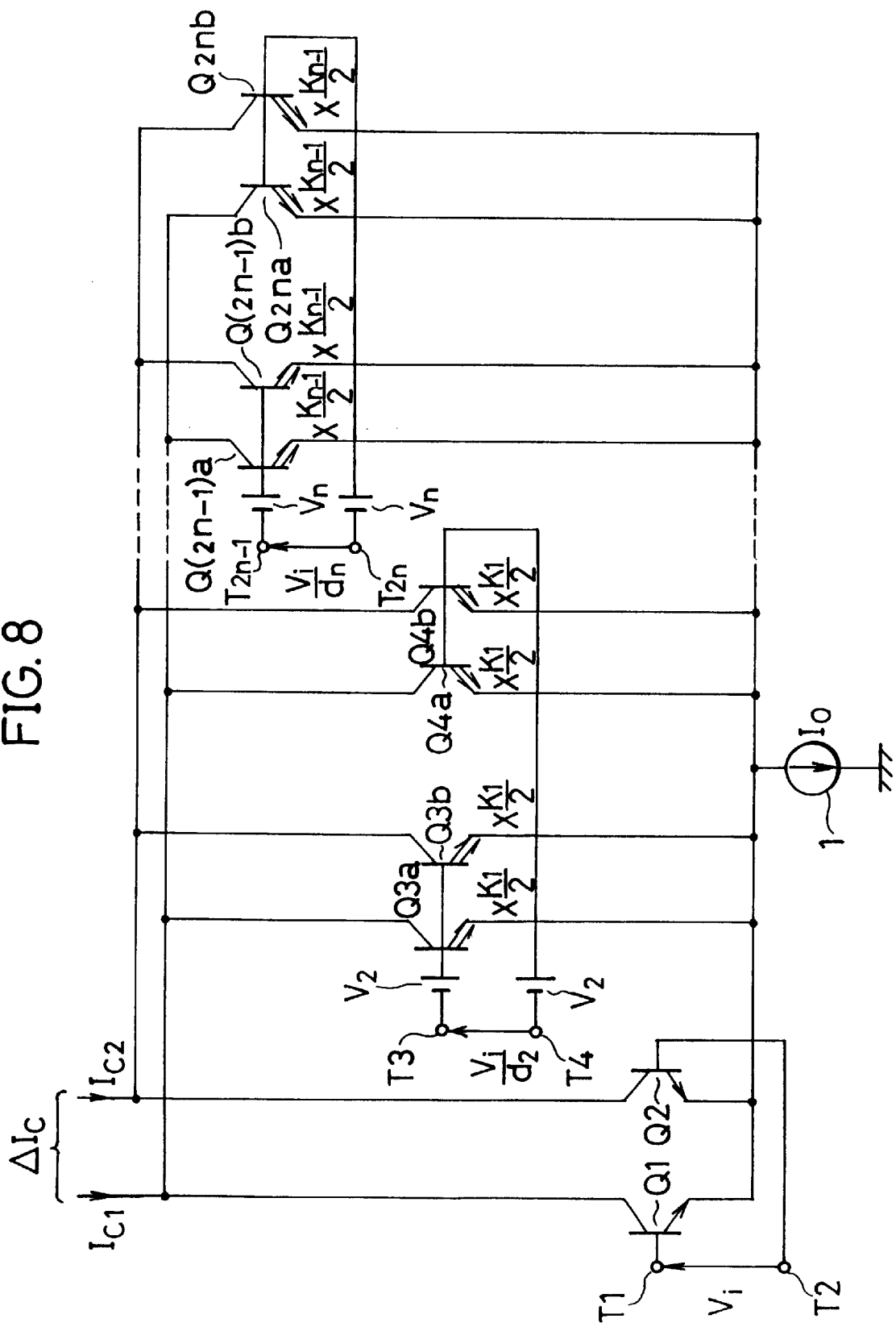
FIG. 8 is a circuit diagram of a bipolar OTA according to a third embodiment of the present invention, in which each transistor of each of the second to n-th differential pairs is replaced with the combination of two emitter-coupled, base-coupled bipolar transistors.

A bipolar OTA according to a third embodiment of the present invention is shown in FIG. 8, which corresponds to an OTA obtained by replacing each transistor of the second to n-th differential pairs in the OTA according to the first embodiment of FIG. 6 with the combination of two emitter-coupled, base-coupled bipolar transistors.

As previously described, the transistors Q3 to Q2n forming the second to n-th differential pairs in the OTA according to the first embodiment of FIG. 6, which are not connected to the differential output ends (i.e., the collectors of the transistors Q1 and 02) of the OTA, constitute a current bypass subcircuit. This is because they allow a part of the common tail current $I_0$ to bypass the first differential pair of the transistors Q1 and Q2.

Accordingly, it can be said that the sum of the collector currents $I_{C1}$ and $I_{C2}$ of the transistors Q1 and Q2 of the first differential pair has an approximately square-law characteristic.

Here, the multitail cell is driven by the constant current $I_0$ and therefore, the same OTA operation can be realized even if the currents flowing through the transistors Q3 to Q2n serving as the bypass component of the constant driving current $I_0$ are divided into two parts, respectively, and then, the divided parts of the currents flowing through the transistors Q3 to Q2n are supplied or distributed to the corresponding collectors of the transistors Q1 and Q2, respectively. This is the simplest way for the purpose of realizing such the current distribution.

In this case, the dc components of the collector currents $I_{C1}$ and $I_{C2}$ of the transistors Q1 and Q2 are equal to a constant value of $\alpha_F(I_0/2)$.

As a result, an additional advantage that the dc operating point is fixed occurs in the OTA according to the third embodiment of FIG. 8, in addition to the same advantages as those in the first embodiment of FIG. 6.

As shown in FIG. 8, for the second differential pair, npn emitter-coupled, base-coupled bipolar transistors Q3*a* and Q3*b* are used instead of the transistor Q3 in FIG. 6, and npn emitter-coupled, base-coupled bipolar transistors Q4*a* and Q4*b* are used instead of the transistor Q4 in FIG. 6. Similarly, for the nth differential pair, npn emitter-coupled, base-coupled bipolar transistors Q(2n−1)a and Q(2n−1)b are used instead of the transistor Q2n−1 in FIG. 6, and npn emitter-coupled, base-coupled bipolar transistors Q2na and Q2nb are used instead of the transistor Q2n in FIG. 6.

Collectors of the transistors Q3*a*, Q4*a*, . . . Q(2n−1)a, and Q2na are connected to the collector of the transistor Q1 of the first differential pair, respectively. Collectors of the transistors Q3*b*, Q4*b*, . . . , Q(2n−1)b, and Q2n*b* are connected to the collector of the transistor Q2 of the first differential pair, respectively.

The transistors Q3*a* and Q3*b* of the second differential pair have a same emitter area ($K_1/2$) times as large as that of the transistors Q1 and Q2 of the first differential pair. The transistors Q4*a* and Q4*b* of the second differential pair have a same emitter area ($K_1/2$) times as large as -Llat of the transistors Q1 and Q2 of the first differential pair.

Similarly, the transistors Q(2n−1)a and Q(2n−1)b of the n-th differential pair have a same emitter area ($K_{n-1}/2$) times as large as that of the transistors Q1 and Q2 of the first differential pair. The transistors Q2na and Q2nb of the n-th differential pair have a same emitter area ($K_{n-1}/2$) times as large as that of the transistors Q1 and Q2 of the first differential pair.

The second to n-th input voltages $V_2$ to $V_n$ are equal to those of the OTA according to the first embodiment of FIG. 6, respectively.

Additionally, in the circuit configuration of FIG. 8, the transistors Q3*a* and Q3*b* and Q4*a* and Q4*h* of the second differential pair may have a same emitter area $K_1$ times as large as that of the transistors Q1 and Q2 of the first differential pair. The transistors Q(2n−1)a and Q(2n−1)b and Q2na and Q2nb of the n-th differential pair may have a same emitter area $K_{n-1}$ times as large as that of the transistors Q1 and Q2 of the first differential pair.

However, in this case, it is necessary that the second to n-th input voltages $V_2$ to $V_n$ are decreased by proper values in such a way that the sum of the currents flowing through the transistors Q1 and Q2, and Q3*a* to Q2n*b* of the multitail cell is equal to $\alpha_F \cdot I_0$, respectively.

Fourth Embodiment

Figure 9:
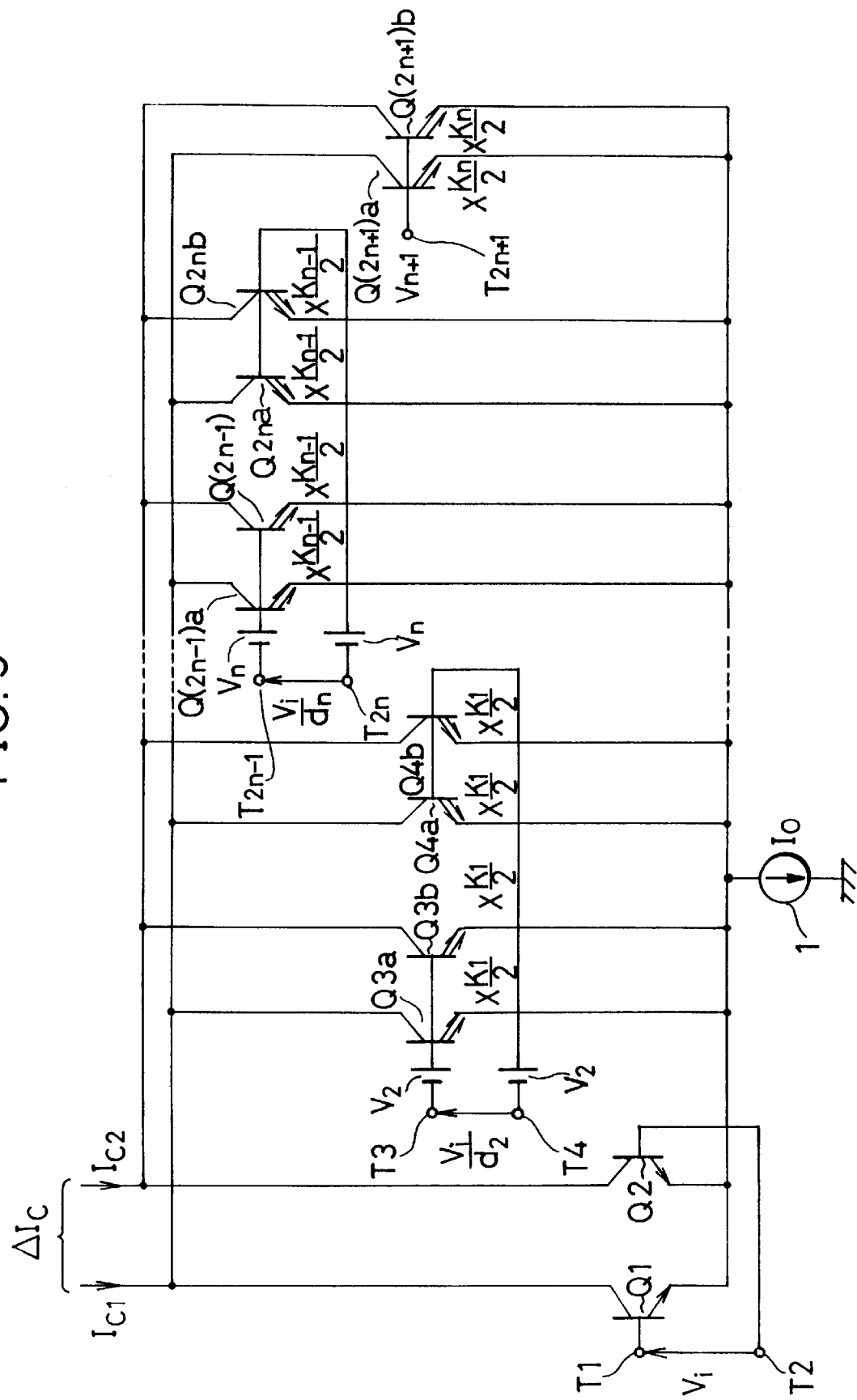
FIG. 9 is a circuit diagram of a bipolar OTA according to a fourth embodiment of the present invention, in which each transistor of each of the second to n-th differential pairs and the (2n+1)-th transistor is replaced with the combination of two emitter-coupled, base-coupled bipolar transistors.

A bipolar OTA according to a fourth embodiment of the present invention is shown in FIG. 9, which corresponds to an OTA obtained by replacing each transistor of the second to n-th differential pairs and the (2n+1)-th transistor in the OTA according to the second embodiment of FIG. 7 with the combination of two emitter-coupled, base-coupled bipolar transistors.

As shown in FIG. 9, for the second differential pair, npn emitter-coupled, base-coupled bipolar transistors Q3*a* and Q3*b* are used instead of the transistor Q3 in FIG. 7, and npn emitter-coupled, base-coupled bipolar transistors Q4*a* and Q4*b* are used instead of the transistor Q4 in FIG. 7. Similarly, for the nth differential pair, npn emitter-coupled, base-coupled bipolar transistors Q(2n−1)a and Q(2n−1)b are used instead of the transistor Q2n−1 in FIG. 7, and npn emitter-coupled, base-coupled bipolar transistors Q2na and Q2nb are used instead of the transistor Q2n in FIG. 7. Npn emitter-coupled, base-coupled bipolar transistors Q (2n+1) a and Q(2n+1)b are used instead of the transistor Q2n+1 in FIG. 7.

Collectors of the transistors Q3*a*, Q4*a*, . . . , Q(2n−1)a, Q2na, and Q(2n+1)a are connected to the collector of the transistor Q1 of the first differential pair, respectively. Collectors of the transistors Q3*b*, Q4*b*, . . . , Q(2n−1)b, Q2n*b*, and Q(2n+1)b are connected to the collector of the transistor Q2 of the first differential pair, respectively.

The transistors Q3*a* and Q3*b* of the second differential pair have a same emitter area ($K_1/2$) times as large as that of the transistors Q1 and Q2 of the first differential pair. The transistors Q4*a* and 04*b* of the second differential pair have a same emitter area ($K_1/2$) times as large as that of the transistors Q1 and Q2 of the first differential pair.

Similarly, the transistors Q(2n−1)a and Q(2n−1)b of the n-th differential pair have a same emitter area ($K_{n-1}/2$) times as large as that of the transistors Q1 and Q2 of the first differential pair. The transistors Q2na and Q2nb of the n-th differential pair have a same emitter area ($K_1/2$) times as large as that of the transistors Q1 and Q2 of the first differential pair.

The transistors Q(2n+1)a and Q(2n+1)b have a saie emitter area ($K_n/2$) times as large as that of the transistors Q1 and Q2 of the first differential pair.

The second to n-th input voltages $V_2$ to $V_n$ and the (n+1)-th input voltage $V_{n+1}$ are equal to those of the OTA according to the second embodiment of FIG. 7, respectively.

Similar to the third embodiment of FIG. 8, also in the circuit configuration of FIG. 9, the transistors Q3*a* and Q3*b* and Q4*a* and Q4*b* of the second differential pair may have a same emitter area $K_1$ times as large as that of the transistors Q1 and Q2 of the first differential pair. The transistors Q(2n−1)a and Q(2n−1)b and Q2na and Q2nb of the n-th differential pair may have a same emitter area $K_{n-1}$ times as large as that of the transistors Q1 and Q2 of the first differential pair. The transistors Q(2n+1)a and Q(2n−1)b may have a same emitter area $K_n$ times as large as that of the transistors Q1 and Q2 of the first differential pair.

However, in this case, it is necessary that the second to (n+1)-th input voltages $V_2$ to $V_{n+1}$ are decreased by proper values in such a way that the sum of the currents flowing through the transistors Q1 and Q2, and Q3a to Q(2n+1)b of the multitail cell is equal to $\alpha_F \cdot I_0$, respectively.

Fifth Embodiment

Figure 10:
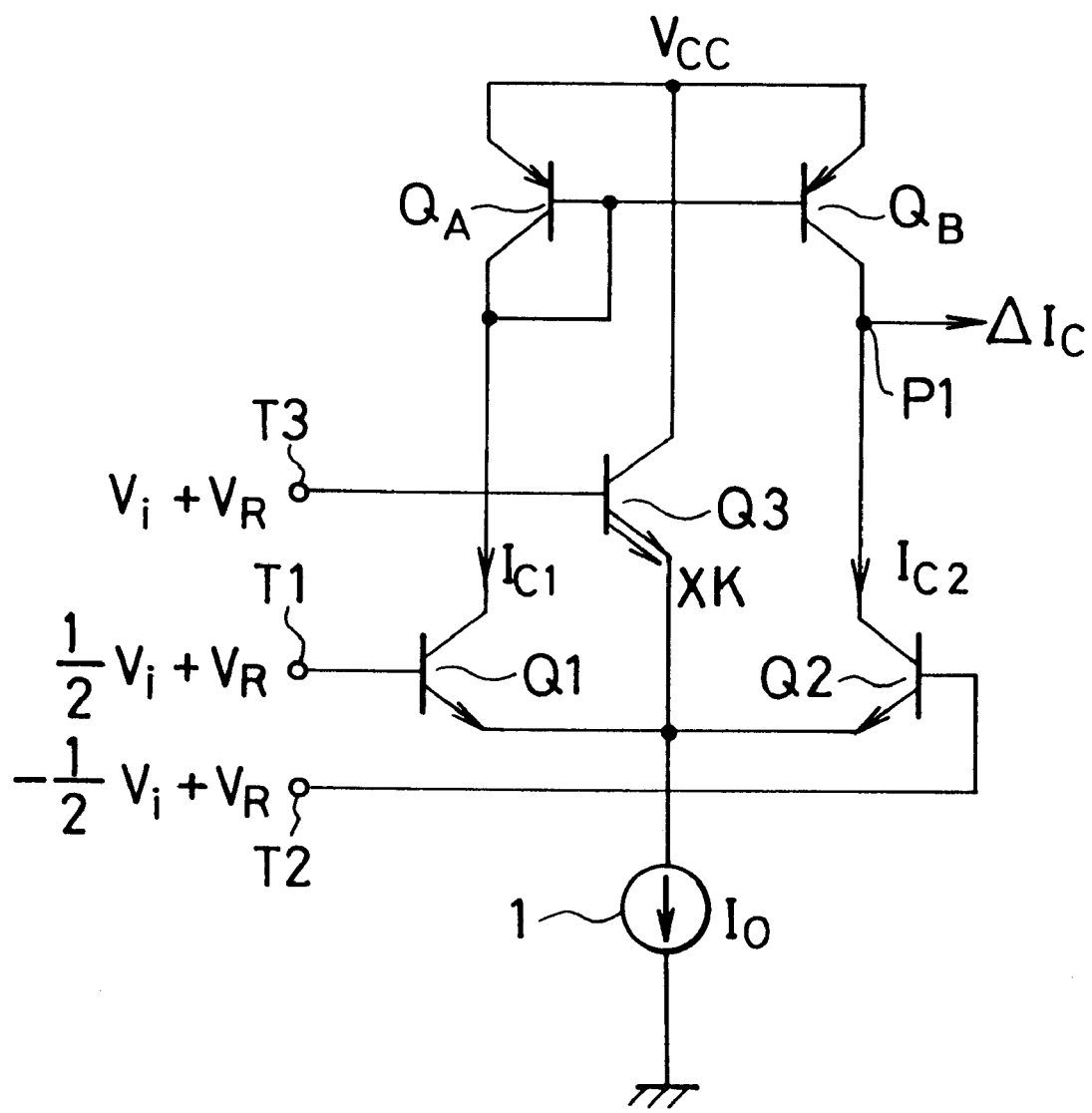
FIG. 10 is a circuit diagram of a bipolar OTA according to a fifth embodiment of the present invention, which corresponds to an OTA obtained by setting n=1 (i.e., 2n+1=3) in the OTA according to the second embodiment of FIG. 7.

A bipolar OTA according to a fifth embodiment of the present invention is shown in FIG. 10, which corresponds to an OTA obtained by setting n=1 (i.e., 2n+1=3) in the OTA according to the second embodiment of FIG. 7. This configuration is termed a "triple-tail cell".

As shown in FIG. 10, this OTA includes a balanced differential pair of npn bipolar transistors Q1 and Q2 whose emitters are coupled together, an npn bipolar transistor Q3 whose emitter is connected to the coupled emitters of the transistors Q1 and Q2, and a common constant current sink (current value: $I_0$) for driving the transistors Q1, Q2 and Q3. The emitters of the three transistors Q1, Q2 and Q3 are connected in common to one end of the current sink 1. The other end of the current sink 1 is grounded.

The emitter areas or sizes of the transistors Q1 and Q2 are equal to that of a unit bipolar transistor. In other words, the differential pair is a balanced one. The emitter area of the transistor Q3 is K times as large as that of a unit bipolar transistor, where K is a constant greater than unity (i.e., K>1).

The bases of the transistors Q1 and Q2 are connected to a pair of input terminals T1 and T2, respectively. The input terminal T1 is applied with a voltage of $[(½)V_i+V_R]$, and the input terminal T2 is applied with a voltage of $[(-½)V_i+V_R]$, where $V_R$ is a dc reference voltage. Therefore, a differential input voltage $V_i$ as an input signal to be amplified is applied across the pair of input terminals T1 and T2, which is the same as that of the second embodiment of FIG. 7.

A base of the transistor Q3 is connected to an input terminal T3. The base of the transistor Q3 is applied with a dc voltage of $(V_C+V_R)$ through the input terminal T3, where $V_C$ is a dc offset or tuning voltage. A collector of the transistor Q3 is applied with the power supply voltage $V_{cc}$.

A current mirror circuit composed of pnp base-coupled bipolar transistors $Q_A$ and $Q_B$ is provided between a power supply (supply voltage: $V_{cc}$, not shown) and collectors of the transistors Q1 and Q2. The current mirror circuit serves as an active load of the differential pair of the transistors Q1 and Q2.

A collector and a base of the transistor $Q_A$ are coupled together to be connected to the collector of the transistor Q1, and an emitter thereof is applied with the supply voltage $V_{cc}$. A collector of the transistor $Q_B$ is connected to the collector of the transistor Q2 and an emitter thereof is applied with the supply voltage $V_{cc}$.

A differential output current $\Delta I_C$ of the OTA as an amplified output signal is derived from the connection point P1 of the collector of the transistor $Q_B$ serving as an output end of the current mirror circuit and the collector of the transistor Q2. The differential output current $\Delta I_C$ is defined as $\Delta I_C = I_{C1} - I_{C2}$, where $I_{C1}$ and $I_{C2}$ are collector currents of the transistors Q1 and Q2, respectively.

From the above equation (23), the constant $A_2$ for the fifth embodiment is given by the following expression (26).

$$A_2 = \frac{K_2}{2}\exp\left(\frac{V_{C2}}{V_T}\right) = 2 \tag{26}$$

If the value of $K_2$ is set as 1 (i.e., $K_2=1$), $$V_{C2}=V_C=V_T \cdot \ln 4 (\approx 1.3863\ V_T) \approx 35.5\ \text{mV}.$$

Then, the differential output current $\Delta I_C$ of the OTA according to the fifth embodiment of FIG. 10 is given by setting n=1 in the equation (22b) as $$\Delta I_C = \frac{\alpha_F I_0 \sinh\left(\dfrac{V_i}{2V_T}\right)}{\cosh\left(\dfrac{V_i}{2V_T}\right)+2} \tag{27}$$

Figure 11:
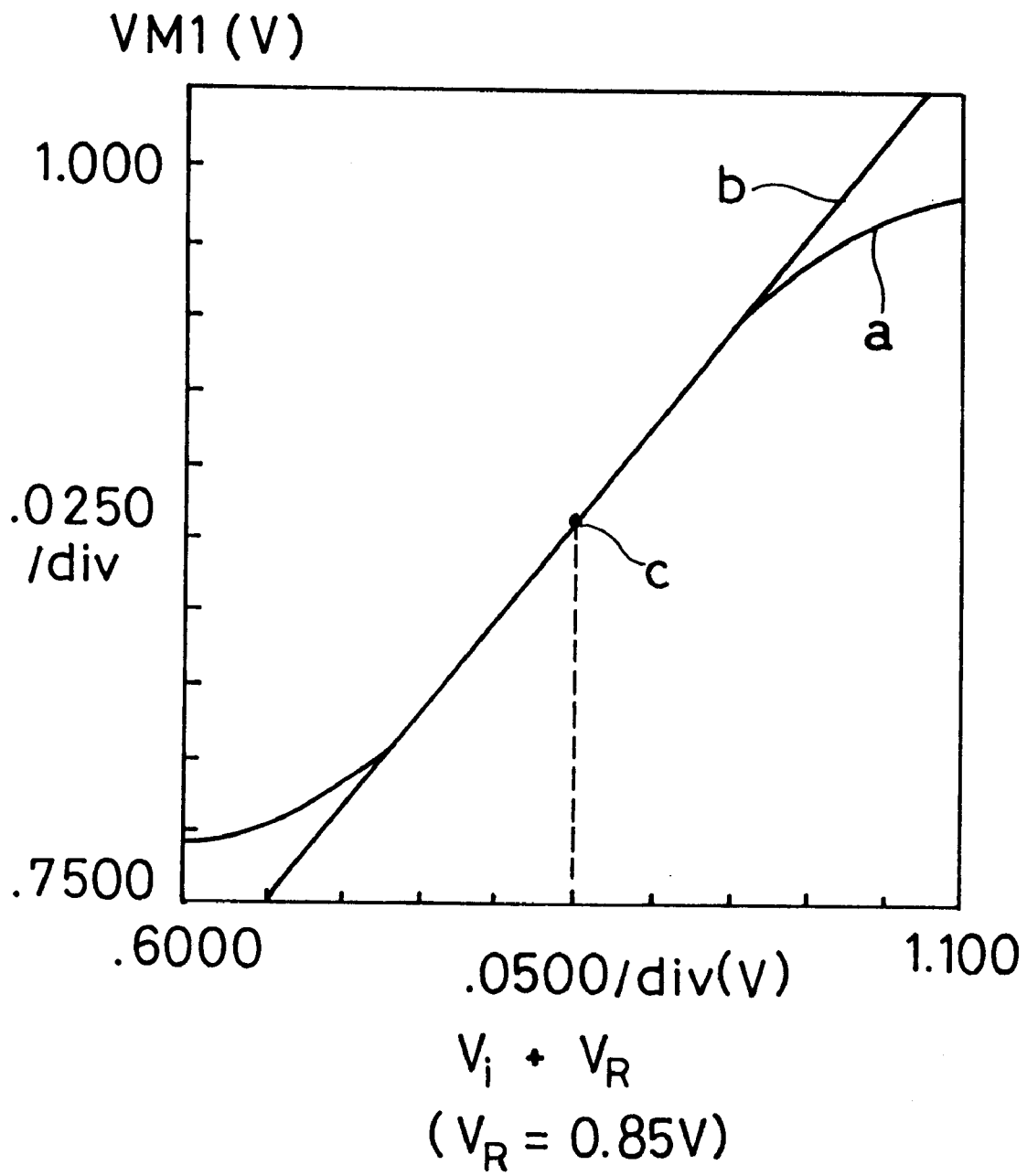
FIG. 11 is a graph showing a measured transfer characteristic of the bipolar OTA according to the fifth embodiment of FIG. 10.

A measured transfer characteristic for the triple-tail cell of FIG. 10 is shown in FIG. 11, in which the reference voltage $V_R$ was set as $V_R=0.85$ V and the supply voltage $V_{cc}$ was set as $V_{cc}=1$ V. The abscissa axis of FIG. 11 denotes the differential input voltage $V_i$, and the ordinate axis thereof denotes the differential output current $\Delta I_C$ measured in the voltage mode.

In FIG. 11, the curve a shows the measured transfer characteristic, and the straight line b shows a tangential line of the curve a at the point c where $V_i=0$ V.

By differentiating the both sides of the equation (27) by $V_i$, the transconductance of the triple-tail cell of FIG. 10 is given by the following equation (28).

$$\frac{d(\Delta I_C)}{dV_i} = \frac{\alpha_F I_0}{2V_T} \cdot \frac{2\cosh\left(\dfrac{V_i}{2V_T}\right)+1}{\left\{\cosh\left(\dfrac{V_i}{2V_T}\right)+2\right\}^2} \tag{28}$$

Figure 12:
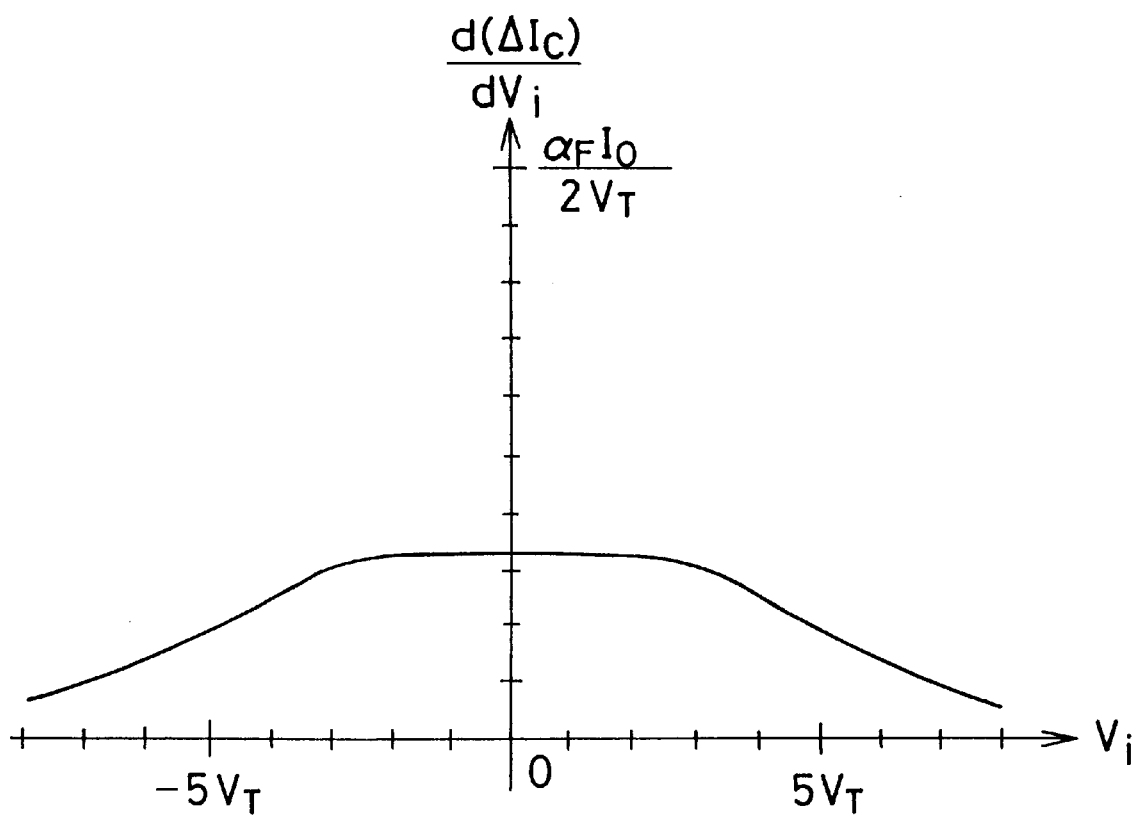
FIG. 12 is a graph showing the transconductance characteristic of the bipolar OTA according to the fifth embodiment of FIG. 10.

A measured transconductance characteristic for the triple-tail cell is shown in FIG. 12. The abscissa axis of FIG. 12 denotes the normalized differential input voltage $V_i$ by $V_T$.

It is seen from FIG. 12 that a realizable input voltage range providing the transconductance whose linearity is kept within a ±1% error is approximately 80 mV at peak-to-peak ($mV_{P-P}$)

Figure 1:
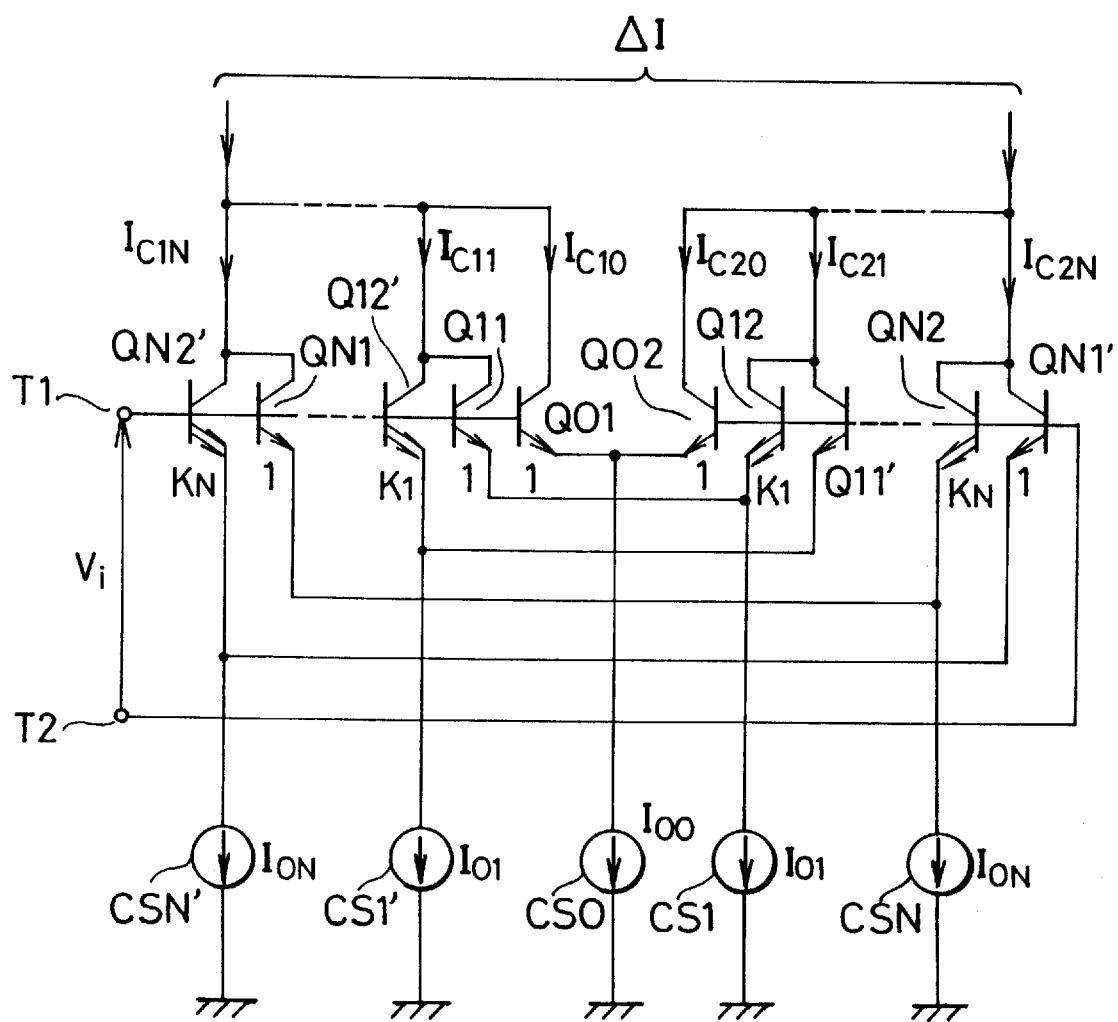
FIG. 1 is a circuit diagram of a conventional bipolar OTA, in which (2N +1) differential transistor pairs are used.
Figure 2:
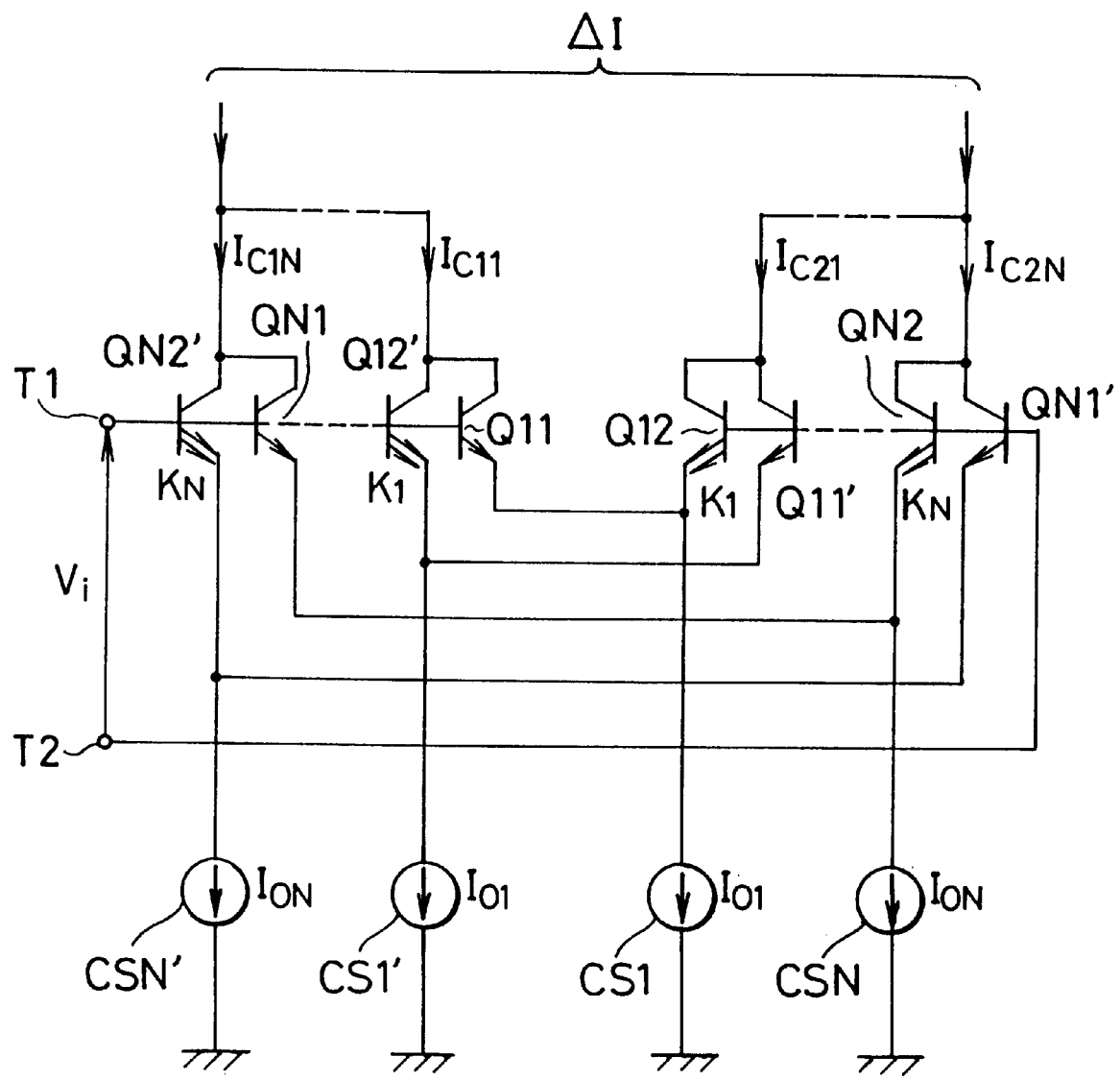
FIG. 2 is a circuit diagram of a conventional bipolar OTA, in which 2N differential transistor pairs are used.
Figure 3:
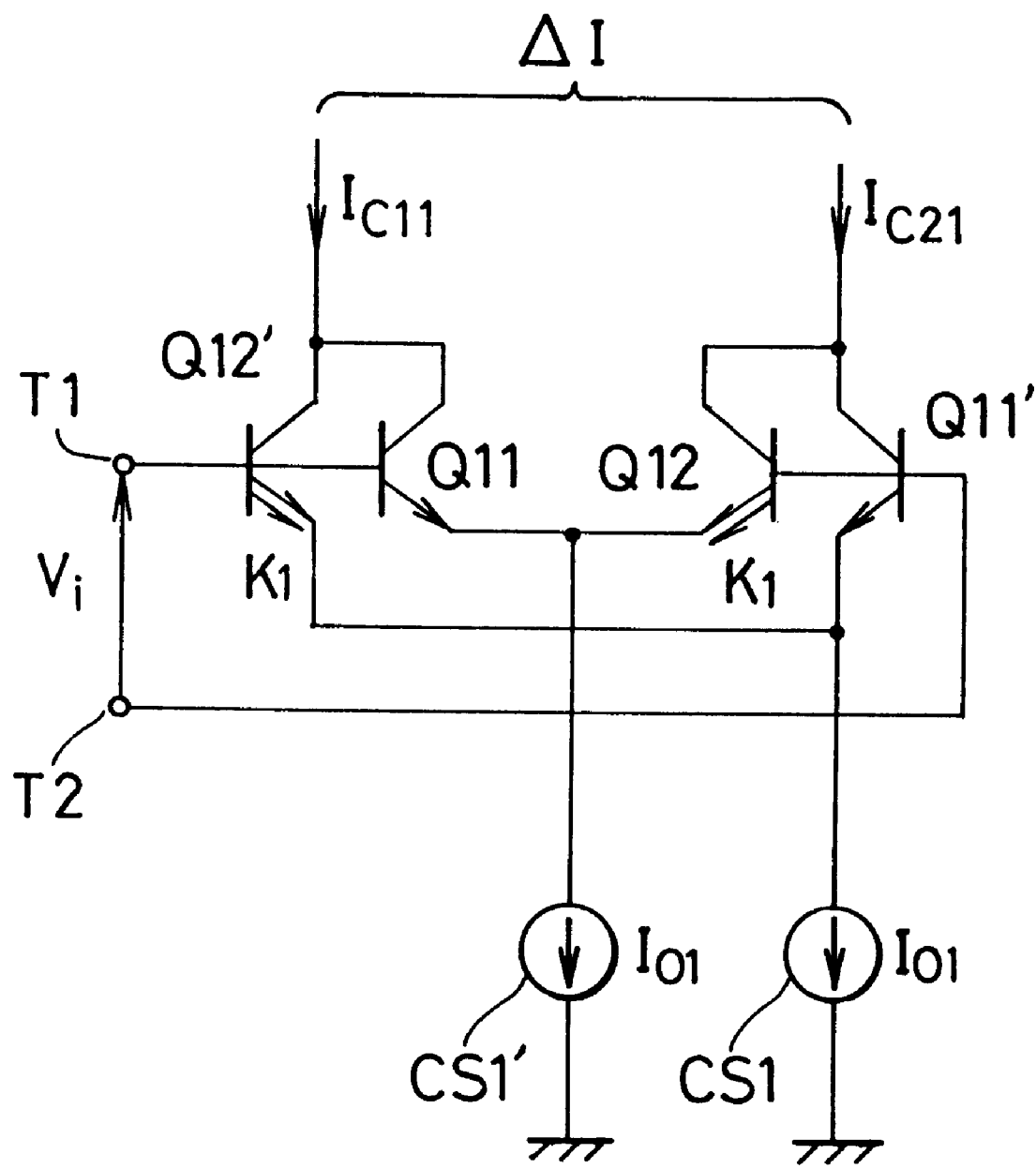
FIG. 3 is a circuit diagram of a conventional bipolar OTA, in which two differential transistor pairs are used.
Figure 4:
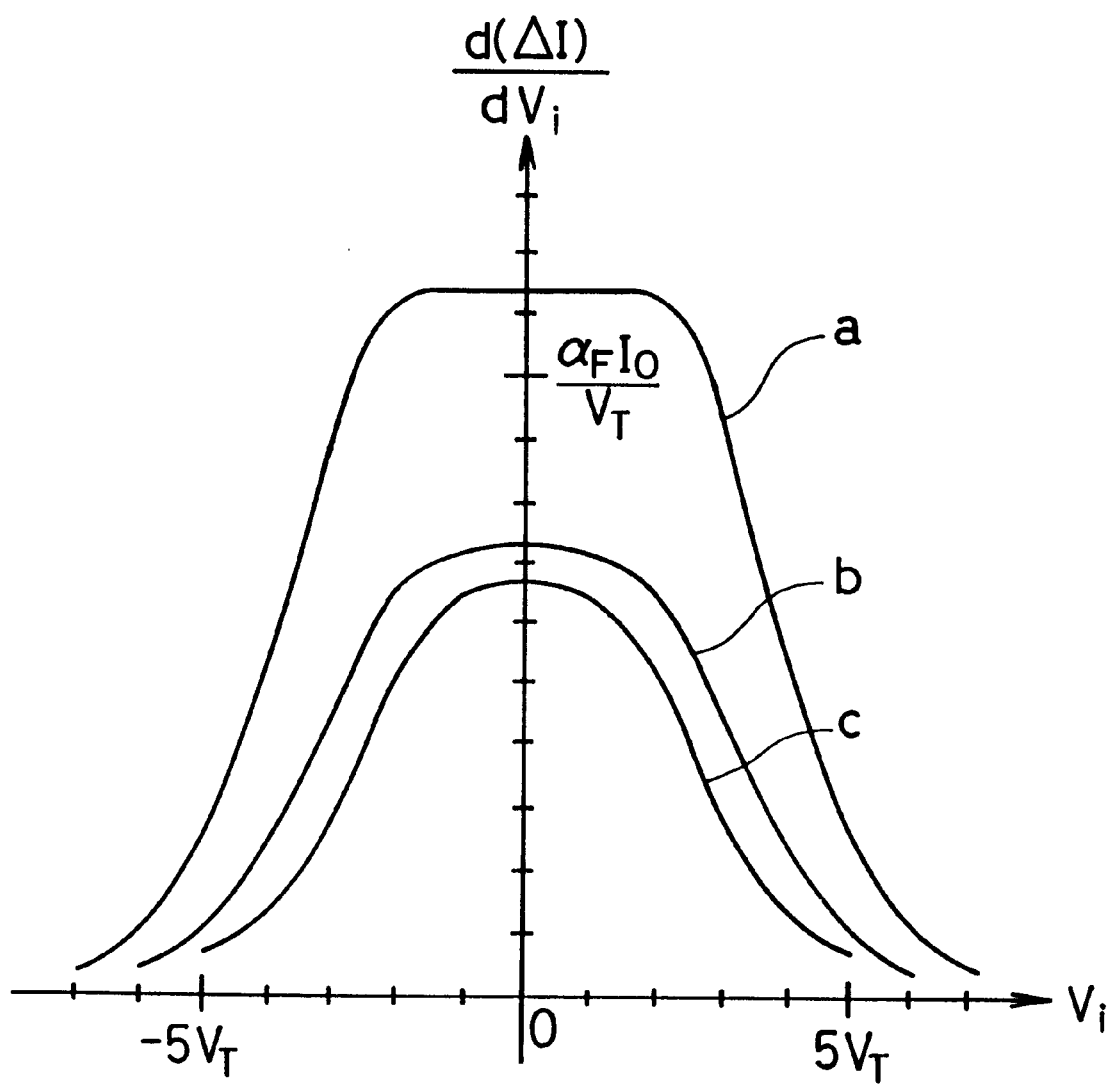
FIG. 4 is a graph showing the transconductance characteristics of the conventional OTAs.
Figure 5:
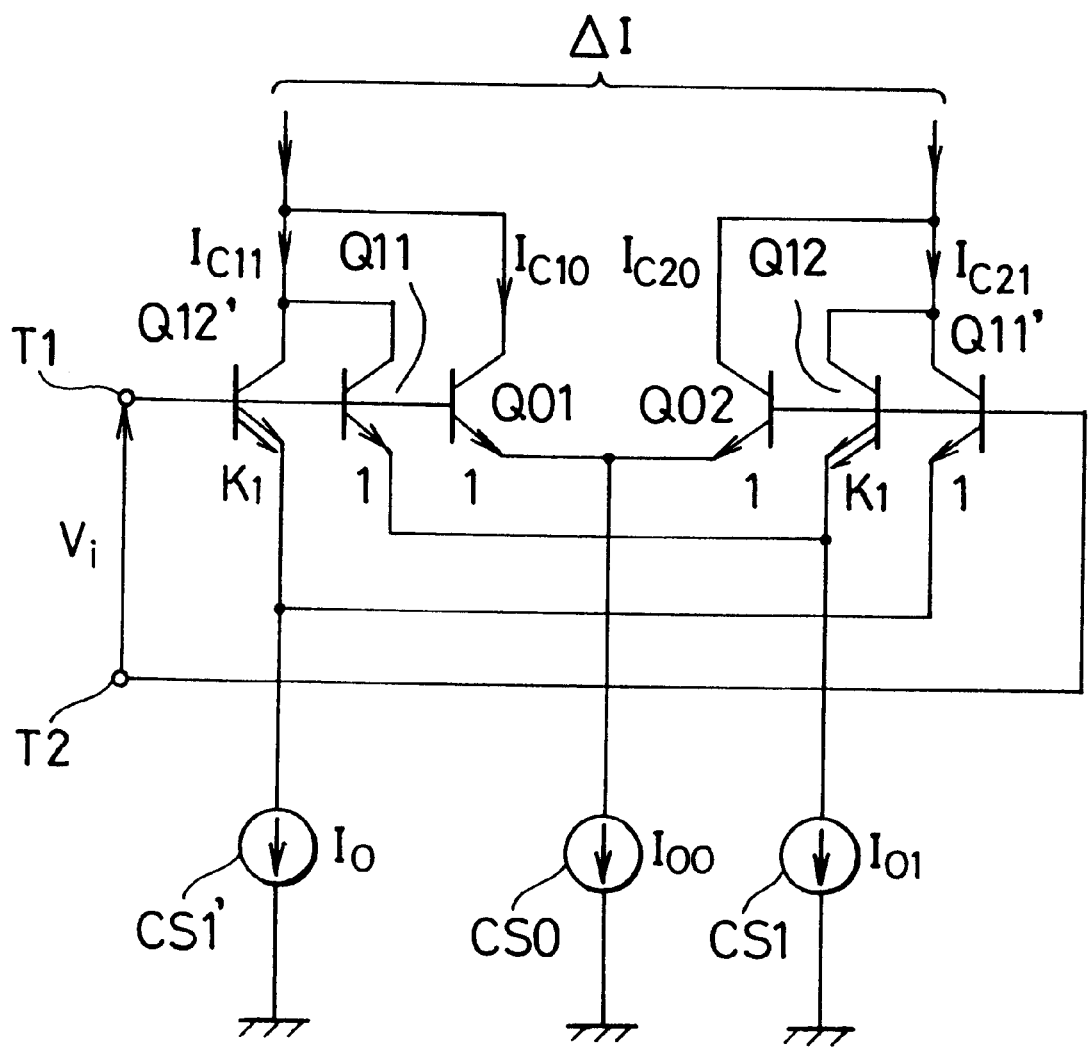
FIG. 5 is a circuit diagram of a conventional bipolar OTA, in which three differential transistor pairs are used.

Comparing the equations (27) and (12), the differential output current $\Delta I_C$ of the OTA according to the fifth embodiment has the same functional form as that of the conventional OTA shown in FIG. 3. This means that the same transconductance linearity as that of the conventional OTA of FIG. 3 can be obtained in the OTA according to the fifth embodiment also.

Specifically, the differential output current $\Delta I_C$ of the triple-tail cell according to the fifth embodiment of FIG. 10 is equal to a half of that of the conventional OTA of FIG. 3, because the coefficient of the numerator of the equation (27) is equal to a half of that of the equation (12). However, the input voltage range of the triple-tail cell providing the linear transconductance characteristic is equal to twice as wide as that of the conventional multi-tanh doublet of FIG. 3, because the variable $(V_i/2V_T)$ for the sinh and cosh functions in the equation (27) is equal to a half of the variable $(V_i/V_T)$ in the equation (12),

Sixth Embodiment

Figure 13:
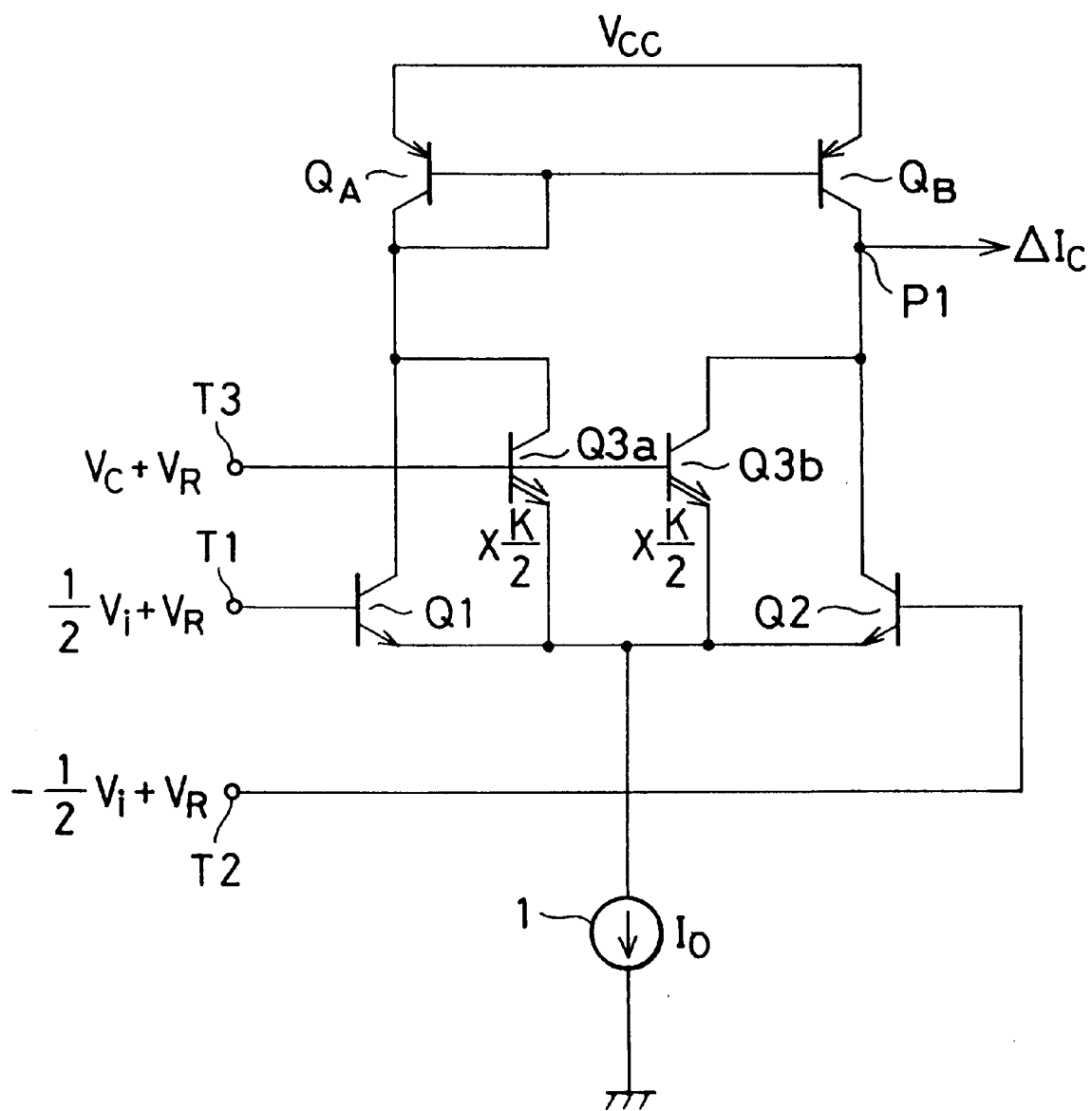
FIG. 13 is a circuit diagram of a bipolar OTA according to a sixth embodiment of the present invention, which corresponds to an OTA obtained by setting n=2 (i.e., 2n=4) in the OTA according to the first embodiment of FIG. 6.

A bipolar OTA according to a sixth embodiment of the present invention is shown in FIG. 13, which corresponds to an OTA obtained by replacing the transistor Q3 in the OTA according to the fifth embodiment of FIG. 10 with the combination of two emitter-coupled, base-coupled bipolar transistors Q3a and Q3b.

Collectors of the transistors Q3a and Q3b are connected to the collectors of the transistors Q1 and Q2, respectively.

The current flowing through the transistor Q3 serving as the bypass component of the constant driving current $I_0$ in FIG. 10 is divided into two parts, and the divided parts of the current flowing through the transistor Q3 is distributed to the collectors of the transistors Q1 and Q2, respectively. In this case, the dc components of the collector currents $I_{c1}$ and $I_{c2}$ of the transistors Q1 and Q2 are kept at a constant value of $\alpha_F(I_0/2)$ As a result, an additional advantage that the dc operating point is fixed occurs in the OTA according to the sixth embodiment of FIG. 13, in addition to the same advantages as those in the fifth embodiment of FIG. 10.

The transistors Q3a and Q3b have a same emitter area (K/2) times as large as that of the transistors Q1 and Q2 of the first differential pair. The input voltage $(V_C+V_R)$ serving as the dc offset voltage is equal to that of the OTA according to the fifth embodiment of FIG. 10.

Additionally, in the circuit configuration of FIG. 13, the transistors Q3a and Q3b may have a same emitter area K times as large as that of the transistors Q1 and Q2 of the first differential pair. However, in this case, it is necessary that the second input voltage $(V_C+V_R)$ is decreased by a proper value in such a way that the sum of the currents flowing through the transistors Q1 and Q2, and Q3a to Q3b of the multitail cell is equal to $\alpha_F \cdot I_0$, respectively.

In this embodiment, it is preferred that the value to be decreased of the input voltage $(V_C+V_R)$ is $V_T \cdot \ln 2$, which is equal to approximately 18 mV at room temperature.

Seventh Embodiment

Figure 14:
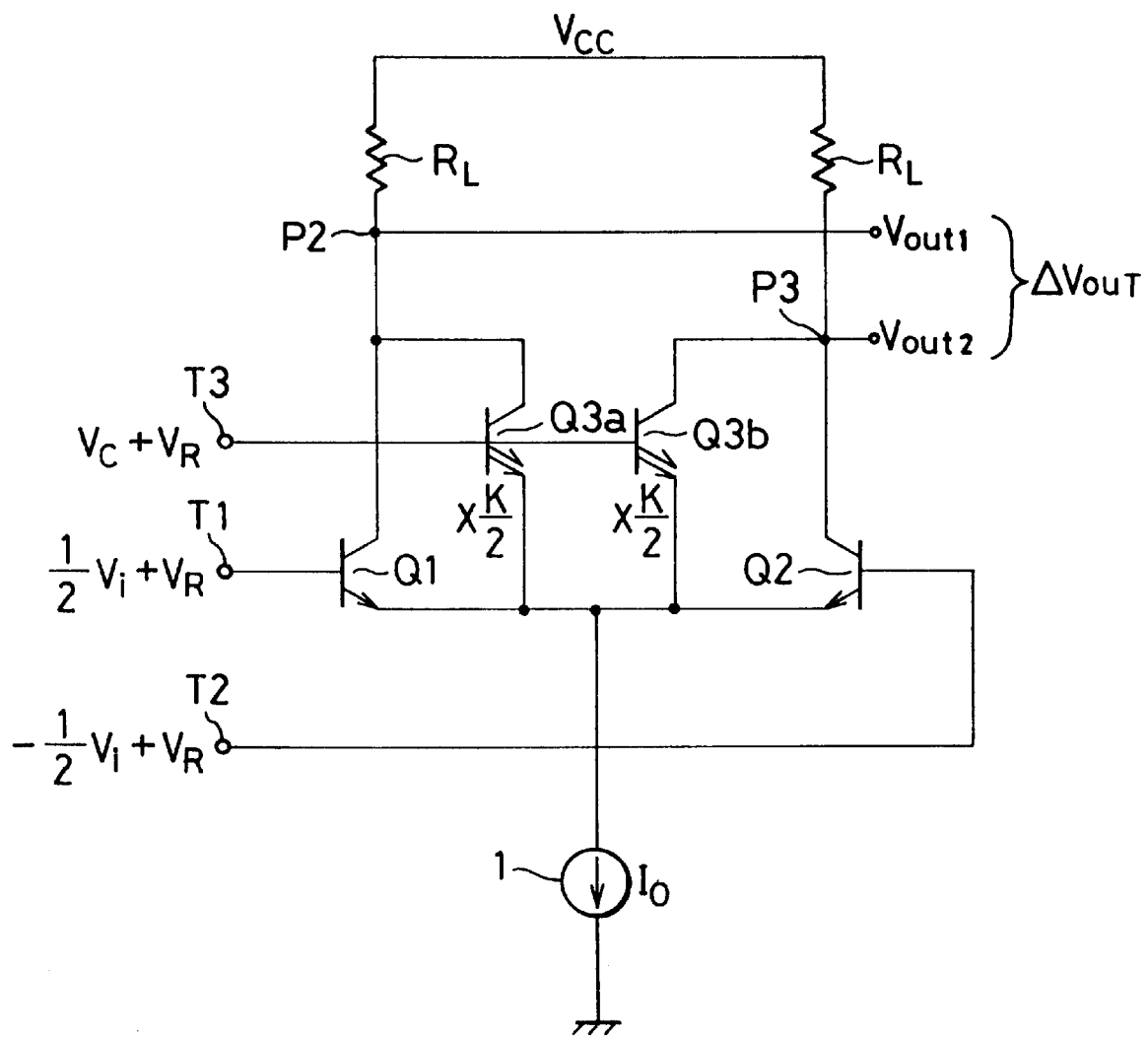
FIG. 14 is a circuit diagram of a bipolar OTA according to a seventh embodiment of the present invention, which is a variation of the OTA according to the sixth embodiment of FIG. 13.

A bipolar OTA according to a seventh embodiment of the present invention is shown in FIG. 14, which is a variation of the OTA according to the sixth embodiment of FIG. 13.

Instead of the current mirror formed by the transistors $Q_A$ and $Q_B$ in the OTA of FIG. 13, which serves as an active load, first and second load resistors with a same resistance value $R_L$ are provided. The remaining configuration is the same as that of the sixth embodiment of FIG. 13. The first load resistor is connected between the coupled collectors of the transistors Q1 and Q3a and the power supply. The second load resistor is connected between the coupled collectors of the transistors Q2 and Q3b and the power supply.

An output voltage $V_{out1}$ is derived from the connection point P2 of the first resistor and the collector of the transistor Q1. Another output voltage $V_{out2}$ is derived from the connection point P3 of the second resistor and the collector of the transistor Q2. The differential output voltage $\Delta V_{OUT}$, which is defined as $\Delta V_{OUT} = V_{out1} - V_{out2}$, is derived from the connection points P2 and P3.

Thus, the resistors can be used as the loads for the OTA according to the sixth embodiment of FIG. 13.

Eight Embodiment

Figure 15:
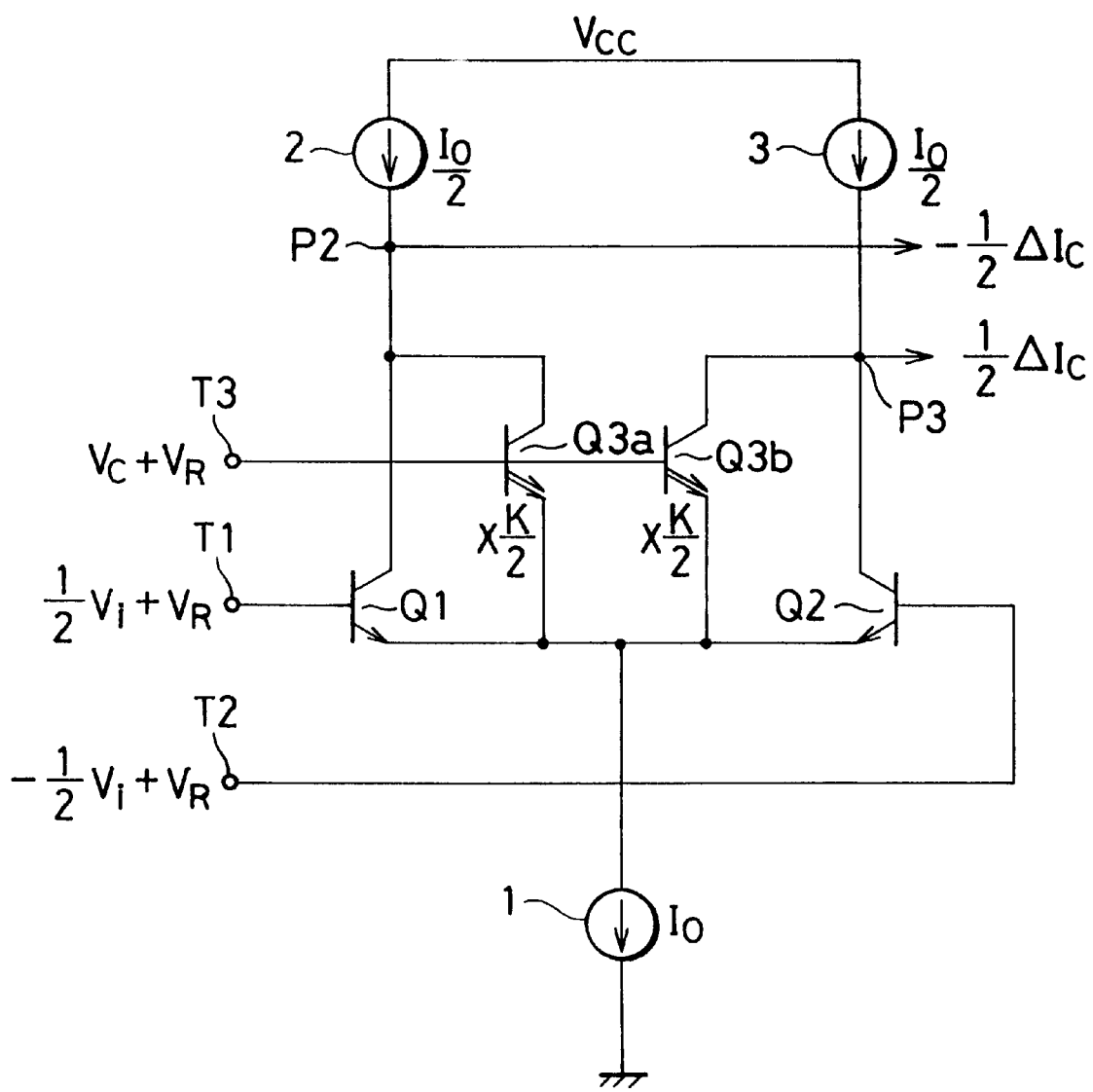
FIG. 15 is a circuit diagram of a bipolar OTA according to an eighth embodiment of the present invention, which is another variation of the OTA according to the sixth embodiment of FIG. 13.

A bipolar OTA according to an eighth embodiment of the present invention is shown in FIG. 15, which is another variation of the OTA according to the sixth embodiment of FIG. 13.

Instead of the current mirror formed by the transistors $Q_A$ and $Q_B$ in the OTA of FIG. 13, which serves as an active load, first and second constant current sources 2 and 3 with a same current value $(I_0/2)$ are provided. The remaining configuration is the same as that of the sixth embodiment of FIG. 13. The first current source 2 is connected between the coupled collectors of the transistors Q1 and Q3a and the power supply. The second current source is connected between the coupled collectors of the transistors Q2 and Q3b and the power supply. An output current $(-½)\Delta I_C$ is derived from the connection point P2 of the first current source 2 and the collectors of the transistors Q1 and Q3a. Another output current $(½)\Delta I_C$ is derived from the connection point P3 of the second current source 3 and the coupled collectors of the transistors Q2 and Q3b. The differential output current $\Delta I_C$ is derived from the connection points P2 and P3.

Thus, the constant current sources can be used as the loads for the OTA according to the sixth embodiment of FIG. 13.

Ninth Embodiment

Figure 16:
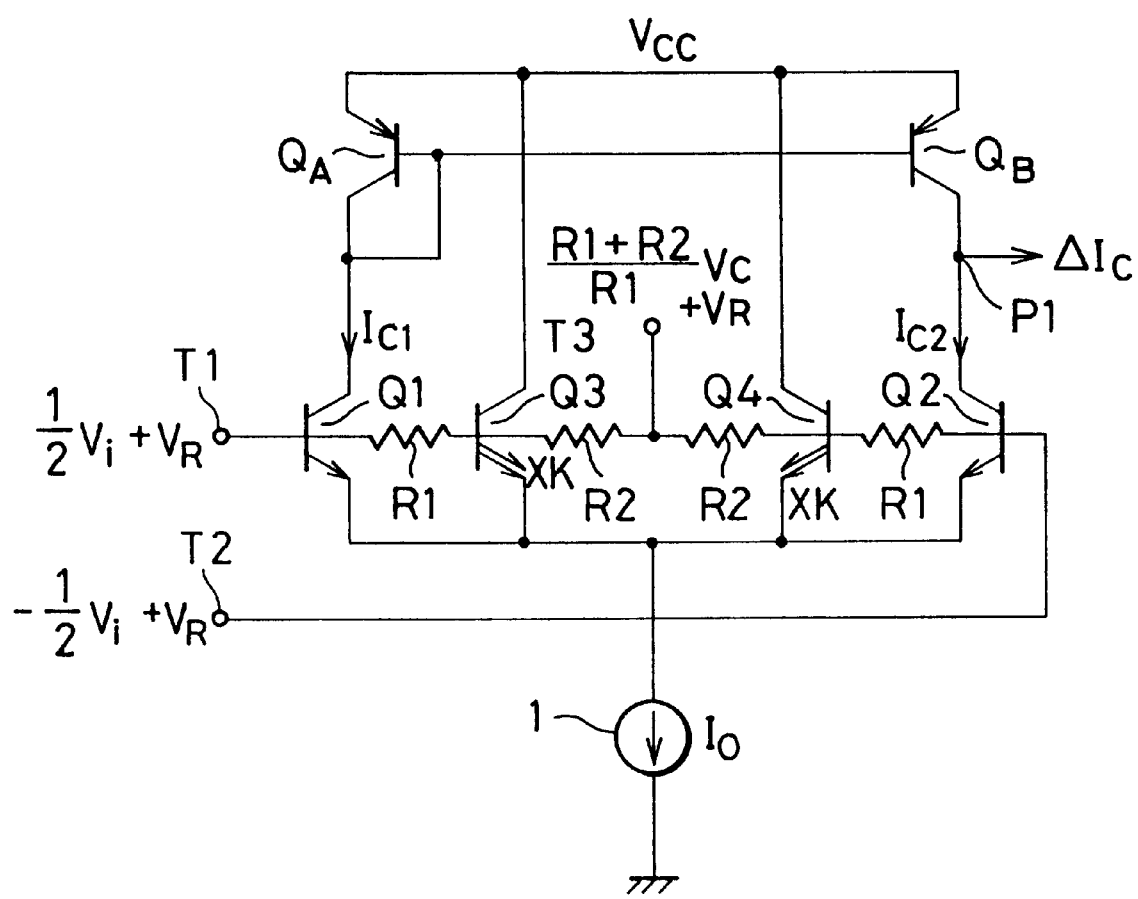
FIG. 16 is a circuit diagram of a bipolar OTA according to a ninth embodiment of the present invention, which is still another variation of the OTA according to the sixth embodiment of FIG. 13.

A bipolar OTA according to a ninth embodiment of the present invention is shown in FIG. 16, which corresponds to an OTA obtained by setting n=2 (i.e., 2n=4) in the OTA according to the first embodiment of FIG. 6. This configuration is termed a "quadritail cell".

As shown in FIG. 16, this OTA includes a first balanced differential pair of npn bipolar transistors Q1 and Q2 whose emitters are coupled together, a second balanced differential pair of npn bipolar transistors Q3 and Q4 whose emitters are coupled together to be connected to the coupled emitters of the transistors Q1 and Q2, and a common constant current sink 1 (current value: $I_0$) for driving the transistors Q1, Q2, Q3 and Q4. The emitters of the four transistors Q1, Q2, Q3 and Q4 are connected in common to one end of the current sink 1. The other end of the current sink 1 is grounded.

The emitter areas of the transistors Q1 and Q2 are equal to that of a unit bipolar transistor. The emitter areas of the transistors Q3 and Q4 are K times as large as that of a unit bipolar transistor, where K is a constant greater than unity (i.e., K>1).

The bases of the transistors Q1 and Q2 are connected to a pair or input terminals T1 and T2, respectively. The base of the transistor Q1 is applied with a voltage of $[(½)V_i+V_R]$ through the input terminal T1, and the base of the transistor Q2 is applied with a voltage of $[(-½)V_i+V_R]$ through the input terminal T2, with respect to the ground, where VR is a dc reference voltage Therefore, a first differential input voltage $V_i$ as an input signal to be amplified is applied across the input terminals T1 and T2.

The base of the transistor Q3 is connected to the base of the transistor Q1 and the input terminal T1 through a first resistor with a resistance R1. The base of the transistor Q4 is connected to the base of the transistor Q2 and the input terminal T2 through a second resistor with the same resistance R1 as that of the first resistor. Therefore, a second differential input voltage $(V_i/d_2)$, which is generated by attenuating the voltage $V_i$ by the first and second resistors, is applied across the bases of the transistors Q3 and Q4, Where $d_2$ is an attenuation parameter.

The base of the transistor Q3 is further connected to an input terminal T3 through a third resistor with a-resistance R2. The base of the transistor Q4 is further connected to the input terminal T3 through a fourth resistor with the same resistance R2 as that of the third resistor.

The input terminal T3 is applied with a dc constant voltage of $[\{(R1+R2)/R1\}V_C+V_R]$ with respect to the ground, where $V_C$ is a dc tuning or offset voltage. Collectors of the transistors Q3 and Q4 are applied with a power supply voltage $V_{cc}$.

A current mirror circuit composed of pnp base-coupled bipolar transistors $Q_A$ and $Q_B$ is provided between a power supply (supply voltage: $V_{cc}$, not shown) and collectors of the transistors Q1 and Q2. The current mirror circuit serves as an active load of the first differential pair of the transistors Q1 and Q2.

A collector and a base of the transistor QA are coupled together to be connected to a collector of the transistor Q1, and an emitter thereof is applied with the supply voltage $V_{cc}$. A collector of the transistor $Q_B$ is connected to a collector of the transistor Q2 and an emitter thereof is applied with the supply voltage $V_{cc}$.

A differential output current $\Delta I_C$ of the OTA of FIG. 16 as an amplified output signal is derived from the connection point P1 of the collectors of the transistors Q2 and $Q_B$. The differential output current $\Delta I_C$ is defined as $\Delta I_C = I_{C1} - I_{C2}$, where $I_{C1}$ and $I_{C2}$ are collector currents of the transistors Q1 and Q2, respectively.

In this ninth embodiment of FIG. 16, the resistance values R1 and R2 are set in such a way that the relationship of $d_2 = \sqrt{5}$ ($\approx 2.236$) is established. In other words, the attenuated input voltage $(V_i/d_2)$ is $(1/\sqrt{5}) V_i$. Therefore, the resistance values R1 and R2 have a relationship of $$R2 = R1/(\sqrt{5}-1) \ (\approx 0.809\ R1).$$

When $A_1 = 1, A_2 = 5, d_1 = 1, d_2 = \sqrt{5}$, $$V_{C2} = V_C = V_T \ln(5/K)$$

$$\approx V_T(1.6094 - \ln K)$$

$$\approx 40.2\ mV - \ln K,$$

is established.

Then, the differential output current $\Delta I_C$ of the OTA according to the ninth embodiment of FIG. 16 is given by setting n=2 in the equation (22a) as $$\Delta I_C = \frac{\alpha_F I_0 \sinh\left(\frac{V_i}{2V_T}\right)}{\cosh\left(\frac{V_i}{2V_T}\right) + 5\cosh\left(\frac{V_i}{2\sqrt{5}V_T}\right)} \quad (29)$$

It is seen from the equation (29) that the denominator is expressed by a sinh function and the numerator is expressed by a sum of two cosh functions, and that each of their coefficients is an integer. This means that the same transconductance linearity as that of the conventional OTAs can be realized.

Figure 17:
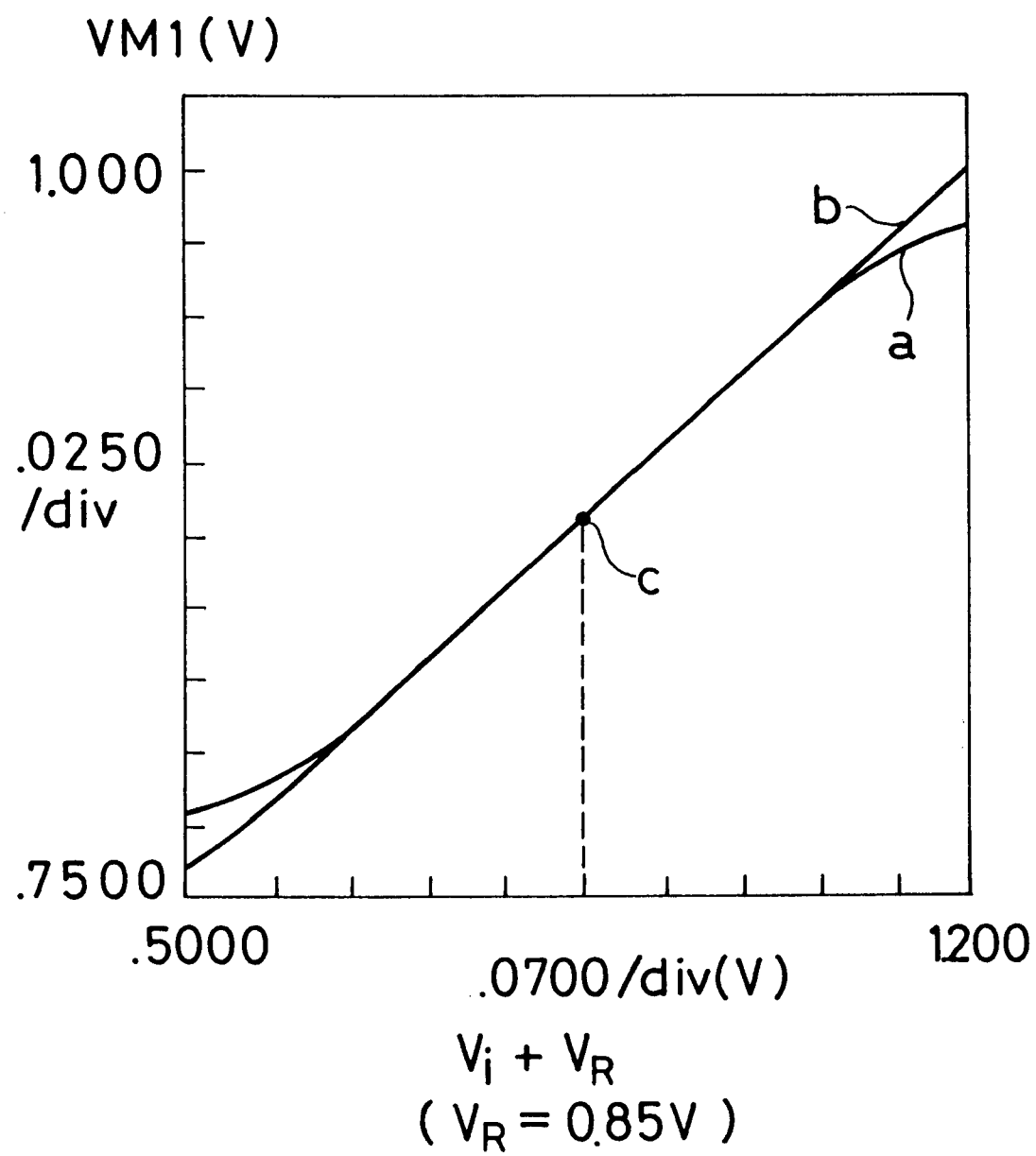
FIG. 17 is a graph showing a measured transfer characteristic of the bipolar OTA according to the ninth embodiment of FIG. 16.

A measured transfer characteristic for the quadritail cell of FIG. 16 is shown in FIG. 17, in which the reference and power supply voltages $V_R$ and $V_{cc}$ were set as $V_R = 0.5$ V and $V_{cc} = 1$ V, respectively. The abscissa axis of FIG. 17 indicates the differential input voltage $V_i$, and the ordinate axis thereof indicates the differential output current $\Delta I_C$ measured in the voltage mode.

In FIG. 17, the curve a shows the measured transfer characteristic and the straight line b shows a tangential line of the curve a at the point where $V_i = 0$ V.

By differentiating the both sides of the equation (29) by $V_i$, the transconductance of the quadritail cell is given by the following equation (30) or (31).

$$\frac{d(\Delta I_C)}{dV_i} = \frac{\alpha_F I_0}{2V_T} \frac{5\cosh\left(\frac{V_i}{2V_T}\right)\cosh\left(\frac{V_i}{2\sqrt{5}V_T}\right) + \sqrt{5}\sinh\left(\frac{V_i}{2V_T}\right)\sinh\left(\frac{V_i}{2\sqrt{5}V_T}\right) + 1}{\left\{\cosh\left(\frac{V_i}{2V_T}\right) + 5\cosh\left(\frac{V_i}{2\sqrt{5}V_T}\right)\right\}^2} \quad (30)$$

$$\frac{d(\Delta I_C)}{dV_i} = \frac{\alpha_F I_0}{2V_T} \frac{1 + 5\left(\frac{\sqrt{5}-1}{2\sqrt{5}}\right)\cosh\left\{\left(\frac{\sqrt{5}-1}{2\sqrt{5}V_T}\right)V_1\right\} + 5\left(\frac{\sqrt{5}-1}{2\sqrt{5}}\right)\cosh\left\{\left(\frac{\sqrt{5}-1}{2\sqrt{5}V_T}\right)V_T\right\}}{\left\{\cosh\left(\frac{V_i}{2V_T}\right) + 5\cosh\left(\frac{V_i}{2\sqrt{5}V_T}\right)\right\}^2} \quad (31)$$

Figure 18:
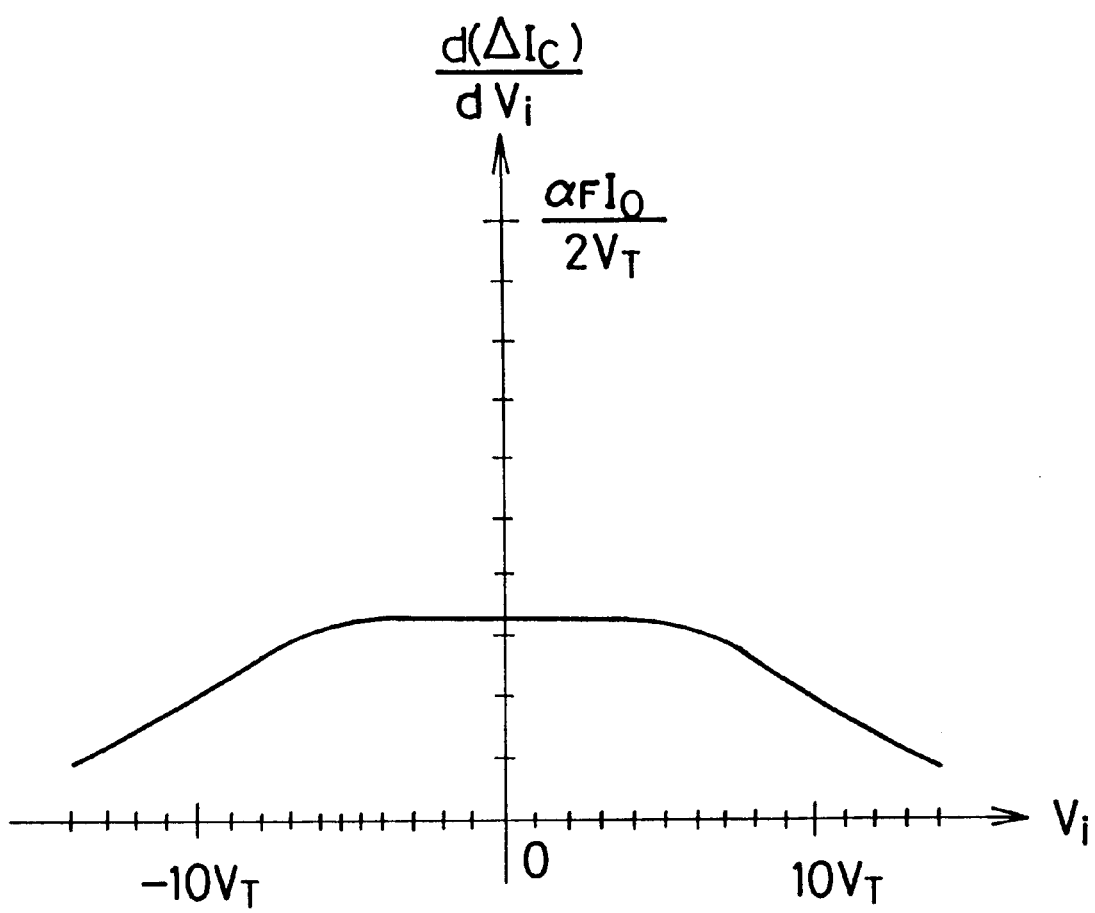
FIG. 18 is a graph showing the transconductance characteristic of the bipolar OTA according to the ninth embodiment of FIG. 16.

A measured transconductance characteristic for the quadritail cell of FIG. 16 is shown in FIG. 18. The abscissa axis of FIG. 18 indicates the normalized differential input voltage $V_i$ by $V_T$.

It is seen from FIG. 18 that a realizable input voltage range providing the transconductance whose linearity is kept within a ±1% error is approximately 200 $mV_{P-P}$.

Comparing the equations (29) and (12), it is seen that the denominator of the differential output current AT of the OTA according to the ninth embodiment of FIG. 16 is expressed by a stu of hyperbolic cosine functions and that each of the coefficients of these hyperbolic cosine functions is expressed by a natural number. Therefore, similar to the OTA of the fifth embodiment of FIG. 10, the transconductance linearity can be obtained in the OTA according to the ninth embodiment of FIG. 16 also.

Tenth Embodiment

Figure 19:
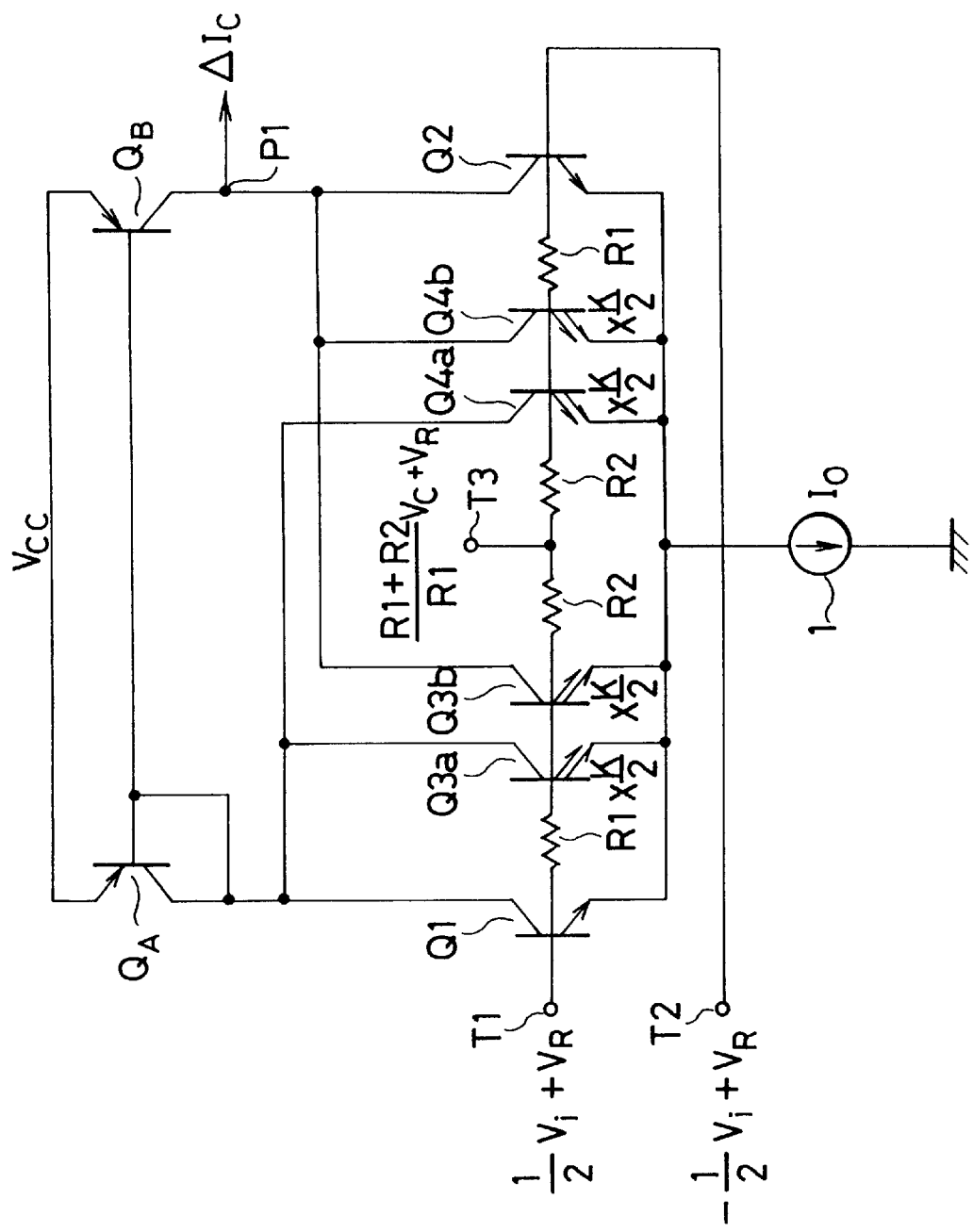
FIG. 19 is a circuit diagram of a bipolar OTA according to a tenth embodiment of the present invention, in which each transistor of the second differential pair is replaced with the combination of two emitter-coupled, base-coupled bipolar transistors in the OTA according to the ninth embodiment of FIG. 16.

A bipolar OTA according to a tenth embodiment of the present invention is shown in FIG. 19, which corresponds to an OTA obtained by replacing the transistors Q3 and Q4 in the OTA according to the ninth embodiment of FIG. 16 with the combination of two emitter-coupled, base-coupled bipolar transistors Q3*a* and Q3*b*, and the combination of two emitter-coupled, base-coupled bipolar transistors Q4*a* and Q4*b*, respectively. Collectors of the transistors Q3*a* and Q3*b* are connected to the collectors of the transistors Q1 and Q2, respectively.

Collectors of the transistors Q4*a* and Q4*b* also are connected to the collectors of the transistors Q1 and Q2, respectively.

The current flowing through the transistor Q3 serving as the bypass component of the constant driving current $I_0$ in FIG. 16 is divided into two parts, and the divided parts of the current flowing through the transistor Q3 is distributed to the collectors of the transistors Q1 and Q2, respectively. In this case, the dc components of the collector currents $I_{c1}$ and $I_{c2}$ of the transistors Q1 and Q2 are kept at a constant value of $\alpha_F(I_0/2)$.

As a result, an additional advantage that the dc operating point is fixed occurs in the OTA according to the tenth embodiment of FIG. 16, in addition to the same advantages as those in the ninth embodiment of FIG. 16.

The transistors Q3a and Q3b have a same emitter area (K/2) times as large as that of the transistors Q1 and Q2 of the first differential pair. The transistors Q4a and Q4b have a same emitter area (K/2) times as large as that of the transistors Q1 and Q2 of the first differential pair. The input voltage [(R1+R2)/R1)$V_C$+$V_R$] serving as the dc offset voltage is equal to that of OTA according to the ninth embodiment of FIG. 16, Additionally, in the circuit configuration of FIG. 16, the transistors Q3a and Q3b and Q4a and Q4b may have a same emitter area K times as large as that of the transistors Q1 and Q2 of the first differential pair. However, in this case, it is necessary that the attenuated input voltage [(R1+R2)/R1) $V_C$+$V_R$] is decreased by a proper value in such a way that the sum of the currents flowing through the transistors Q1 and Q2, Q3a and Q3b, and Q4a and Q4b of the multitail cell is equal to $I_0$, respectively, In this embodiment, it is preferred that the value to be decreased of the input voltage [(R1+R2)/R1)$V_C$+$V_R$] is $V_T$·ln 2, which is equal to approximately 18 mV at room temperature.

Eleventh Embodiment

Figure 20:
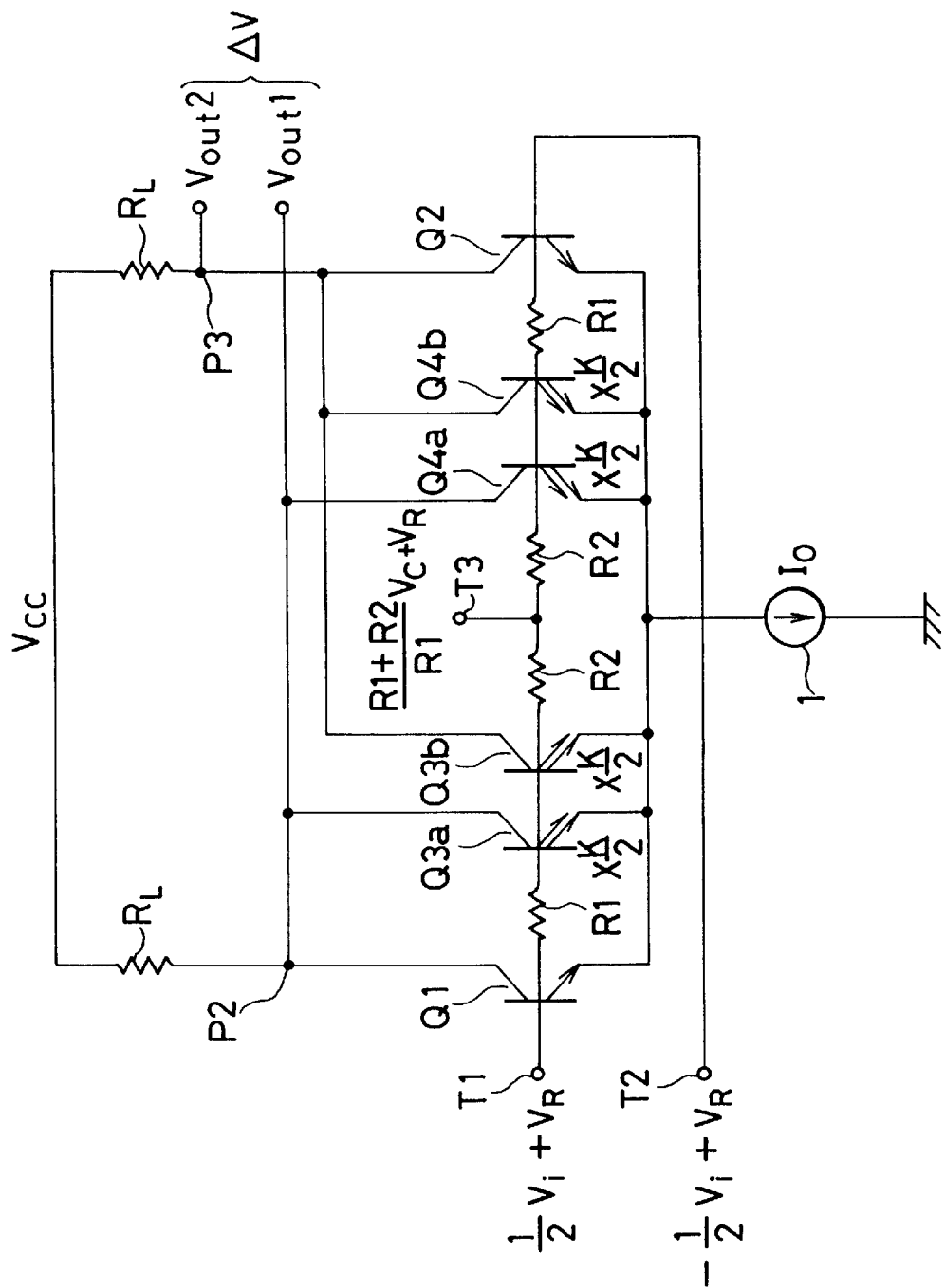
FIG. 20 is a circuit diagram of a bipolar OTA according to an eleventh embodiment of the present invention, which is a variation of the OTA according to the tenth embodiment of FIG. 19.

A bipolar OTA according to an eleventh embodiment of the present invention is shown in FIG. 20, which is a variation of the OTA according to the tenth embodiment of FIG. 19.

Instead of the current mirror formed by the transistors $Q_A$ and $Q_B$ in the OTA of FIG. 19, which serves as an active load, first and second load resistors with a same resistance value $R_L$ are provided. The remaining configuration is the same as that of the tenth embodiment of FIG. 19. The first load resistor is connected between the coupled collectors of the transistors Q1, Q3a and Q3b, and the power supply. The second load resistor is connected between the coupled collectors of the transistors Q2, Q4b and Q4b and the power supply.

An output voltage $V_{out1}$ is derived from the connection point P2 of the first resistor and the coupled collectors of the transistors Q1 and Q3a and Q4a. Another output voltage $V_{out2}$ is derived from the connection point P3 of the second resistor and the coupled collectors of the transistors Q2 and Q3b and Q4b. The differential output voltage $\Delta V_{OUT}$, which is defined as $\Delta V_{OUT}=V_{out1}-V_{out2}$, is derived from the connection points P2 and P3.

Thus, the resistors can be used as the loads for the OTA according to the tenth embodiment of FIG. 19.

Twelfth Embodiment

Figure 21:
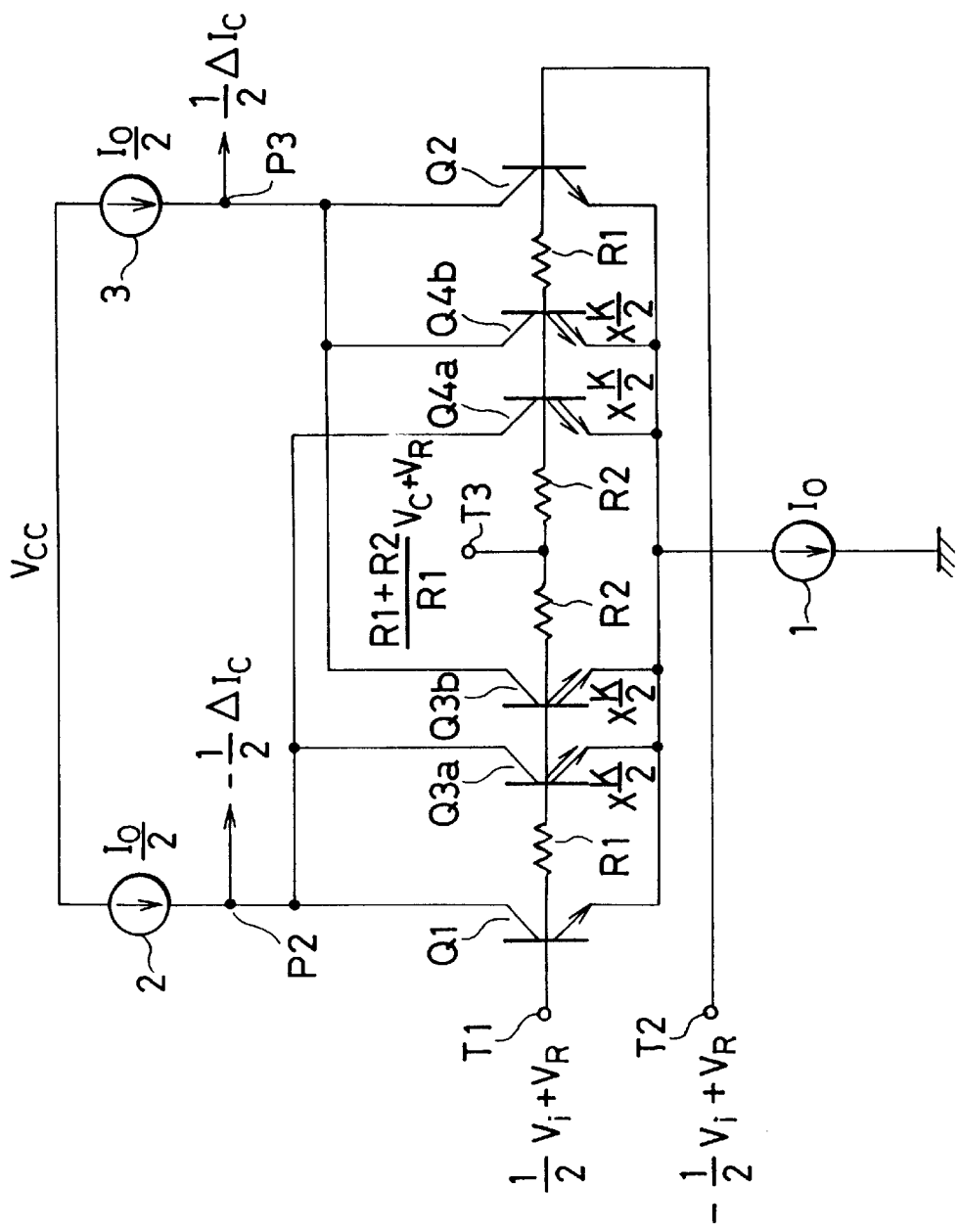
FIG. 21 is a circuit diagram of a bipolar OTA according to a twelfth embodiment of the present invention, which is another variation of the OTA according to the tenth embodiment of FIG. 19.

A bipolar OTA according to a twelfth embodiment of the present invention is shown in FIG. 21, which is another variation of the OTA according to the tenth embodiment of FIG. 19.

Instead of the current mirror formed by the transistors $Q_A$ and $Q_E$ in the OTA of FIG. 19, which serves as an active load, first and second constant current sources 2 and 3 with a same current value ($I_0$/2) are provided. The remaining configuration is the same as that of the tenth embodiment of FIG. 19. The first current source 2 is connected between the coupled collectors of the transistors Q1, Q3a and Q4a, and the power supply. The second current source 3 is connected between the coupled collectors of the transistors Q2, Q3b, and Q4b, and the power supply.

An output current $(-\frac{1}{2})\Delta I_C$ is derived from the connection point P2 of the first current source 2 and the coupled collectors of the transistors Q1, Q3a, and Q4a. Another output current $(\frac{1}{2})\Delta I_C$ is derived from the connection point P3 of the second current source 3 and the coupled collectors of the transistors Q2, Q3b, and Q4b. The differential output current $\Delta I_C$ is derived from the connection points P2 and P3.

Thus, the constant current sources can be used as the loads for the OTA according to the tenth embodiment of FIG. 19.

Thirteenth Embodiment

Figure 22:
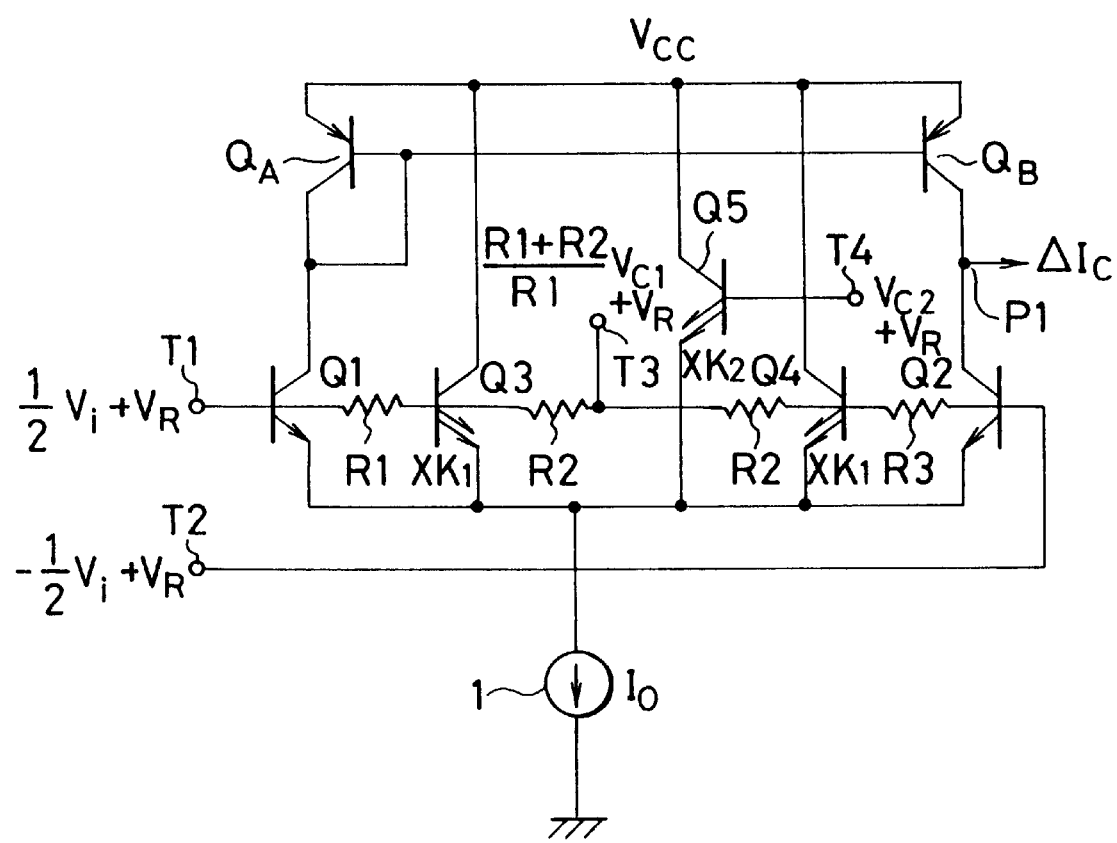
FIG. 22 is a circuit diagram of a bipolar OaA according to a thirteenth embodiment of the present invention, which corresponds to an OTA obtained by setting n=2 (i.e., 2n+1=5) in the OTA according to the second embodiment of FIG. 7.

A bipolar OTA according to a thirteenth embodiment of the present invention is shown in FIG. 22, which corresponds to an OTA obtained by setting n=2 (i.e., 2n+1=5) in the OTA according to the second embodiment of FIG. 7. This configuration is termed a "quint-tail cell".

As shown in FIG. 22, this OTA includes a first balanced differential pair of npn bipolar transistors Q1 and Q2 whose emitters are coupled together, a second balanced differential pair of npn bipolar transistors Q3 and Q4 whose emitters are coupled together, an npn bipolar transistor Q5 whose emitter is connected to the coupled emitters of the transistors Q1, Q2, Q3 and Q4, and a common constant current sink (current value: $I_0$) for driving the transistors Q1, Q2, Q3, Q4 and Q5. The emitters of the fifth transistors Q1, Q2, Q3, Q4 and Q5 are connected in common to one end of the current sink 1. The other end of the current sink 1 is grounded.

The emitter areas of the transistors Q1 and Q2 are equal to that of a unit bipolar transistor. The emitter areas of the transistors Q3 and Q4 are $K_1$ times as large as that of a unit bipolar transistor, where $K_1$ is a constant greater than unity (i.e., $K_1$>1). The emitter area of the transistor Q5 is are $K_2$ times as large as that of a unit bipolar transistor, where $K_2$ is a constant greater than unity (i.e., $K_2$>1).

The bases of the transistors Q1 and Q2 are connected to a pair of input terminals T1 and T2, respectively. The base of the transistor Q1 is applied with a voltage of [($\frac{1}{2}$)$V_i$+$V_R$] through the input terminal T1, and the base of the transistor Q2 is applied with a voltage of [($-\frac{1}{2}$)$V_i$+$V_R$] through the input terminal T2, with respect to the ground, where $V_R$ is a dc reference voltage. Therefore, a first differential input voltage $V_i$ as an input signal to be amplified is applied across the bases of the transistors Q1 and Q2, which is the same as that of the second embodiment of FIG. 7.

The base of the transistor Q3 is connected to the base of the transistor Q1 and the input terminal T1 through a first resistor with a resistance R1. The base of the transistor Q4 is connected to the base of the transistor Q2 and the input terminal T2 through a second resistor with the same resistance R1 as that of the first resistor. Therefore, a second differential input voltage ($V_i/d_2$) which is obtained by attenuation using the first and second resistors, is applied across the bases of the transistors Q3 and Q4.

The base of the transistor Q3 is further connected to an input terminal T3 through a third resistor with a resistance R2. The base of the transistor Q4 is further connected to the input terminal T3 through a fourth resistor with the same resistance R2 as that of the third resistor.

The input terminal T3 is applied with a dc voltage of [{(R1+R2)/R1}$V_{C1}$+$V_R$], with respect to the ground, where $V_{C1}$ is a dc tuning or offset voltage. Collectors of the transistors Q3 and Q4 are applied with a power supply voltage $V_{cc}$.

A base of the transistor Q5 is connected to an input terminal T4. The input terminal T4 is applied with a dc voltage of ($V_{C2}$+$V_R$), where $V_{C2}$ is a dc tuning or offset voltage. A collector of the transistor Q5 is applied with the power supply voltage $V_{cc}$.

A current mirror circuit composed of pnp base-coupled bipolar transistors $Q_A$ and $Q_B$ is provided between a power supply (power supply voltage: $V_{cc}$, not shown) and collectors of the transistors Q1 and Q2. The current mirror circuit serves as an active load of the first differential pair of the transistors Q1 and Q2.

A collector and a base of the transistor $Q_A$ are coupled together to be connected to a collector of the transistor Q1, and an emitter thereof is applied with the supply voltage $V_{cc}$. A collector of the transistor $Q_B$ is connected to a collector of the transistor Q2 and an emitter thereof is applied with the supply voltage $V_{cc}$.

A differential output current $\Delta I_C$ of the OTA as an amplified output signal is derived from the connection point P1 of the coupled collectors of the transistors $Q_B$ and Q2. The differential output current $\Delta I_C$ is defined as $\Delta I_C$-$I_{C1}$-$I_{C2}$, where $I_{C1}$ and $I_{C2}$ are collector currents of the transistors Q1 and Q2, respectively.

Then, the differential output current $\Delta I_C$ of the OTA according to the thirteenth embodiment of FIG. 22 is given by setting n=2 in the equation (22b).

Here, the resistance values R1 and R2 are set in such a way that the attenuation parameter $d_2$ satisfies the relationship of $(1/d_2)$-0.3448, (i.e., R2=0.5263 R1). The dc tuning voltages $V_{C1}$ and $V_{C2}$ are set as $V_{C1}$=1.68 $V_T$ ($\approx$43 mV)-$V_T$·ln ($K_1$), and $V_{C2}$=2.12 $V_T$ ($\approx$54 mV)-$V_T$·ln ($K_2$), respectively.

In this case, a realizable input voltage range providing the transconductance whose linearity is kept within a ±1% error is approximately 500 m$V_{P-P}$.

Fourteenth Embodiment

Figure 23:
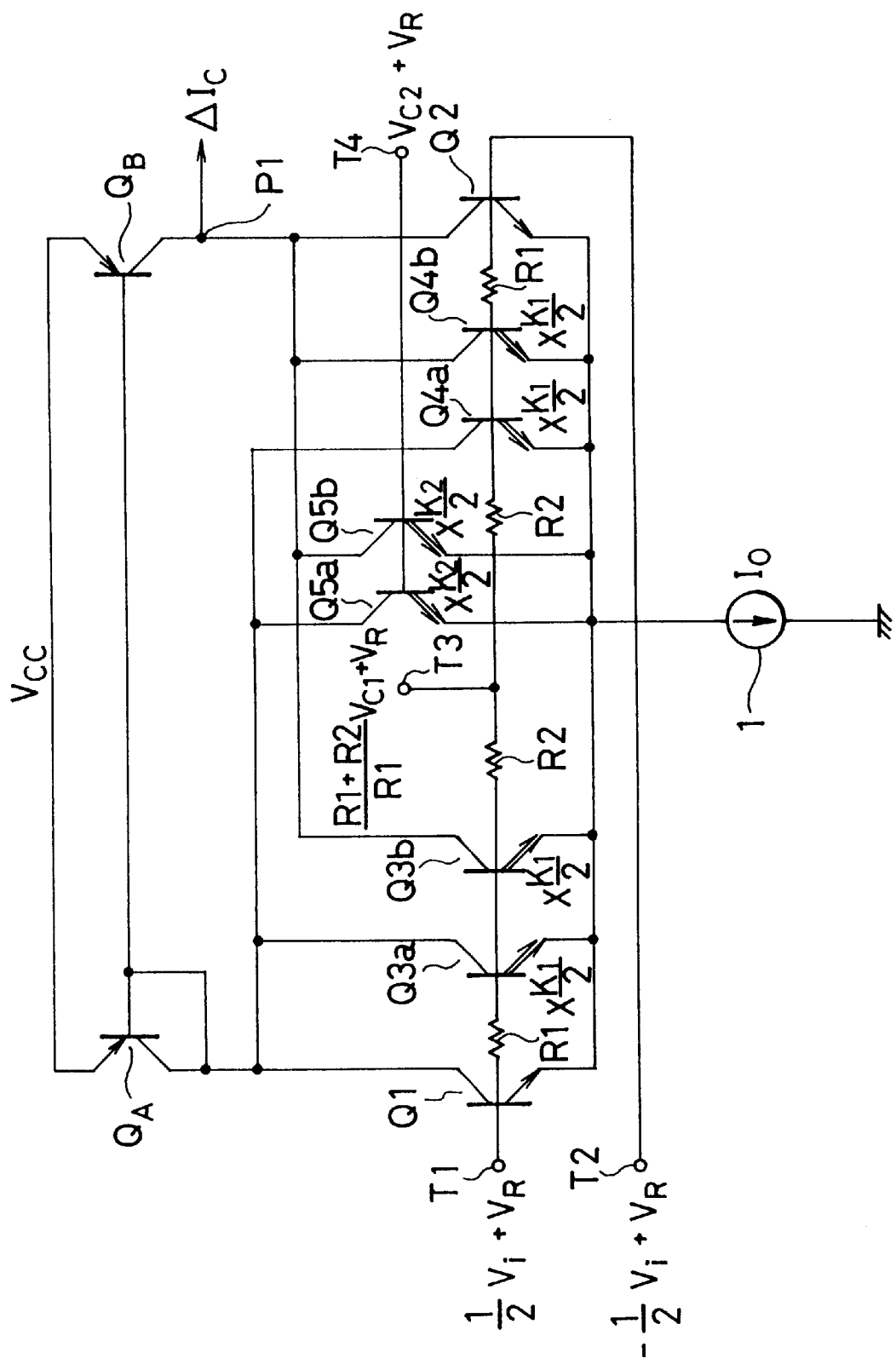
FIG. 23 is a circuit diagram of a bipolar OTA according to a fourteenth embodiment of the present invention, in which each of the third and fourth transistors of the second differential pair and fifth transistor is replaced with the combination of two emitter-coupled, base-coupled bipolar transistors in the OTA according to the thirteenth embodiment of FIG. 22.

A bipolar OTA according to a fourteenth embodiment of the present invention is shown in FIG. 23, which corresponds to an OTA obtained by replacing the transistors Q3, Q4,and Q5 in the OTA according to the thirteenth embodiment of FIG. 22 with the combination of two emitter-coupled, base-coupled bipolar transistors Q3a and Q3b, the combination of two emitter-coupled, base-coupled bipolar transistors Q4a and Q4b, and the combination of two emitter-coupled, base-coupled bipolar transistors Q5a and Q5b, respectively.

Collectors of the transistors Q3a and Q3b are connected to the collectors of the transistors Q1 and Q2, respectively. Collectors of the transistors Q4a and Q4b are connected to the collectors of the transistors Q1 and Q2, respectively. Collectors of the transistors Q5a and Q5b also are connected to the collectors of the transistors Q1 and Q2, respectively.

The current flowing through each of the transistors Q3, Q4, and Q5 in FIG. 22 is divided into two parts, and the divided parts of the current is distributed to the collectors of the transistors Q1 and Q2, respectively. In this case, the dc components of the collector currents $I_{C1}$ and $I_{C2}$ of the transistors Q1 and Q2 are kept at a constant value of $\alpha_F(I_0/2)$.

As a result, an additional advantage that the dc operating point is fixed occurs in the OTA according to the fourteenth embodiment of FIG. 23, in addition to the same advantages as those in the thirteenth embodiment of FIG. 22.

The transistors Q3a and Q3b and Q4a and Q1b have a same emitter area ($K_1/2$) times as large as that of the transistors Q1 and Q2 of the first differential pair. The transistors Q5a and Q5b have a same emitter area ($K_2/2$) times as large as that of the transistors Q1 and Q2 of the first differential pair The input voltage [(R1+R2)/R1]$V_C$+$V_R$] serving as the dc offset voltage is equal to that of the OTA according to the thirteenth embodiment of FIG. 22.

Additionally, in the circuit configuration of FIG. 23, the transistors Q3a and Q3b, Q4a and Q4b, and Q5a and Q5b may have a same emitter area K times as large as that of the transistors Q1 and Q2 of the first differential pair. However, in this case, it is necessary that the attenuated input voltage [(R1+R2)/R1)$V_C$ +$V_R$] is decreased by a proper value in such a way that the sum of the currents flowing through the transistors Q1 and Q2, Q3a and Q3b, Q4a and Q4b, and Q5a and Q5b of the multitail cell is equal to $I_0$, respectively.

In this embodiment, it is preferred that the value to be decreased of the input voltage [(R1+R2)/R1)$V_C$+$V_R$] is $V_T$·ln 2, which is equal to approximately 18 mV at room temperature.

Fifteenth Embodiment

Figure 24:
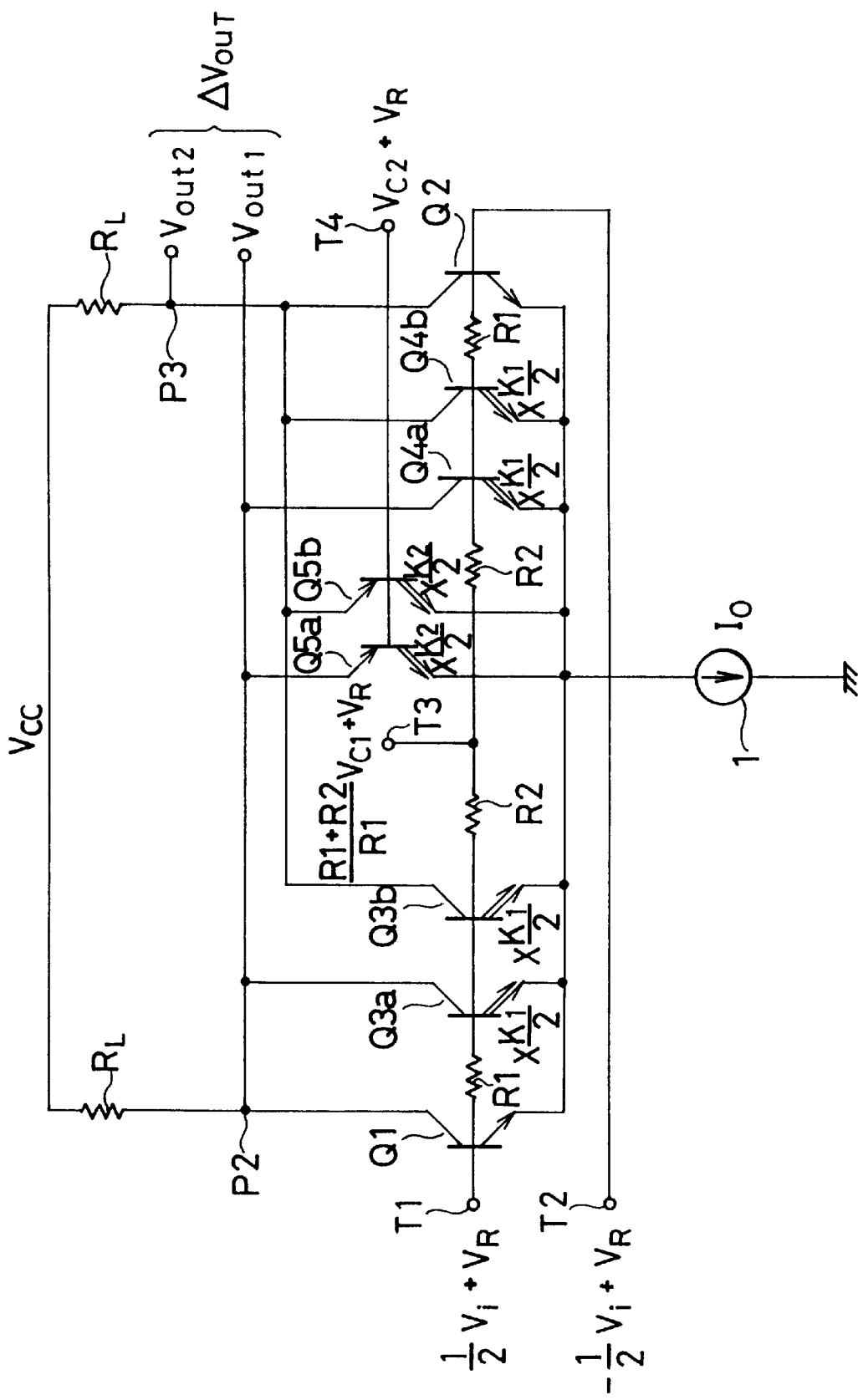
FIG. 24 is a circuit diagram of a bipolar OTA according to a fifteenth embodiment of the present invention, which is a variation of the OTA according to the fourteenth embodiment of FIG. 23.

A bipolar OTA according to a fifteenth embodiment of the present invention is shown in FIG. 24, which is a variation of the OTA according to the fourteenth embodiment of FIG. 23.

Instead of the current mirror formed by the transistors $Q_A$ and $Q_B$ in the OTA of FIG. 23, which serves as an active load, first and second load resistors with a same resistance value $R_L$ are provided. The remaining configuration is the same as that of the fourteenth embodiment of FIG. 23. The first load resistor is connected between the coupled collectors of the transistors Q1, Q3a,Q3a and Q5a, and the power supply. The second load resistor is connected between the coupled collectors of the transistors Q2, Q3b, Q4b, and Q5b and the power supply.

An output voltage $V_{out1}$ is derived from the connection point P2 of the first resistor and the coupled collectors of the transistors Q1, Q3a, Q4a, and Q5a. Another output voltage $V_{out2}$ is derived from the connection point P3 of the second resistor and the coupled collectors of the transistors Q2, Q3b, Q4b, and Q5b. The differential output voltage $\Delta V_{OUT}$, which is defined as $\Delta V_{OUT}$=$V_{out1}$-$V_{out2}$ is derived from the connection points P2 and P3.

Thus, the resistors can be used as the loads for the OTA according to the fourteenth embodiment of FIG. 23.

Sixteenth Embodiment

Figure 25:
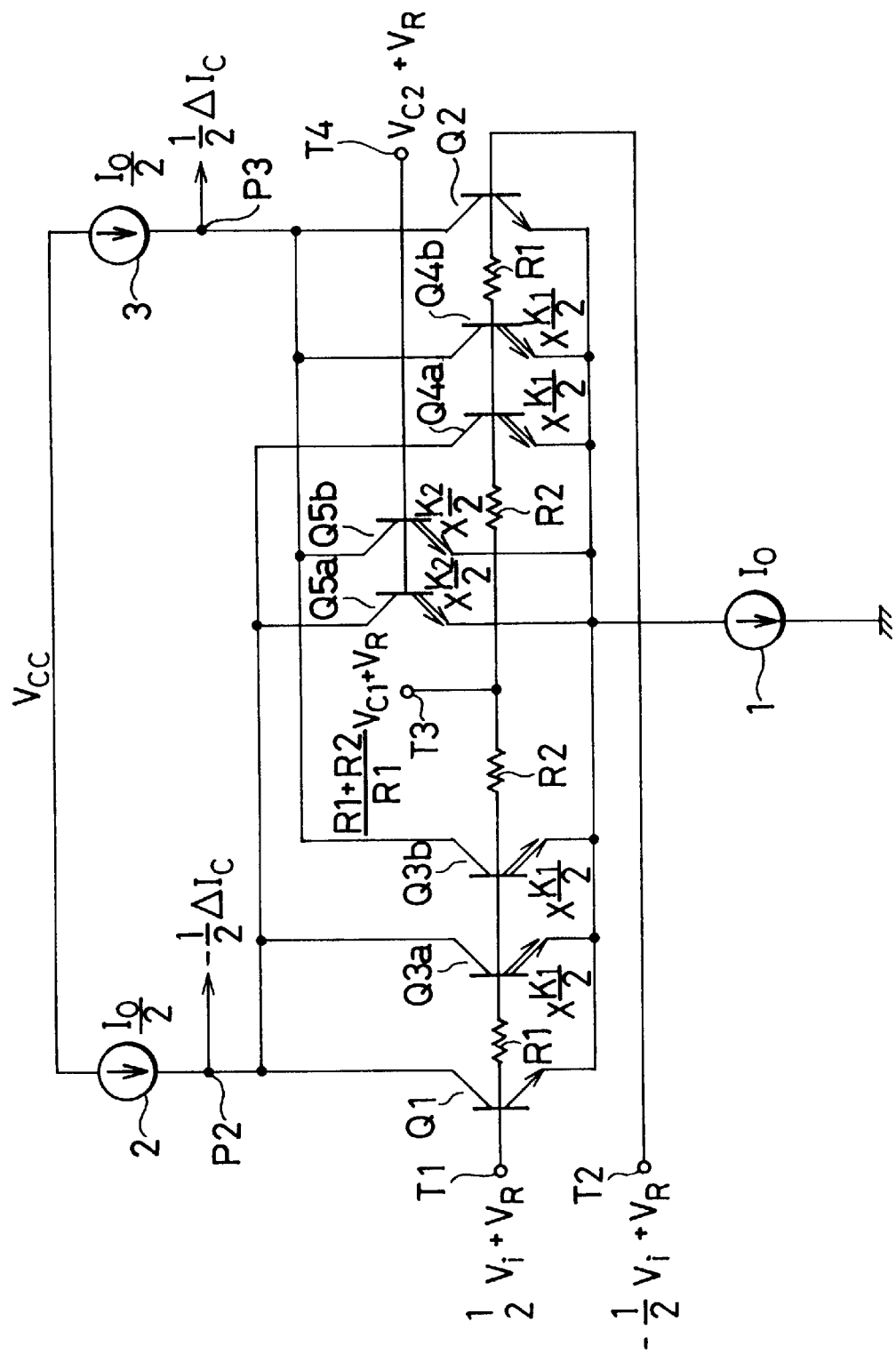
FIG. 25 is a circuit diagram of a bipolar OTA according to a sixteenth embodiment of the present invention, which is another variation of the OTA according to the fourteenth embodiment of FIG. 23.

A bipolar OTA according to a sixteenth embodiment of the present invention is shown in FIG. 25, which is another variation of the OTA according to the fourteenth embodiment of FIG. 23.

Instead of the current mirror formed by the transistors $Q_A$ and $Q_B$ in the OTA of FIG. 23, which serves as an active load, first and second constant current sources 2 and 3 with a same current value ($I_0$/2) are provided. The remaining configuration is the same as that of the fourteenth embodiment of FIG. 23. The first current source 2 is connected between the coupled collectors of the transistors Q1, Q3a, Q4a, and Q5a, and the power supply. The second current source 3 is connected between the coupled collectors of the transistors Q2, Q3b, Q4b, and Q5b, and the power supply.

An output current (-½)$\Delta I_C$ is derived from the connection point P2 of the first current source 2 and the coupled collectors of the transistors Q1, Q3a, Q4a, and Q5a. Another output current (½)$\Delta I_C$ is derived from the connection point P3 of the second current source 3 and the coupled collectors of the transistors Q2, Q3b, Q4b, and Q5b. The differential output current $\Delta I_C$ is derived from the connection points P2 and P3.

Thus, the constant current sources can be used as the loads for the OTA according to the fourteenth embodiment of FIG. 23.

Seventeenth Embodiment

Figure 26:
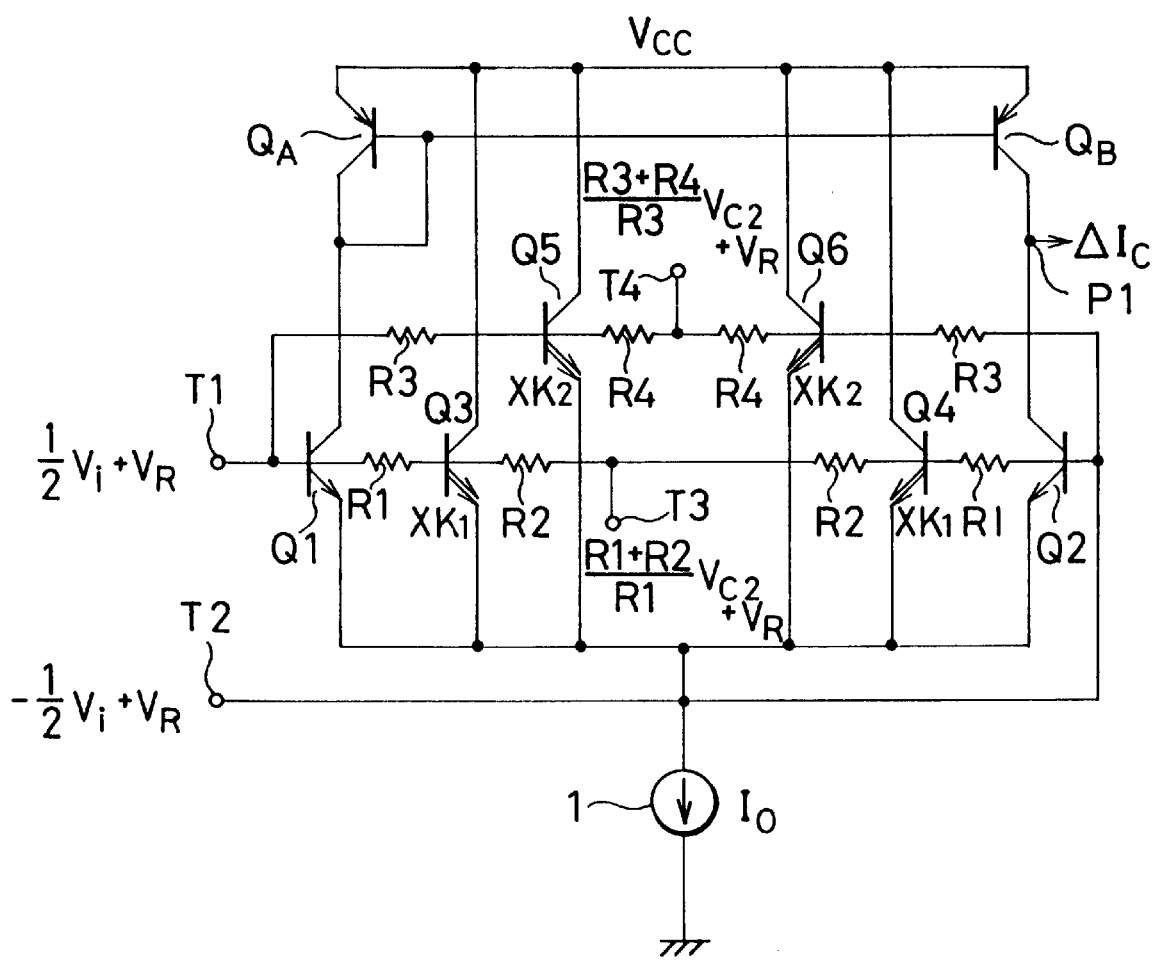
FIG. 26 is a circuit diagram of a bipolar OTA according to a seventeenth embodiment of the present invention, which corresponds to an OTA obtained by setting n=3 (i.e., 2n=6) in the OTA according to the first embodiment of FIG. 6.

A bipolar OTA according to a seventeenth embodiment of the present invention is shown in FIG. 26, which corresponds to an OTA obtained by setting n=3 (i.e., 2n=6) in the OTA according to the first embodiment of FIG. 6. This configuration is termed a "haxatail cell".

As shown in FIG. 26, this OTA includes a first balanced differential pair of npn bipolar transistors Q1 and Q2 whose emitters are coupled together, a second balanced differential pair of npn bipolar transistors Q3 and Q4 whose emitters are coupled together, a third balanced differential pair of npn bipolar transistors Q5 and Q6 whose emitters are coupled together, and a common constant current sink 1 (current: $I_0$) for driving the transistors Q1, Q2, Q3, Q4, Q5, and Q6. The emitters of the six transistors Q1, Q2, Q3, Q4, Q5, and Q6 are connected in common to one end of the current sink 1. The other end of the current sink 1 is grounded.

The emitter areas of the transistors Q1 and Q2 are equal to that of a unit bipolar transistor. The emitter areas of the transistors Q3 and Q4 are $K_1$ times as large as that of a unit bipolar transistor, where $K_1$ is a constant greater than unity (i.e., $K_1>1$). The emitter areas of the transistors Q5 and Q6 are $K_2$ times as large as that of a unit bipolar transistor, where $K_2$ is a constant greater than unity (i.e., $K_2>1$).

The bases of the transistors Q1 and Q2 are connected to a pair of input terminals T1 and T2, respectively. The base of the transistor Q1 is applied with a voltage of $[(\frac{1}{2})V_i+V_R]$ through the input terminal T1, and the base of the transistor Q2 is applied with a voltage of $[(-\frac{1}{2})V_i+V_R]$ through the input terminal T2, with respect to the ground, where $V_R$ is a dc reference voltage. Therefore, a first differential input voltage $V_i$ as an input signal to be amplified is applied across the pair of input terminals T1 and T2.

The base of the transistor Q3 is connected to the base of the transistor Q1 and the input terminal T1 through a first resistor with a resistance R1. The base of the transistor Q4 is connected to the base of the transistor Q2 and the input terminal T2 through a second resistor with the same resistance RI as that of the first resistor. Therefore, a second differential input voltage $(V_i/d_2)$ obtained by attenuation using the first and second resistors is applied across the bases of the transistors Q3 and Q4.

The base of the transistor Q3 is further connected to an input terminal T3 through a third resistor with a resistance R2. The base of the transistor Q4 is further connected to the input terminal T3 through a fourth resistor with the same resistance R2 as that of the third resistor.

The input terminal T3 is applied with a dc voltage of $[\{(R1+R2)/R1\}V_{C1}+V_R]$, where $V_{C1}$ is a dc tuning or offset voltage. Collectors of the transistors Q3 and Q4 are applied with a power supply voltage $V_{cc}$.

The base of the transistor Q5 is connected to the input terminal T1 through a fifth resistor with a resistance R3. The base of the transistor Q6 is connected to the input terminal T2 through a sixth resistor with the same resistance R3 as that of the third resistor. Therefore, a third differential input voltage $(V_i/d_3)$ attenuated by the third and fourth resistors is applied across the bases of the transistors Q5 and Q6.

The base of the transistor Q5 is further connected to an input terminal T4 through a seventh resistor with a resistance R4. The base of the transistor Q6 is further connected to the input terminal T4 through an eighth resistor with the same resistance R4 as that of the seventh resistor.

The input terminal T4 is applied with a dc voltage of $[\{(R3+R4)/R3\})V_{C2}+V_R]$, where $V_{C2}$ is a dc tuning or offset voltage. Collectors of the transistors Q5 and Q6 are applied with a power supply voltage $V_{cc}$.

A current mirror circuit composed of pnp base-coupled bipolar transistors $Q_A$ and $Q_B$ is provided between a power supply (supply voltage: $V_{cc}$, not shown) and collectors of the transistors Q1 and Q2. The current mirror circuit serves as an active load of the first differential pair of the transistors Q1 and Q2.

A collector and a base of the transistor $Q_A$ are coupled together to be connected to a collector of the transistor Q1, and an emitter thereof is applied with the supply voltage $V_{cc}$. A collector of the transistor $Q_B$ is connected to a collector of the transistor Q2 and an emitter thereof is applied with the supply voltage $V_{cc}$.

A differential output current $\Delta I_C$ of the OTA as an amplified output signal is derived from the connection point P1 of the coupled collectors of the transistors $Q_B$ and Q2. The differential output current $\Delta I_C$ is defined as $\Delta I_C = I_{C1} - I_{C2}$, where $I_{C1}$ and $I_{C2}$ are collector currents of the transistors Q1 and Q2, respectively.

Then, the differential output current $\Delta I_C$ of the OTA according to the seventeenth embodiment of FIG. 26 is given by setting n=3 in the equation (22a).

Here, the resistance values R1 and R2 are set in such a way that the attenuation parameters $d_2$ and $d_3$ satisfy the relationships of $(1/d_2)=0.7619$ (i.e., R2=3.20 R1) and $(1/d_3)=0.2857$ (i.e., R4=0.40 R3). Therefore, the first and second attenuated input voltages are expressed as $(1/d_2)(=0.7619) \cdot V_i$ and $(1/d_3)(=0.2857) \cdot V_i$, respectively.

The dc offset or tuning voltages $V_2$ and $V_3$ are expressed as $V_2=V_{C2}=1.74\ V_T(\approx 44\ mV)-V_T \cdot \ln K_1$ $V_3=V_{C3}=2.12\ V_T(\approx 54.0\ mV)-V_T \cdot \ln K_2$, respectively.

A realizable input voltage range providing the transconductance whose linearity is kept within a ±1% error is approximately 800 mV$_{P-P}$ in the seventeenth embodiment of FIG. 26.

Eighteenth Embodiment

Figure 27:
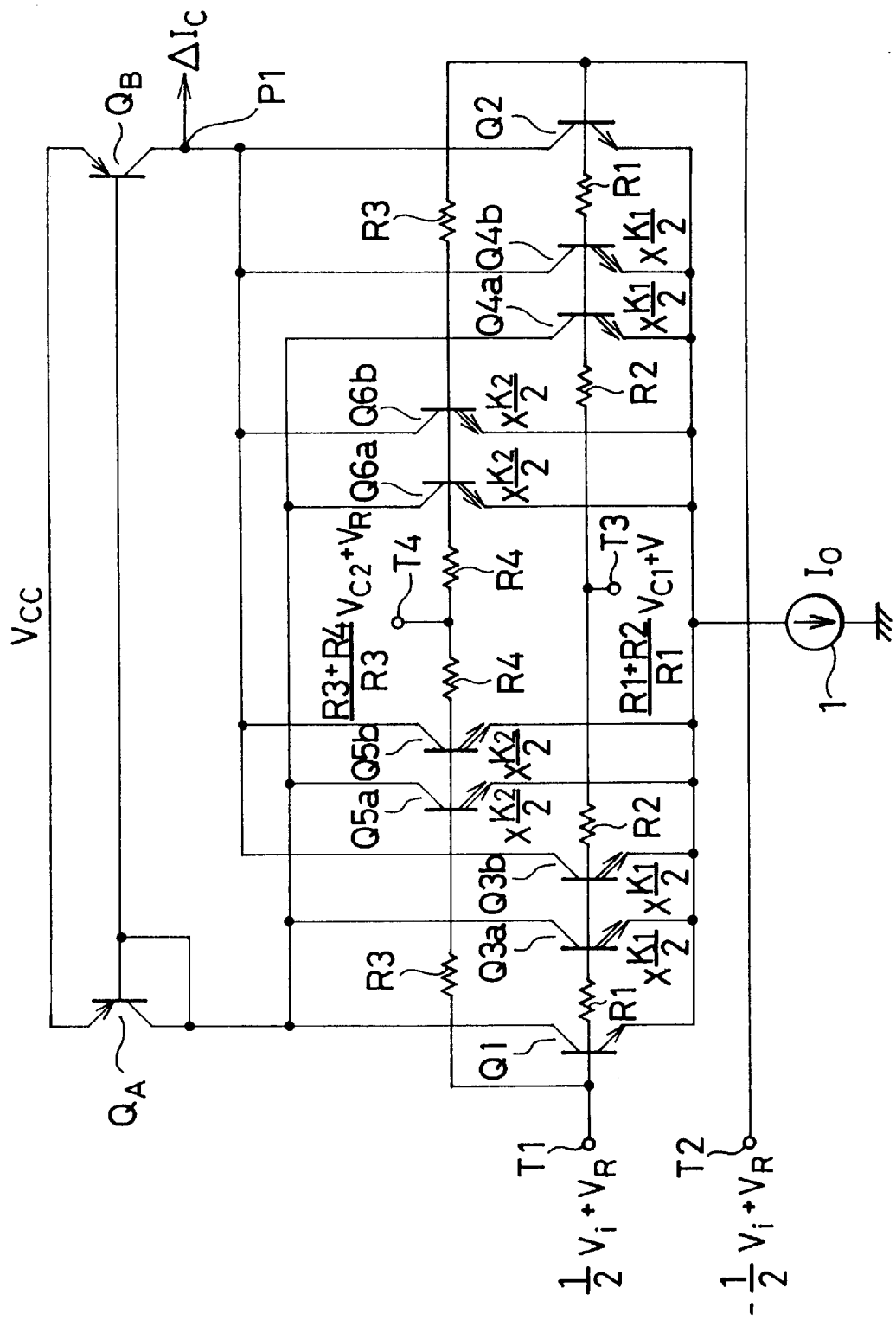
FIG. 27 is a circuit diagram of a bipolar OTA according to an eighteenth embodiment of the present invention, in which each of the third to sixth transistors of the second and third differential pairs is replaced with the combination of two emitter-coupled, base-coupled bipolar transistors in the OTA according to the seventeenth embodiment of FIG. 26.

A bipolar OTA according to an eighteenth embodiment of the present invention is shown in FIG. 27, which corresponds to an OTA obtained by replacing the transistors Q3, Q4, Q5, and Q6 in the OTA according to the seventeenth embodiment of FIG. 26 with the combination of two emitter-coupled, base-coupled bipolar transistors Q3a and Q3b, the combination of two emitter-coupled, base-coupled bipolar transistors Q4a and Q4b, the combination of two emitter-coupled, base-coupled bipolar transistors Q5a and Q5b, and the combination of two emitter-coupled, base-coupled bipolar transistors Q6a and Q6b, respectively.

Collectors of the transistors Q3a and Q3b are connected to the collectors of the transistors Q1 and Q2, respectively. Collectors of the transistors Q4a and Q4b are connected to the collectors of the transistors Q1 and Q2, respectively. Collectors of the transistors Q5a and Q5b are connected to the collectors of the transistors Q1 and Q2, respectively. Collectors or the transistors Q6a and Q6b are connected to the collectors of the transistors Q1 and Q2, respectively.

The current flowing through each of the transistors Q3, Q4, Q5, and Q6 in FIG. 26 is divided into two parts, and the divided parts of the current is distributed to the collectors of the transistors Q1 and Q2, respectively. In this case, the dc components of the collector currents $I_{C1}$ and $I_{C2}$ of the transistors Q1 and Q2 are kept at a constant value of $\alpha_F(I_0/2)$.

As a result, an additional advantage that the dc operating point is fixed occurs in the OTA according to the eighteenth embodiment of FIG. 27, in addition to the same advantages as those in the seventeenth embodiment of FIG. 26.

The transistors Q3a and Q3b and Q4a and Q4b have a same emitter area $(K_1/2)$ times as large as that of the transistors Q1 and Q2 of the first differential pair. The transistors Q5a and Q5b and Q6a and Q6b have a same emitter area $(K_2/2)$ times as large as that or the transistors Q1 and Q2 of the first differential pair. The input voltages $[(R1+R2)/R1]V_{C1}+V_R]$ and $[(R3+R4)/R3]V_{C2}+V_R]$ serving as the dc offset voltages are equal to those of the OTA according to the seventeenth embodiment of FIG. 26, respectively.

Additionally, in the circuit configuration of FIG. 27, the transistors Q3a and Q3b and Q4a and Q4b may have a same emitter area $K_1$ times as large as that of the transistors Q1 and Q2 of the first differential pair. The transistors Q5a and Q5b and Q6a and Q6b may have a same emitter area $K_2$ times as large as that of the transistors Q1 and Q2 of the first differential pair. However, in this case, it is necessary that the attenuated input voltages $[(R1+R2)/R1]V_{C1}+V_R]$ and $[(R3+R4)/R3]V_{C2}+V_R]$ are decreased by proper values in such a way that the sum of the currents flowing through the transistors Q1 and Q2, Q3a and Q3b, Q4a and Q4b, Q5a and Q5b, and Q6a and Q6b of the multitail cell is equal to $I_0$.

In this embodiment, it is preferred that the value to be decreased of the input voltage $[(R1+R2)/R1]V_C+V_R]$ is $V_T \cdot \ln 2$, which is equal to approximately 18 mV at room temperature.

Nineteenth Embodiment

Figure 28:
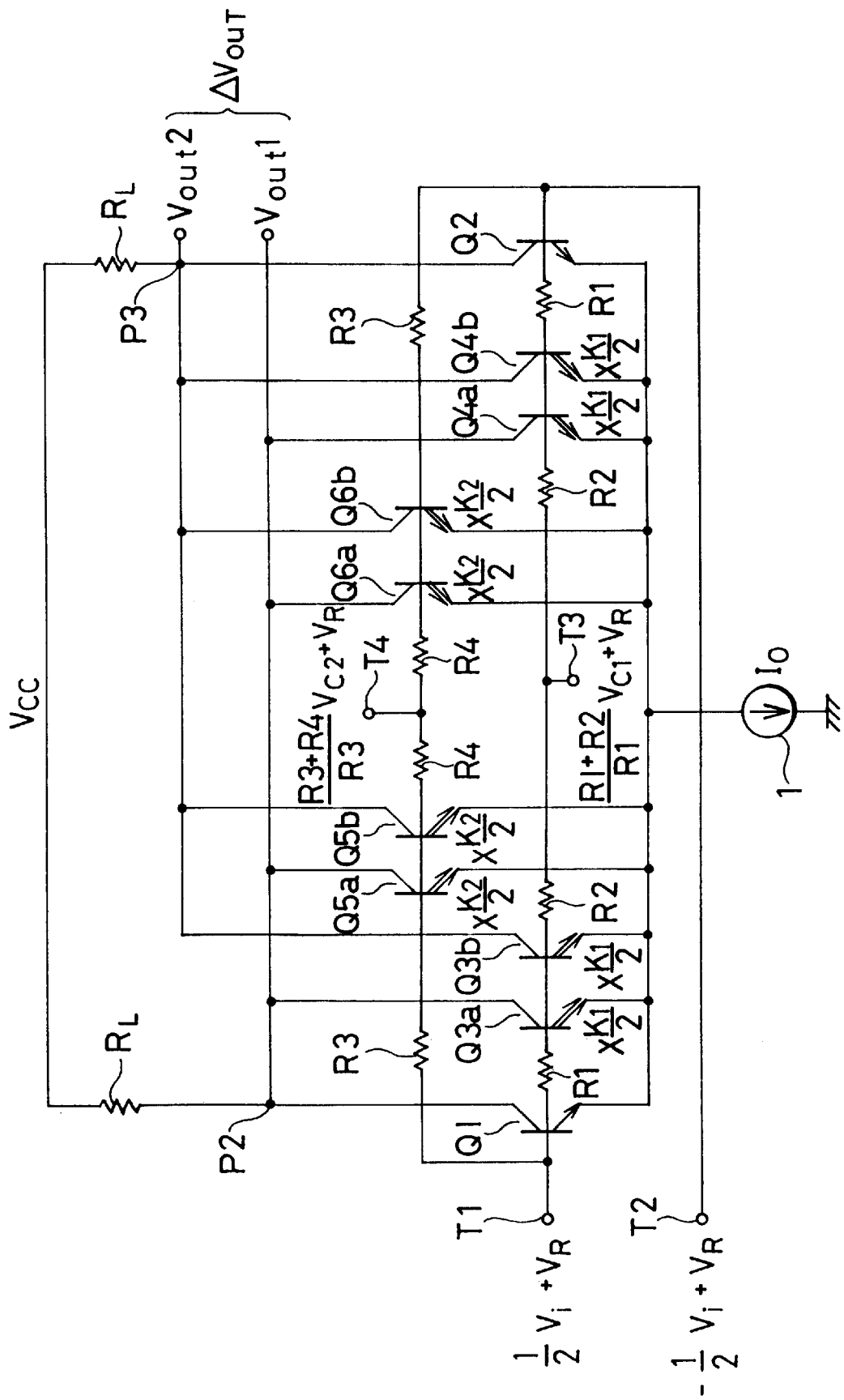
FIG. 28 is a circuit diagram of a bipolar OTA according to a nineteenth embodiment of the present invention, which is a variation of the OTA according to the eighteenth embodiment of FIG. 27.

A bipolar OTA according to a nineteenth embodiment of the present invention is shown in FIG. 28, which is a variation of the OTA according to the eighteenth embodiment of FIG. 27.

Instead of the current mirror formed by the transistors $Q_A$ and $Q_B$ in the OTA of FIG. 27, which serves as an active load, first and second load resistors with a same resistance value $R_L$ are provided. The remaining configuration is the sate as that of the eighteenth embodiment of FIG. 27. The first load resistor is connected between the coupled collectors of the transistors Q1, Q3a, Q3a, Q5a, and Q6a, and the power supply. The second load resistor is connected between the coupled collectors of the transistors Q2, Q3b, Q4b, Q5b, and Q6b and the power supply.

An output voltage $V_{out1}$ is derived from the connection point P2 of the first resistor and the coupled collectors of the transistors Q1, Q3a, Q4a, Q5a, and Q6a. Another output voltage $V_{out2}$ is derived from the connection point P3 of the second resistor and the coupled collectors of the transistors Q2, Q3b, Q4b, Q5b, and Q6b. The differential output voltage $\Delta V_{OUT}$, which is defined as $\Delta V_{OUT}=V_{out1}-V_{out2}$, is derived from the connection points P2 and P3.

Thus, the resistors can be used as the loads for the OTA according to the eighteenth embodiment of FIG. 27.

Twentieth Embodiment

Figure 29:
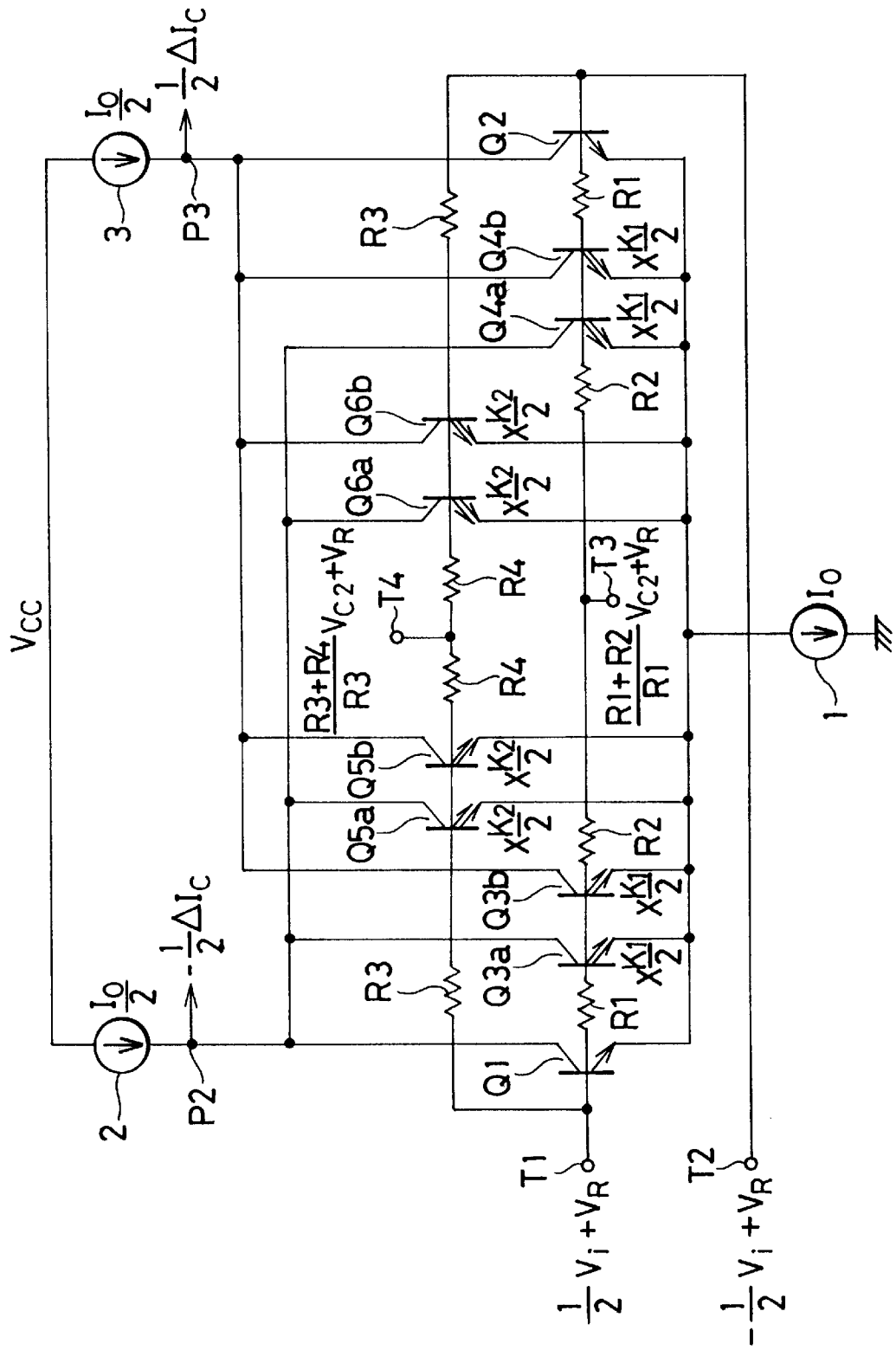
FIG. 29 is a circuit diagram of a bipolar OTA according to a twentieth embodiment of the present invention, which is another variation of the OTA according to the eighteenth embodiment of FIG. 27.

A bipolar OTA according to a twentieth embodiment of the present invention is shown in FIG. 29, which is another variation of the OTA according to the eighteenth embodiment of FIG. 27.

Instead of the current mirror formed by the transistors $Q_A$ and $Q_B$ in the OTA of FIG. 27, which serves as an active load, first and second constant current sources 2 and 3 with a same current value $(I_0/2)$ are provided. The remaining configuration is the same as that of the eighteenth embodiment of FIG. 27. The first current source 2 is connected between the coupled collectors of the transistors Q1, Q3a, Q4a, Q5a, and Q6a and the power supply. The second current source 3 is connected between the coupled collectors of the transistors Q2, Q3b, Q4b, Q5b, and Q6b and the power supply.

An output current $(-\frac{1}{2})\Delta I_C$ is derived from the connection point P2 of the first current source 2 and the coupled collectors of the transistors Q1, Q3a, Q4a, Q5a, and Q6a. Another output current $(\frac{1}{2})\Delta I_C$ is derived from the connection point P3 of the second current source 3 and the coupled collectors of the transistors Q2, Q3b, Q4b, Q5b, and Q6b. The differential output current $\Delta I_C$ is derived from the connection points P2 and P3.

Thus, the constant current sources can be used as the loads for the OTA according to the eighteenth embodiment of FIG. 27.

Twenty-First Embodiment

Figure 30:
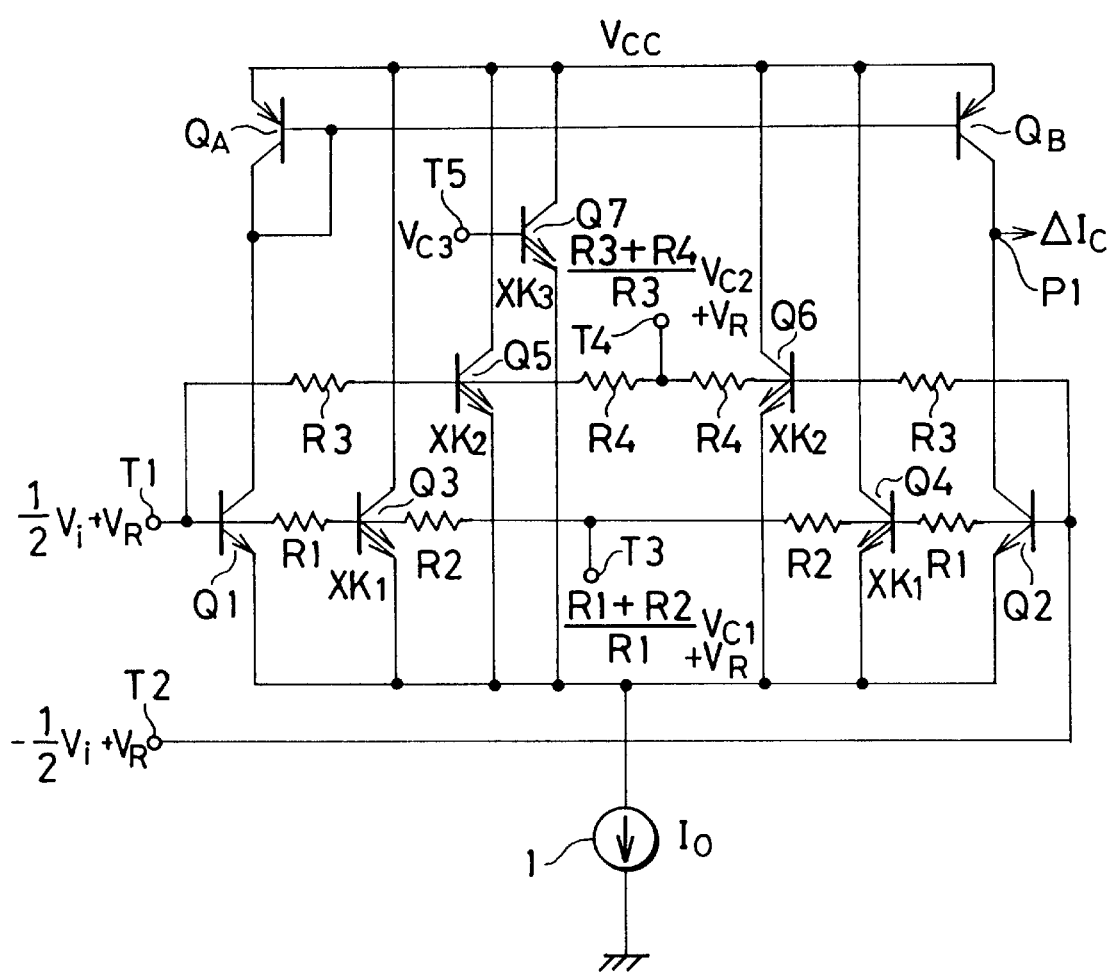
FIG. 30 is a circuit diagram of a bipolar OTA according to a twenty-first embodiment of the present invention, which corresponds to an OTA obtained by setting n=3 (i.e., 2n+1=7) in the OTA according to the second embodiment of FIG. 7.

A bipolar OTA according to a twenty-first embodiment of the present invention is shown in FIG. 30, which corresponds to an OTA obtained by setting n=3 (i,e., 2n+1=7) in the OTA according to the second embodiment of FIG. 7. This configuration is termed a "septtail cell".

As shown in FIG. 30, this OTA includes a first balanced differential pair of npn bipolar transistors Q1 and Q2 whose emitters are coupled together, a second balanced differential pair of npn bipolar transistors Q3 and Q4 whose emitters are coupled together, a third balanced differential pair of npn bipolar transistors Q5 and Q6 whose emitters are coupled together, an npn bipolar transistor Q7, and a common constant current sink 1 (current: $I_0$) for driving the transistors Q1, Q2, Q3, Q4, Q5, Q6 and Q7. The emitters of the seven transistors Q1, Q2, Q3, Q4, Q5, Q6 and Q7 are connected in common to one end of the current sink 1. The other end of the current sink 1 is grounded.

The emitter areas of the transistors Q1 and Q2 are equal to that of a unit bipolar transistor. The emitter areas of the transistors Q3 and Q4 are $K_1$ times as large as that of a unit bipolar transistor, where $K_1$ is a constant greater than unity (i.e., $K_1>1$). The emitter areas of the transistors Q5 and Q6 are $K_2$ times as large as that of a unit bipolar transistor, where $K_2$ is a constant greater than unity (i.e., $K_2>1$). The emitter area of the transistor Q7 is $K_3$ times as large as that of a unit bipolar transistor, where $K_3$ is a constant greater than unity (i.e., $K_3>1$).

The bases of the transistors Q1 and Q2 are connected to a pair of input terminals T1 and T2, respectively. The base of the transistor Q1 is applied with a voltage of $[(\frac{1}{2})V_1+V_R]$ through the input terminal T1, and the base of the transistor Q2 is applied with a voltage of $[(-\frac{1}{2})V_i+V_R]$ through the input terminal T2, where $V_R$ is a dc reference voltage. Therefore, a first differential input voltage $V_i$ as an input signal to be amplified is applied across the bases of the transistors Q1 and Q2 through the pair of input terminals T1 and T2.

The base of the transistor Q3 is connected to the base of the transistor Q1 and the input terminal T1 through a first resistor with a resistance R1. The base of the transistor Q4 is connected to the base of the transistor Q2 and the input terminal T2 through a second resistor with the same resistance R1 as that of the first resistor. Therefore, a second differential input voltage ($V_i/d_2$) obtained by attenuation using the first and second resistors is applied across the bases of the transistors Q3 and Q4.

The base of the transistor Q3 is further connected to an input terminal T3 through a third resistor with a resistance R2. The base of the transistor Q4 is further connected to the input terminal T3 through a fourth resistor with the same resistance R2 as that of the third resistor.

The input terminal T3 is applied with a dc voltage of $[\{(R1+R2)/R1\}V_{C1}+V_R]$, where $V_{C1}$ is a dc tuning or offset voltage. Collectors of the transistors Q3 and Q4 are applied with a power supply voltage $V_{cc}$.

The base of the transistor Q5 is connected to the input terminal T1 through a fifth resistor with a resistance R3. The base of the transistor Q6 is connected to the input terminal T2 through a sixth resistor with the same resistance R3 as that of the fifth resistor. Therefore, a third differential input voltage ($V_i/d_3$) obtained by attenuation using the third and fourth resistors is applied across the bases of the transistors Q5 and Q6.

The base of the transistor Q5 is further connected to an input terminal T4 through a seventh resistor with a resistance R4. The base of the transistor Q6 is further connected to the input terminal T4 through ail eighth resistor with the same resistance R4 as that of the seventh resistor.

The input terminal T4 is applied with a dc voltage of $[\{(R3+R4)/R3\}V_{C2}+V_R]$, where $V_{C2}$ is a dc tuning or offset voltage. Collectors of the transistors Q5 and Q6 are applied with a power supply voltage $V_{cc}$.

A base of the transistor Q7 is connected to an input terminal T5. The input terminal T5 is applied with a dc voltage of $V_{C3}$, where $V_{C3}$ is a dc tuning or offset voltage. A collector of the transistor Q7 is applied with the power supply voltage $V_{cc}$.

A current mirror circuit composed of pnp base-coupled bipolar transistors $Q_A$ and $Q_B$ is provided between a power supply (supply voltage: $V_{cc}$, not shown) and collectors of the transistors Q1 and Q2. The current mirror circuit serves as an active load of the first differential pair of the transistors Q1 and Q2.

A collector and a base of the transistor a are coupled together to be connected to a collector of the transistor Q1, and an emitter thereof is applied with the supply voltage $V_{cc}$. A collector of the transistor $Q_B$ is connected to a collector of the transistor Q2 and an emitter thereof is applied with the supply voltage $V_{cc}$.

A differential output current $\Delta I_C$ of the OTA as an amplified output signal is derived from the connection point P1 of the collectors of the transistors $Q_B$ and Q2. The differential output current $\Delta I_C$ is defined as $\Delta I_C = I_{C1} - I_{C2}$, where $I_{C1}$ and $I_{C2}$ are collector currents of the transistors Q1 and Q2, respectively.

Then, the differential output current $\Delta I_C$ of the OTA according to the twenty-first embodiment of FIG. 30 is given by setting n=3 the equation (22b).

Here, the resistance values R1 and R2 are set in such a way that the attenuation parameters $d_2$ and $d_3$ satisfy the relationships of $(1/d_2)$–0.830 (i.e., R2=4.8824 R1), and $(1/d_3)$=0.470 (i.e., R4=0.8868 R3).

The dc offset voltages $V_2$ and $V_3$ are set as $V_2$=The dc tuning voltages $V_{C1}$, $V_{C2}$ and $V_{C3}$ are set as $V_{C1}$=42.4 mV, $V_{C2}$=53.0 mV, and The dc offset or tuning voltages $V_2$ and $V_3$ are expressed as $$V_2 = V_{C1} = V_T \ln 6 \ (\approx 45.9 \text{ mV}) - V_T \ln (K_1)$$

$$V_3 = V_{C2} = V_T \ln 9 \ (\approx 56.2 \text{ mV}) - V_T \ln (K_2),$$

respectively.

So, a realizable input voltage range providing the transconductance whose linearity is kept within a ±1% error is approximately 1100 $mV_{P-P}$.

Twenty-Second Embodiment

Figure 31:
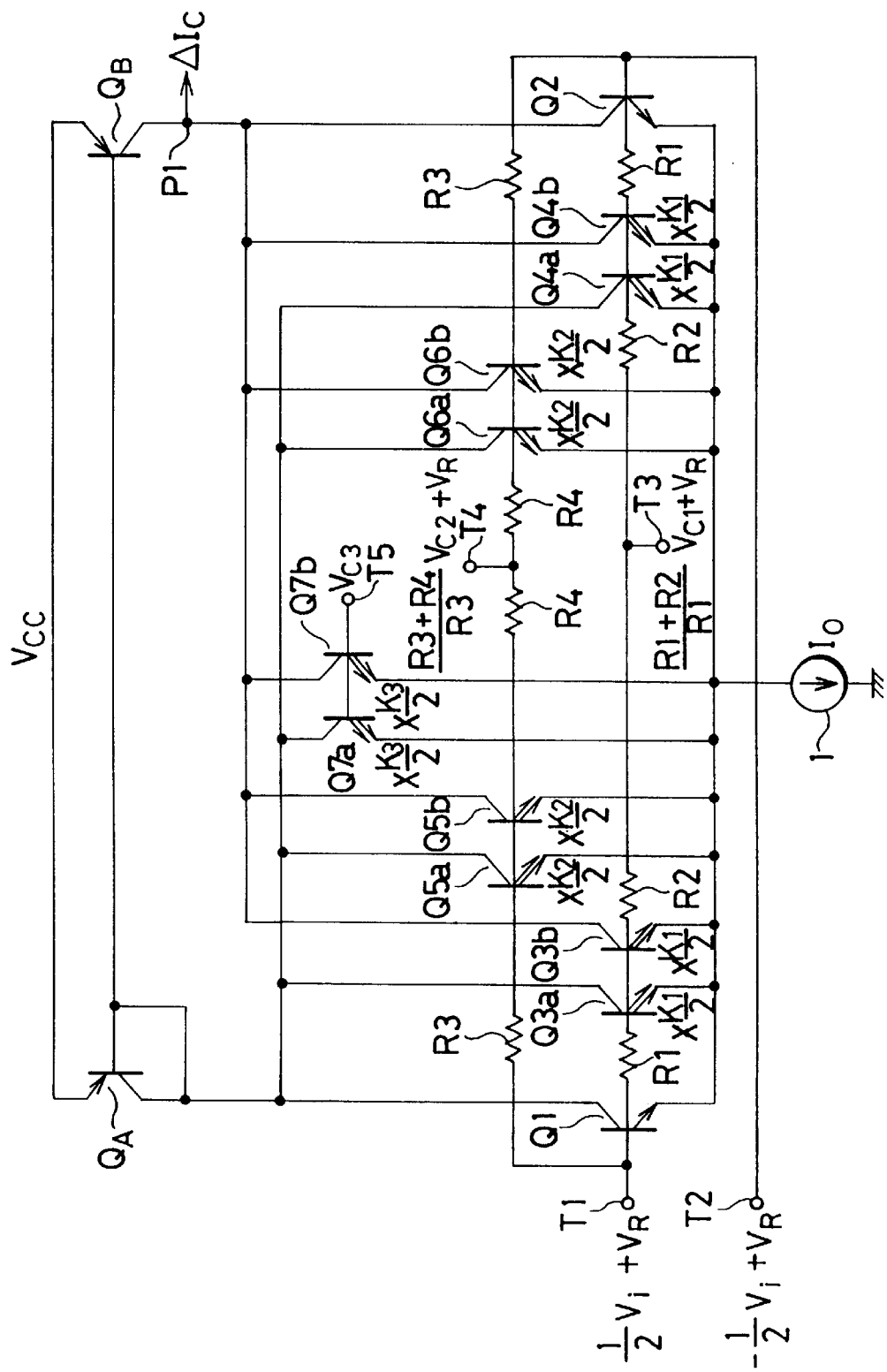
FIG. 31 is a circuit diagram of a bipolar OTA according to a twenty-second embodiment of the present invention, in which each of the third to sixth transistors of the second and third differential pairs and the seventh transistor is replaced with the combination of two emitter-coupled, base-coupled bipolar transistors in the OTA according to the twenty-first embodiment of FIG. 30.

A bipolar OTA according to a twenty-second embodiment of the present invention is shown in FIG. 31, which corresponds to an OTA obtained by replacing the transistors Q3, Q4, Q5, Q6, and Q7 in the OTA according to the twenty-first embodiment of FIG. 30 with the combination of two emitter-coupled, base-coupled bipolar transistors Q3a and Q3b, the combination of two emitter-coupled, base-coupled bipolar transistors Q4a and Q4b, the combination of two emitter-coupled, base-coupled bipolar transistors Q5a and Q5b, the combination of two emitter-coupled, base-coupled bipolar transistors Q6a and Q6b, and the combination of two emitter-coupled, base-coupled bipolar transistors Q7a and Q7b, respectively.

Collectors of the transistors Q3a and Q3b are connected to the collectors of the transistors Q1 and Q2, respectively. Collectors of the transistors Q4a and Q4b are connected to the collectors of the transistors Q1 and Q2, respectively. Collectors of the transistors Q5a and Q5b are connected to the collectors of the transistors Q1 and Q2, respectively. Collectors of the transistors Q5a and Q6b are connected to the collectors of the transistors Q1 and Q2, respectively. Collectors of the transistors Q7a and Q7b are connected to the collectors of the transistors Q1 and Q2, respectively.

The current flowing through each of the transistors Q3, Q4, Q5, Q6, and Q7 in FIG. 30 is divided into two parts, and the divided parts of the current is distributed to the collectors of the transistors Q1 and Q2, respectively. In this case, the dc components of the collector currents $I_{C1}$ and $I_{C2}$ of the transistors Q1 and Q2 are kept at a constant value of $\alpha_F(I_0/2)$ As a result, an additional advantage that the dc operating point is fixed occurs in the OTA according to the twenty-second embodiment of FIG. 31, in addition to the same advantages as those in the twenty-first embodiment of FIG. 30.

The transistors Q3a and Q3b and Q4a and Q4b have a same emitter area ($K_1/2$) times as large as that of the transistors Q1 and Q2 of the first differential pair. The transistors Q5a and Q5b and Q6a and Q6b have a same emitter area ($K_2/2$) times as large as that of the transistors Q1 and Q2 of the first differential pair. The transistors Q7a and Q7b have a same emitter area ($K_3/2$) times as large as that of the transistors Q1 and Q2 of the first differential pair.

The input voltages $[(R1+R2)/R1)V_{C1}+V_R]$, $[(R3+R4)/R3)V_{C2}+V_R]$, and $V_{C3}$ serving as the first to third dc offset voltages are equal to those of the OTA according to the twenty-first embodiment of FIG. 30, respectively.

Additionally, in the circuit configuration of FIG. 31, the transistors Q3a and Q3b and Q4a and Q4b may have a same emitter area $K_1$ times as large as that of the transistors Q1 and Q2 of the first differential pair. The transistors Q5a and Q5b and Q6a and Q6b may have a same emitter area $K_2$ times as large as that of the transistors Q1 and Q2 of the first differential pair. The transistors Q7a and Q7b may have a same emitter area $K_3$ times as large as that of the transistors Q1 and Q2 of the first differential pair.

However, in this case, it is necessary that the attenuated input voltages [(R1+R2)/R1)$V_{C1}$+$V_R$] and [(R3+R4)/R3)$V_{C2}$+$V_R$] are decreased by proper values in such a way that the sum of the currents flowing through the transistors Q1 and Q2, Q3a and Q3b, Q4a and Q4b, Q5a and Q5b, Q6a and Q6b, and Q7a and Q7b of the multitail cell is equal to $I_0$.

In this embodiment, it is preferred that the value to be decreased of the input voltage [(R1+R2)/R1)$V_C$+$V_R$] is $V_T$·ln 2, which is equal to approximately 18 mV at room temperature.

Twenty-Third Embodiment

Figure 32:
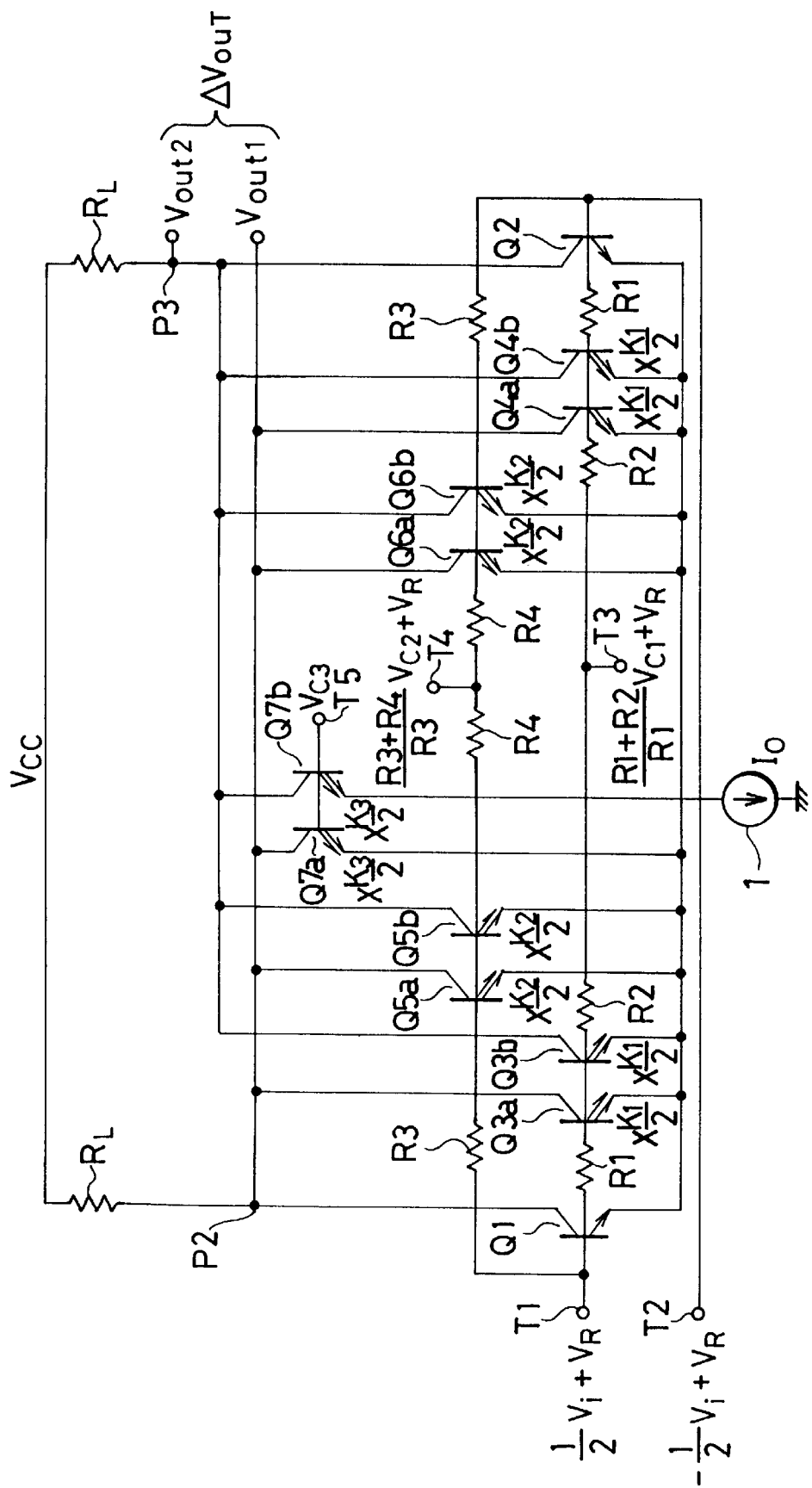
FIG. 32 is a circuit diagram of a bipolar OTA according to a twenty-third embodiment of the present invention, which is a variation of the OTA according to the twenty-second embodiment of FIG. 31.

A bipolar OTA according to a twenty-third embodiment of the present invention is shown in FIG. 32, which is a variation of the OTA according to the twenty-second embodiment of FIG. 31.

Instead of the current mirror formed by the transistors $Q_A$ and $Q_B$ in the OTA of FIG. 31, which serves as an active load, first and second load resistors with a same resistance value $R_L$ are provided. The remaining configuration is the same as that of the twenty-second embodiment of FIG. 31. The first load resistor is connected between the coupled collectors of the transistors Q1, Q3a,Q3a, Q5a, Q6a, and Q7a and the power supply. The second load resistor is connected between the coupled collectors of the transistors Q2, Q3b, Q4b, Q5b, Q6b, and Q7b and the power supply.

An output voltage $V_{out1}$ is derived from the connection point P2 of the first resistor and the coupled collectors of the transistors Q1, Q3a, Q4a, Q5a, Q6a, and Q7a. Another output voltage $V_{out2}$ is derived from the connection point P3 of the second resistor and the coupled collectors of the transistors Q2, Q3b, Q4b, Q5b, Q6b, and Q7b. The differential output voltage $\Delta V_{OUT}$, which is defined as $\Delta V_{OUT}$= $V_{out1}$-$V_{out2}$, is derived from the connection points P2 and P3.

Thus, the resistors can be used as the loads for the OTA according to the twenty-second embodiment of FIG. 31.

Twenty-Fourth Embodiment

Figure 33:
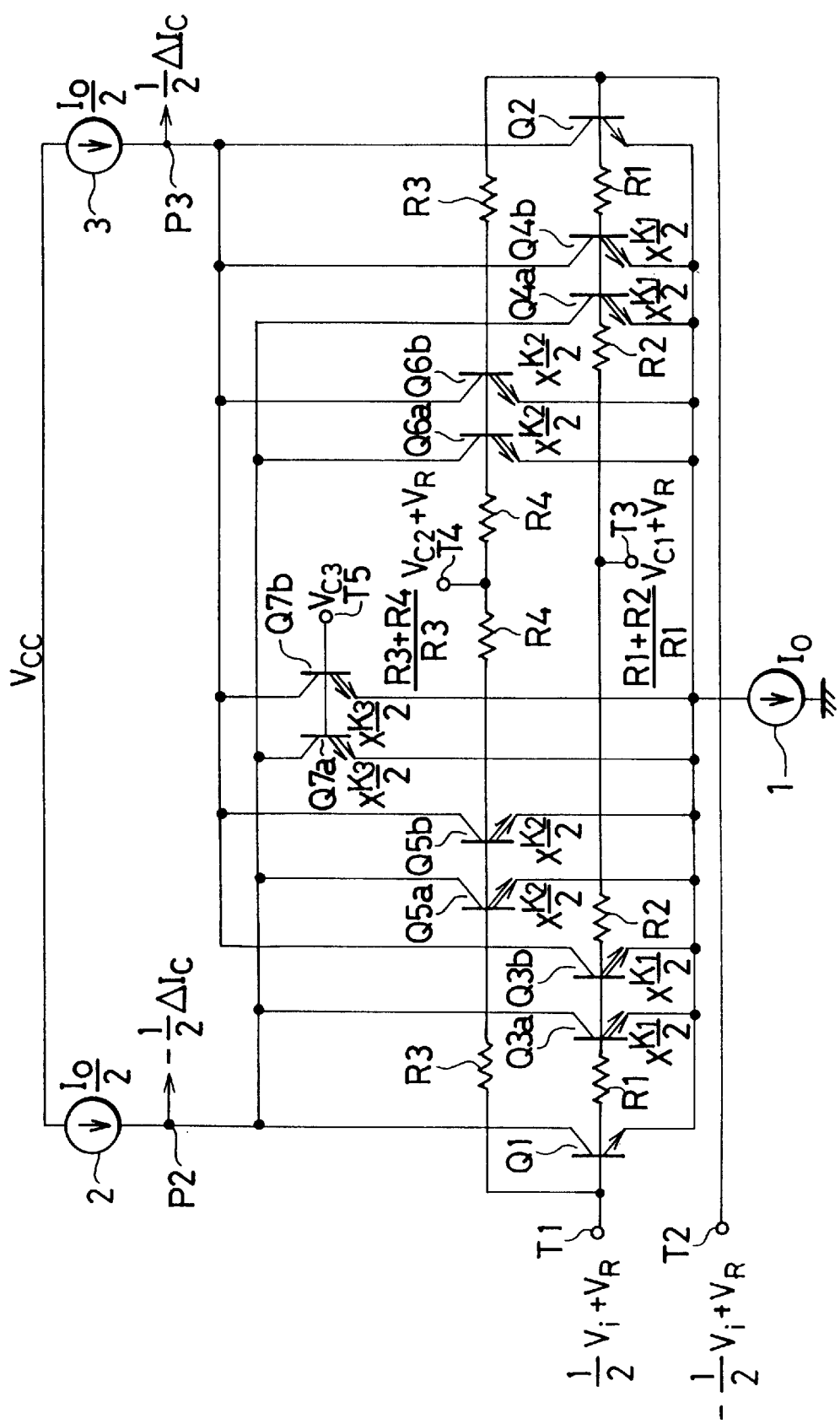
FIG. 33 is a circuit diagram of a bipolar OTA according to a twenty-fourth embodiment of the present invention, which is another variation of the OTA according to the twenty-second embodiment of FIG. 31.

A bipolar OTA according to a twenty-fourth embodiment of the present invention is shown in FIG. 33, which is another variation of the OTA according to the twenty-second embodiment of FIG. 31.

Instead of the current mirror formed by the transistors $Q_A$ and $Q_B$ in the OTA of FIG. 31, which serves as an active load, first and second constant current sources 2 and 3 with a same current value ($I_0$/2) are provided. The remaining configuration is the same as that of the twenty-second embodiment of FIG. 31. The first current source 2 is connected between the coupled collectors of the transistors Q1, Q3a, Q4a, Q5a, Q65a, and Q75a and the power supply. The second current source 3 is connected between the coupled collectors of the transistors Q2, Q3b, Q4b, Q5b, Q6b, and Q7b and the power supply.

An output current (-½)$\Delta I_C$ is derived from the connection point P2 of the first current source 2 and the coupled collectors of the transistors Q1, Q3a, Q4a, Q5a, Q65a, and Q7a. Another output current (½)$\Delta I_C$ is derived from the connection point P3 of the second current source 3 and the coupled collectors of the transistors Q2, Q3b, Q4b, Q5b, Q6b, and Q75b. The differential output current $\Delta I_C$ is derived from the connection points P2 and P3.

Thus, the constant current sources can be used as the loads for the OTA according to the twenty-second embodiment of FIG. 31.

In the bipolar OTAs according to the first to twenty-fourth embodiments of the present invention, npn bipolar transistors are used as each of the differential pairs and the additional transistor. However, it is needless to say that pnp bipolar transistors may be used.

In the above third to twenty-fourth embodiments, the number n is set as 1, 2 or 3. However, it may be 4 or more, as necessary.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A bipolar operational transconductance amplifier comprising:

first to n-th differential pairs of first to 2n-th bipolar transistors whose emitters are coupled together, where n is an integer equal to or greater than two;

a common current source or sink connected to said emitters of said first to 2n-th transistors of said first to n-th differential pairs;

said first to 2n-th transistors of said first to n-th ifferential pairs being driven by a common tail current produced by said common current source or sink; and said transistors of each of said second to n-th differential pairs having a same emitter area $K_1$ to $K_{n-1}$ times as large as that of said first and second transistors of said first differential pair, where $K_1$ to $K_{n-1}$ are constants greater than unity;

wherein a first input voltage as an input signal to be amplified is differentially applied across bases of the first and second transistors of the first differential pair;

and wherein second to n-th input voltages are differentially applied across corresponding bases of said third to 2n-th transistors of said second to n-th differential pairs, respectively;

and wherein each of said second to n-th input voltages is produced by attenuating said first input voltage;

and wherein first to (n-1)-th pairs of dc offset voltages are applied to said bases of said third to 2n-th transistors of said second to n-th differential pairs, respectively;

and wherein an amplified output signal is differentially derived from collectors of said first and second transistors of said first differential pair.

2. An amplifier as claimed in claim 1, wherein each of said transistors of each of said second to n-th differential pairs is replaced with the combination of two emitter-coupled, base-coupled bipolar transistors;

and wherein collectors of said emitter-coupled, base-coupled bipolar transistors are connected to said collectors of said first and second transistors of said first differential pair, respectively.

3. An amplifier as claimed in claim 2, wherein said emitter-coupled, base-coupled bipolar transistors forming said second to n-th differential pairs have a same emitter area equal to ($K_1$/2) to ($K_{n-1}$/2) times as large as that of the first and second transistors of said first differential pair, respectively.

4. An amplifier as claimed in claim 2, wherein said emitter-coupled, base-coupled bipolar transistors forming said second to n-th differential pairs have a same emitter area equal to $K_1$ to $K_{n-1}$ times as large as that of the first and second transistors of said first differential pair, respectively.

5. An amplifier as claimed in claim 1, wherein each of said second to n-th input voltages is generated by using a resistive voltage divider.

6. A bipolar operational transconductance amplifier comprising:

first to n-th differential pairs of first to 2n-th bipolar transistors whose emitters are coupled together, where n is an integer equal to or greater than two;

a (2n+1)-th bipolar transistor whose emitter is coupled together to be connected to said coupled emitters of first to 2n-th transistors;

a common current source or sink connected to said emitters of said first to 2n-th transistors of said first to n-th differential pairs and said (2n+1)-th transistor;

said first to 2n-th transistors of said first to n-th differential pairs and said (2n+1)-th transistor being driven by a common tail current produced by said common current source or sink;

said transistors of each of said second to n-th differential pairs having a same emitter area $K_1$ to $K_{n-1}$ times as large as that of said first and second transistors of said first differential pair, where $K_1$ to $K_{n-1}$ are constants greater than unity;

said (2n+1)-th transistor having an emitter area $K_n$ times as large as that of said first and second transistors of said first differential pair, where $K_n$ is a constant greater than unity;

wherein a first input voltage as an input signal to be amplified is differentially applied across bases of the first and second transistors of the first differential pair;

and wherein second to n-th input voltages are differentially applied across corresponding bases of said third to 2n-th transistors of said second to n-th differential pairs, respectively;

and wherein an (n+1)-th input voltage is applied to a base of said (2n+1)-th transistor;

and wherein each of said second to n-th input voltages is produced by attenuating said first input voltage;

and wherein first to (n−1)-th pairs of dc offset voltages are applied to said bases of said third to 2n-th transistors of said second to n-th differential pairs, respectively;

and wherein an amplified output signal is differentially derived from collectors of said first and second transistors of said first differential pair.

7. An amplifier as claimed in claim 6, wherein each of said transistors of each of said second to n-th differential pairs is replaced with the combination of two emitter-coupled, base-coupled bipolar transistors;

and wherein collectors of said emitter-coupled, base-coupled bipolar transistors forming said second to n-th differential pairs are connected to said collectors of said first and second transistors of said first differential pair, respectively;

and wherein said (2n+1)-th transistor is replaced with the combination of two emitter-coupled, base-coupled bipolar transistors;

and wherein collectors of said emitter-coupled, base-coupled bipolar transistors forming said (2n+1)-th transistor are connected to said collectors of said first and second transistors of said first differential pair, respectively.

8. An amplifier as claimed in claim 7, wherein said emitter-coupled, base-coupled bipolar transistors forming said second to n-th differential pairs have a same emitter area equal to $(K_1/2)$ to $(K_{n-1}/2)$ times as large as that of the first and second transistors of said first differential pair, respectively;

and wherein said emitter-coupled, base-coupled bipolar transistors forming said (2n+1)-th transistor have an emitter area equal to $(K_n/2)$ times as large as that of the first and second transistors of said first differential pair, respectively.

9. An amplifier as claimed in claim 7, wherein said emitter-coupled, base-coupled bipolar transistors forming said second to n-th differential pairs have a same emitter area equal to $K_1$ to $K_{n-1}$ times as large as that of the first and second transistors of said first differential pair, respectively;

and wherein said emitter-coupled, base-coupled bipolar transistors forming said (2n+1)-th transistor have an emitter area equal to $K_n$ times as large as that of the first and second transistors of said first differential pair, respectively.

10. An amplifier as claimed in claim 6, wherein each of said second to n-th input voltages is generated by using a resistive voltage divider.

11. A bipolar operational transconductance amplifier comprising:

a first differential pair of first and second bipolar transistors whose emitters are coupled together;

a third bipolar transistor whose emitter is connected to said emitters of said first and second transistors;

a common current source or sink connected to said emitters of said first, second and third transistors;

said first, second and third transistors being driven by a common tail current produced by said common current source or sink, thereby constituting a triple-tail cell;

said first and second transistors having a same emitter area; and said third transistor having an emitter area K times as large as that of said first and second transistors, where K is a constant greater than unity;

wherein an input voltage as an input signal to be amplified is differentially applied solely across bases of said first and second transistors;

and wherein a dc voltage is applied to a base of said third transistor;

and wherein an amplified output signal is differentially derived directly from collectors of said first and second transistors.

12. An amplifier as claimed in claim 11, wherein said dc voltage is generated by using a resistive voltage divider.

13. An amplifier as claimed in claim 11, wherein said dc voltage is equal to $(V_T \cdot \ln 4/K)$, where $V_T$ is the thermal voltage.

14. A bipolar operational transconductance amplifier comprising:

a first differential pair of first and second bipolar transistors whose emitters are coupled together;

a second differential pair of third and fourth bipolar transistors whose emitters are coupled together;

a common current source or sink connected to said emitters of said first and second transistors and said emitters of said third and fourth transistors;

said first, second, third and fourth transistors being driven by a common tail current produced by said common current source or sink, thereby constituting a quadritail cell; and said third and fourth transistors of said second differential pair having a same emitter area K times as large as that of said first and second transistors of said first differential pair, where K is a constant greater than unity;

wherein a first input voltage as an input signal to be amplified is differentially applied across bases of said first and second transistors;

and wherein a second input voltage is differentially applied across bases of said third and fourth transistors, and said second input voltage is produced by attenuating said first input voltage;

and wherein first and second dc offset voltages are applied to bases of said third and fourth transistors, respectively;

and wherein an amplified output signal is differentially derived from collectors of said first and second transistors.

15. An amplifier as claimed in claim 14, wherein said second input voltage is generated by using a resistive voltage divider.

16. An amplifier as claimed in claim 14, further comprising a first resistor connected to said bases of said first and third transistors;

a second resistor connected to said bases of said second and fourth transistors;

third and fourth resistors connected in series;

an unconnected end of said third resistor being connected to said base of said third transistor; and an unconnected end of said fourth resistor being connected to said base of said fourth transistor;

wherein a dc voltage is applied to the connection point of said third and fourth resistors.

17. An amplifier as claimed in claim 14, wherein said second input voltage is ($1/\sqrt{5}/K$) times as much as said first input voltage;

and wherein said first and second dc voltages are equal to $V_T \cdot \ln(5/K)$, where $V_T$ is the thermal voltage.

18. An amplifier as claimed in claim 14, wherein said first and second resistors have a same resistance value R1 and said third and fourth resistors have a same resistance value R2;

and wherein said values R1 and R2 satisfies a relationship of $R2 = R1/(\sqrt{5}-1)$.

19. A bipolar operational transconductance amplifier comprising:

a first differential pair of first and second bipolar transistors whose emitters are coupled together;

a second differential pair of third and fourth bipolar transistors whose emitters are coupled together;

a fifth unpaired bipolar transistor whose emitter is connected to said emitters of said first and second transistors;

a common current source or sink connected to said emitters of said first, second, third, fourth and fifth transistors;

said first, second, third, fourth and fifth transistors being driven by a common tail current produced by said common current source or sink, thereby constituting a quit-tail cell;

said third and fourth transistors of said second differential pair having a same emitter area K1 times as large as that of said first and second transistors of said first differential pair, where $K_1$ is a constant greater than unity; and said fifth transistor having an emitter area K2 times as large as that of said first and second transistors of said first differential pair, where $K_2$ is a constant greater than unity;

wherein a first input voltage as an input signal to be amplified is differentially applied across bases of said first and second transistors;

and wherein a second input voltage is differentially applied across bases of said third and fourth transistors, said second input voltage being produced by attenuating said first input voltage;

a third input voltage is applied to a base of said fifth transistor;

wherein an amplified output signal is differentially derived from collectors of said first and second bipolar transistors.

20. An amplifier as claimed in claim 19, wherein said second input voltage is generated by using a resistive voltage divider.

21. An amplifier as claimed in claim 19, further comprising a first resistor connected to said bases of said first and third transistors;

a second resistor connected to said bases of said second and fourth transistors;

third and fourth resistors connected in series;

an unconnected end of said third resistor being connected to said base of said third transistor;

an unconnected end of said fourth resistor being connected to said base of said fourth transistor;

wherein a dc voltage is applied to the connection point of said third and fourth resistors.

22. An amplifier as claimed in claim 19, wherein said second input voltage is approximately 0.345 times as much as said first input voltage.

23. An amplifier as claimed in claim 21, wherein said first and second resistors have a same resistance value R1 and said third and fourth resistors have a same resistance value R2, where R2=0.5263 R1.

24. A bipolar operational transconductance amplifier comprising:

a first differential pair of first and second bipolar transistors whose emitters are coupled together;

a second differential pair of third and fourth bipolar transistors whose emitters are coupled together;

a third differential pair of fifth and sixth bipolar transistors whose emitters are coupled together;

a common current source or sink connected to said emitters of said first, second, third, fourth, fifth, and sixth transistors;

said first, second, third, fourth, fifth, and sixth transistors begin driven by a common tail current produced by said common current source or sink, thereby constituting a hexatail cell;

said third and fourth transistors of said second differential pair having a same emitter area $K_1$ times as large as that of said first and second transistors of said first differential pair, where $K_1$ is a constant greater than unity; and said fifth and sixth transistors of said third differential pair having an emitter area $K_2$ times as large as that of said first and second transistors of said first differential pair, where $K_2$ is a constant greater than unity;

wherein a first input voltage as an input signal to be amplified is differentially applied across bases of said first and second transistors and wherein a second input voltage is differentially applied across bases of said third and fourth transistors, said second input voltage produced by attenuating said first input voltage;

a third input voltage is applied solely to a base of said fifth transistor;

wherein an amplified output signal is differentially derived directly from collectors of said first and second bipolar transistors.

25. An amplifier as claimed in claim 24, wherein said second and third input voltages are generated by using a resistive voltage divider, respectively.

26. An amplifier as claimed in claim 24, further comprising a first resistor connected to said bases of said first and third transistors;

a second resistor connected to said bases of said second and fourth transistors;

third and fourth resistors connected in series;

an unconnected end of said third resistor being connected to said base of said third transistor;

an unconnected end of said fourth resistor being connected to said base of said fourth transistor;

a fifth resistor connected to said bases of said first and fifth transistors;

a sixth resistor connected to said bases of said second and sixth transistors;

seventh and eighth resistors connected in series;

an unconnected end of said seventh resistor being connected to said base of said fifth transistor;

an unconnected end of said eighth resistor being connected to said base of said sixth transistor;

wherein a first dc voltage is applied to the connection point of said third and fourth resistors;

wherein a second dc voltage is applied to the connection point of said seventh and eighth resistors.

27. An amplifier as claimed in claim 26 wherein said second input voltage is approximately 0.345 times as much as said first input voltage.

28. An amplifier as claimed in claim 26, wherein said first and second resistors have a same resistance value R1 and said third and fourth resistors have a same resistance value R2, where R2=0.5263 R1.

29. An amplifier as claimed in claim 24, wherein said second input voltage is approximately 0.7619 times as much as said first input voltage;

and wherein said third input voltage is approximately 0.2857 times as much as said first input voltage.

30. An amplifier as claimed in claim 26, wherein said first and second resistors have a same resistance value R1 and said third and fourth resistors have a same resistance value R2, where R2=3.20 R1;

and wherein said fifth and sixth resistors have a same resistance value R3 and said seventh and eighth resistors have a same resistance value R4, where R4=0.40 R3.

31. A bipolar operational transconductance amplifier comprising:

a first differential pair of first and second bipolar transistors whose emitters are coupled together;

a second differential pair of third and fourth bipolar transistors whose emitters are coupled together;

a third differential pair of fifth and sixth bipolar transistors whose emitters are coupled together;

a seventh unpaired bipolar transistor whose emitter is connected to said emitters of said first and second transistors;

a common current source or sink connected to said emitters of said first, second, third, fourth and fifth transistors;

said first, second, third, fourth, fifth, sixth, and seventh transistors being driven by a common tail current produced by said common current source or sink, thereby constituting a septtail cell;

said third and fourth transistors of said second differential pair having a same emitter area $K_1$ times as large as that of said first and second transistors of said first differential pair, where $K_1$ is a constant greater than unity; and said fifth transistor having an emitter area $K_2$ times as large as that of said first and second transistors of said first differential pair, where $K_2$ is a constant greater than unity;

said sixth transistor having an emitter area $K_3$ times as large as that of said first and second transistors of said first differential pair, where $K_3$ is a constant greater than unity;

wherein a first input voltage as an input signal to be amplified is differentially applied across bases of said first and second transistors;

and wherein a second input voltage is differentially applied across bases of said third and fourth transistors, said second input voltage being produced by attenuating said first input voltage;

and wherein a third input voltage is differentially applied across bases of said fifth and sixth transistors, said third input voltage being produced by attenuating said first input voltage;

a fourth input voltage is applied to a base of said seventh transistor;

wherein an amplified output signal is differentially derived from collectors of said first and second bipolar transistors.

32. An amplifier as claimed in claim 31, wherein said second input voltage is generated by using a resistive voltage divider.

33. An amplifier as claimed in claim 32, wherein said first, second, third, fourth, fifth, sixth and seventh bipolar transistors constitute a septtail cell;

and wherein said second input voltage is approximately 0.830 times as much as said first input voltage;

and wherein said third input voltage is approximately 0.470 times as much as said first input voltage.

34. An amplifier as claimed in claim 32, wherein said first and second resistors have a same resistance value R1 and said third and fourth resistors have a same resistance value R2, where R2=4.8824 R1;

and wherein said fifth and sixth resistors have a same resistance value R3 and said seventh and eighth resistors have a same resistance value R4, where R4=0.8868 R3.

* * * * *

UNITED STATES PATENT AND TRADEMARK OFFICE
CERTIFICATE OF CORRECTION

PATENT NO. : 5,936,465
DATED : August 10, 1999
INVENTOR(S) : Katsuji Kimura

It is certified that error appears in the above-identified patent and that said Letters Patent is hereby corrected as shown below:

On The Title Page, [30] Foreign Application Priority Data: Insert --Japan 264947/1995 09/19/95--
Column 10, Line 13: "pari" should read --pair--

Column 12, Line 37: "he" should read --be--
Column 13, Line 48: "OaA" should read --OTA--
Column 19, Line 61: "Q4h" should read --Q4b--
Column 20, Line 48: "saic" should read --same--
Column 22, Line 40: "(mV$_{F-F}$)" should read -- (mV$_{p-p}$)--
Column 24, Line 5: "An output" should begin a new paragraph
Column 26, Line 33: "AT" should read --$\Delta I$--
Column 26, Line 35: "stu" should read --sum--

Column 29, Line 66: Q1b" should read --Q4b--
Column 35, Line 66: "-0" should read --=0--
Column 38, Line 30, Claim 1: "ifferential" should read --differential--
Column 43, Line 39, Claim 27: "26" should read --24--

Signed and Sealed this

Twenty-sixth Day of September, 2000

Attest:

Q. TODD DICKINSON

*Attesting Officer*     *Director of Patents and Trademarks*